United States Patent
Kondo et al.

(10) Patent No.: US 6,829,008 B1
(45) Date of Patent: Dec. 7, 2004

(54) SOLID-STATE IMAGE SENSING APPARATUS, CONTROL METHOD THEREFOR, IMAGE SENSING APPARATUS, BASIC LAYOUT OF PHOTOELECTRIC CONVERSION CELL, AND STORAGE MEDIUM

(75) Inventors: Kenichi Kondo, Tokyo (JP); Yukichi Niwa, Narashino (JP); Shinji Sakai, Yokohama (JP); Yoshihiro Saga, Yokohama (JP)

(73) Assignee: Canon Kabushiki Kaisha, Tokyom (JP)

( * ) Notice: Subject to any disclaimer, the term of this patent is extended or adjusted under 35 U.S.C. 154(b) by 0 days.

(21) Appl. No.: 09/374,629

(22) Filed: Aug. 16, 1999

(30) Foreign Application Priority Data

Aug. 20, 1998 (JP) .......................... 10-234703
Jul. 26, 1999 (JP) .......................... 11-210776

(51) Int. Cl.$^7$ .................... H04N 5/335; H04N 5/232; H04N 5/235; H04N 5/238
(52) U.S. Cl. .................... 348/302; 348/345; 348/350; 348/362; 348/364; 348/366
(58) Field of Search .................... 348/245, 246, 348/350, 366, 302, 207.99, 349, 364, 345, 362

(56) References Cited

U.S. PATENT DOCUMENTS

| | | | | |
|---|---|---|---|---|
| 4,523,101 A | * | 6/1985 | Tsunekawa | 250/208.2 |
| 4,563,705 A | * | 1/1986 | Oinoue et al. | 348/350 |
| 4,573,077 A | | 2/1986 | Imai | |
| 4,647,978 A | | 3/1987 | Kinoshita et al. | |
| 4,684,995 A | * | 8/1987 | Baumeister | 348/347 |
| 4,733,302 A | | 3/1988 | Kinoshita et al. | |
| 4,845,566 A | | 7/1989 | Sakai et al. | |
| 4,972,269 A | * | 11/1990 | Fukushima et al. | 348/366 |
| 4,991,030 A | | 2/1991 | Sato et al. | |
| 5,051,833 A | * | 9/1991 | Tsuji | 348/349 |
| 5,075,777 A | * | 12/1991 | Murata | 348/354 |
| 5,241,167 A | * | 8/1993 | Suzuki et al. | 250/201.8 |
| 5,381,175 A | * | 1/1995 | Sudo et al. | 348/246 |
| 5,430,282 A | * | 7/1995 | Smith et al. | 235/455 |
| 5,486,859 A | * | 1/1996 | Matsuda | 348/311 |
| 5,610,654 A | * | 3/1997 | Parulski et al. | 348/229.1 |
| 5,777,675 A | * | 7/1998 | Miida et al. | 348/350 |
| 5,784,655 A | * | 7/1998 | Akashi et al. | 396/128 |
| 6,137,100 A | * | 10/2000 | Fossum et al. | 250/208.1 |
| 6,215,961 B1 | * | 4/2001 | Mukai et al. | 396/100 |

FOREIGN PATENT DOCUMENTS

| | | | |
|---|---|---|---|
| EP | 0 568 216 A1 | 3/1993 | |
| JP | 01-103076 | 4/1989 | |
| JP | 02-032685 | 2/1990 | |
| JP | 06-165049 | 6/1994 | |
| JP | 09043507 | 2/1997 | |
| JP | 09046715 | 2/1997 | |
| JP | 10326009 A | * 12/1998 | ............. G03F/1/08 |

* cited by examiner

Primary Examiner—Andrew Christensen
Assistant Examiner—Brian C Genco
(74) Attorney, Agent, or Firm—Fitzpatrick, Cella, Harper & Scinto

(57) ABSTRACT

An object of this invention is to provide a solid-state image sensing apparatus capable of performing high-precision AF and AE without adding any camera mechanism or increasing power consumption. To achieve this object, at least S1 and S2 among photoelectric conversion cells output signals not for forming an image signal in a solid-state image sensing apparatus in which photoelectric conversion cells for converting an optical image formed by an optical system into an electrical signal are two-dimensionally laid out.

14 Claims, 46 Drawing Sheets

FIG. 1A

| G | R |
|---|---|
| B | S |

FIG. 1B

| Ye | Mg |
|----|----|
| Cy | S  |

FIG. 2

| G | R | G | R | G | R | G | R |
|---|---|---|---|---|---|---|---|
| B | G | B | G | B | G | B | G |
| G | R | G | R | G | R | G | R |
| B | S1 | B | S1 | B | S1 | B | S1 |
| G | R | G | R | G | R | G | R |
| B | S2 | B | S2 | B | S2 | B | S2 |
| G | R | G | R | G | R | G | R |
| B | G | B | G | B | G | B | G |

Rows 1-2: ROW OF GENERAL COLOR LAYOUT
Rows 3-4: ROW INCLUDING FIRST PHASE SENSOR
Rows 5-6: ROW INCLUDING SECOND PHASE SENSOR
Rows 7-8: ROW OF GENERAL COLOR LAYOUT

FIG. 6

| G | R | G | R | G | R | G | R | } ROW OF GENERAL COLOR LAYOUT
|---|---|---|---|---|---|---|---|
| B | G | B | G | B | G | B | G |
| G | R | G | R | G | R | G | R | } ROW INCLUDING FIRST AND SECOND PHASE SENSORS
| B | S1 | B | S2 | B | S1 | B | S2 |
| G | R | G | R | G | R | G | R | } ROW OF GENERAL COLOR LAYOUT
| B | G | B | G | B | G | B | G |
| G | R | G | R | G | R | G | R |
| B | G | B | G | B | G | B | G |

FIG. 7

| | | | | | | | | |
|---|---|---|---|---|---|---|---|---|
| G | R | G | R | G | R | G | R | ⎫ ROW OF GENERAL |
| B | G | B | G | B | G | B | G | ⎬ COLOR LAYOUT |
| G | R | G | R | G | R | G | R | ⎫ FIRST ROW INCLUDING |
| B | S1 | B | S1 | B | S1 | B | S1 | ⎬ FIRST PHASE SENSOR |
| G | R | G | R | G | R | G | R | ⎫ ROW INCLUDING SECOND |
| B | S2 | B | S2 | B | S2 | B | S2 | ⎬ PHASE SENSOR |
| G | R | G | R | G | R | G | R | ⎫ SECOND ROW INCLUDING |
| B | S1 | B | S1 | B | S1 | B | S1 | ⎬ FIRST PHASE SENSOR |
| G | R | G | R | G | R | G | R | ⎫ ROW OF GENERAL |
| B | G | B | G | B | G | B | G | ⎬ COLOR LAYOUT |

FIG. 8

| G | R | G | R | G | R | G | R |
|---|---|---|---|---|---|---|---|
| B | G | B | G | B | G | B | G |
| G | R | G | R | G | R | G | R |
| B | S1 | B | S2 | B | S1 | B | S2 |
| G | R | G | R | G | R | G | R |
| B | S2 | B | S1 | B | S2 | B | S1 |
| G | R | G | R | G | R | G | R |
| B | G | B | G | B | G | B | G |

- ROW OF GENERAL COLOR LAYOUT
- FIRST ROW INCLUDING FIRST AND SECOND PHASE SENSORS
- SECOND ROW INCLUDING FIRST AND SECOND PHASE SENSORS
- ROW OF GENERAL COLOR LAYOUT

FIG. 9
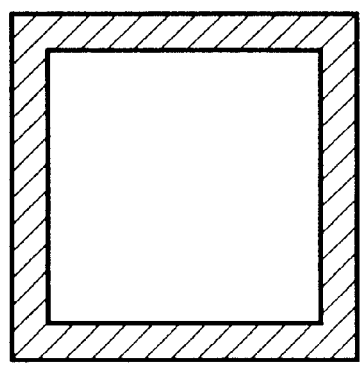
S3
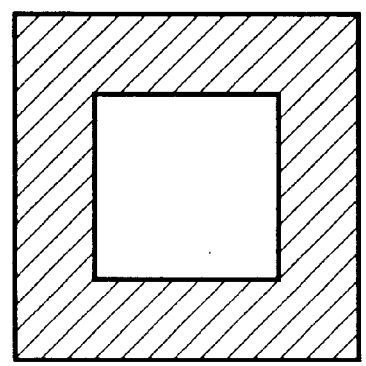
S4
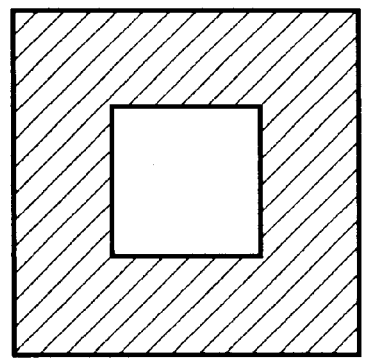
S5
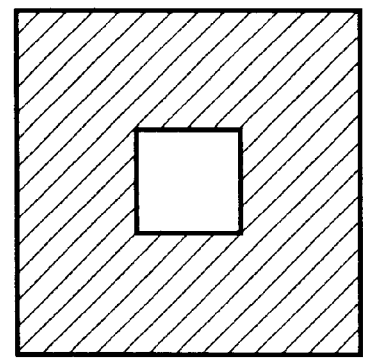
S6

———— : REGION INCLUDING AF SENSOR PIXEL

FIG. 12A

| G | R |
|---|---|
| B | G |

FIG. 12B

| Ye | Mg |
|----|----|
| Cy | Ye |

FIG. 12C

| G  | Mg |
|----|----|
| Cy | Ye |

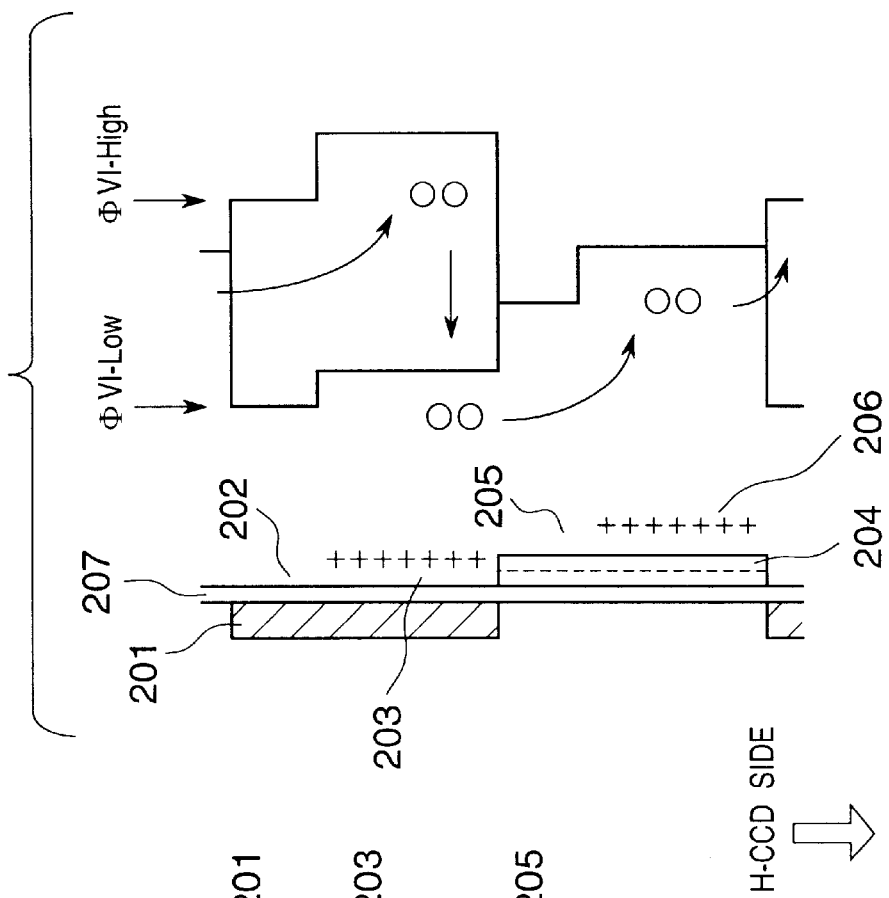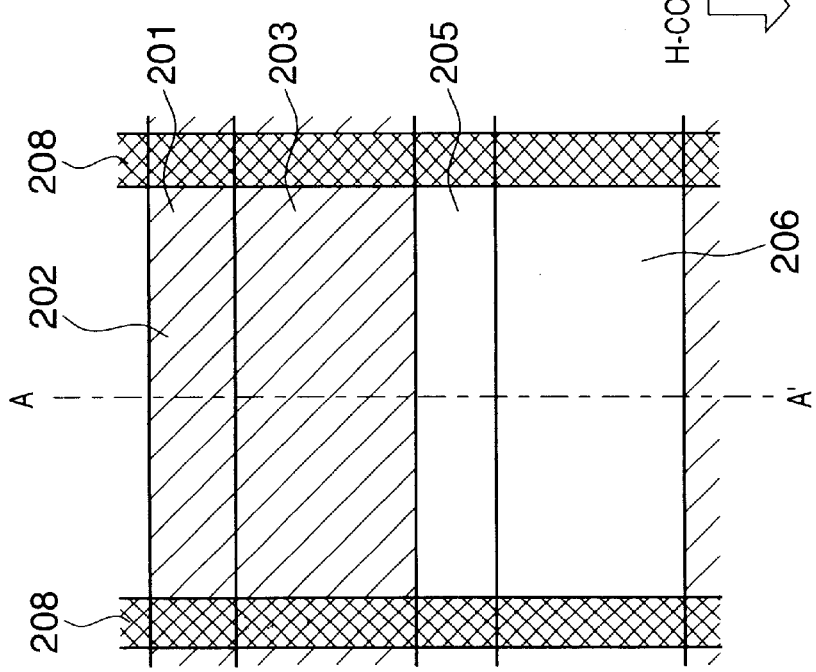

F I G. 26
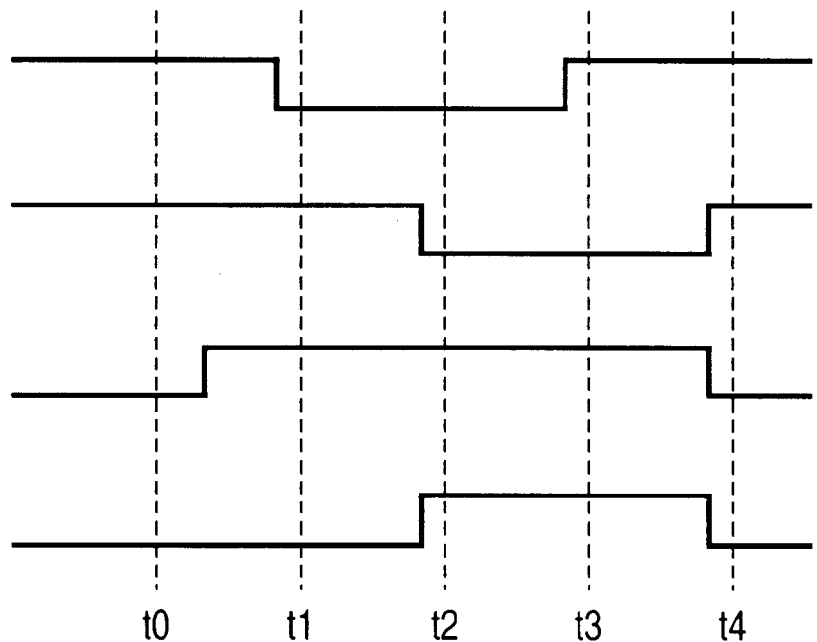

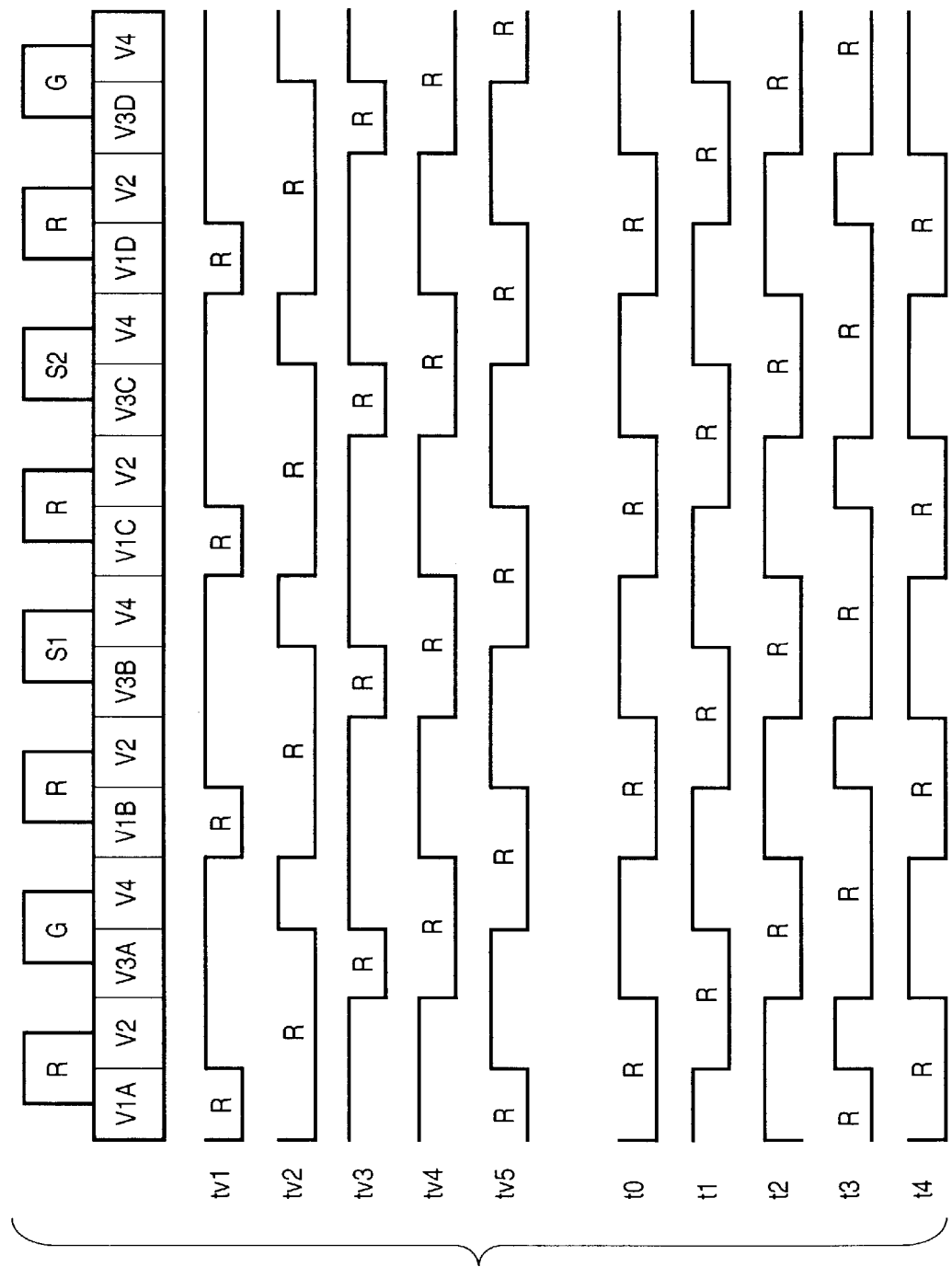
F I G. 36

SOLID-STATE IMAGE SENSING APPARATUS, CONTROL METHOD THEREFOR, IMAGE SENSING APPARATUS, BASIC LAYOUT OF PHOTOELECTRIC CONVERSION CELL, AND STORAGE MEDIUM

BACKGROUND OF THE INVENTION

1. Field of the Invention

The present invention relates to a solid-state image sensing apparatus, a control method therefor, an image sensing apparatus, the basic layout of a photoelectric conversion cell, and a storage medium.

2. Description of the Related Art

In recent years, needs for processing images in computers are abruptly increasing. To meet this, many digital cameras for capturing an image into a computer are now available. Along with the development of such digital cameras, digital still cameras for processing still images tend to increase in the number of pixels. Cameras having an image sensing element of 800,000 pixels (XGA class) are spread though general moving image (video movie) cameras have an image sensing element of 250,000 to 400,000 pixels. Further, cameras having 1,000,000 pixels to 1,500,000 pixels are becoming popular. For high-end devices of an interchangeable lens type, cameras using a megapixel image sensing element having 2,000,000 pixels, 4,000,000 pixels, or 6,000,000 pixels are commercially available.

In the video movie camera, the camera photographing system such as the AF and AE of a camera is controlled using output signals successively output from an image sensing element at a video rate. For this purpose, AF adopts TV-AF (hill climbing method or contrast method).

To the contrary, the digital still camera adopts various methods depending on the number of pixels and the camera operation method. Generally in most of digital still cameras of a 250,000- or 400,000-pixel class used in the video movie camera, repetitive readout signals (images) from a sensor are displayed (to be referred to as a finder mode or EVF mode) on a color liquid crystal display (a TFT liquid crystal display of about 2 inches is recently often used) mounted on the camera. Thus, the digital still camera operates basically similarly to the video movie camera, and employs the same method as the video movie camera.

However, in a digital still camera having an image sensing element of an 800,000-pixel class or more (to be referred to as a megapixel digital still camera), the image sensing element in the finder mode operates according to a driving method of thinning out signals as much as possible, except for those from signal lines or pixels necessary for display on the liquid crystal display in order to increase the finder rate (close to the video rate).

In a high-grade digital still camera having 1,000,000 pixels or more, the time from depression of a release switch to photographing must be short in order to meet need for instantaneously photographing a still image similarly to a silver halide camera.

For these reasons, the megapixel digital still camera adopts various AF and AE methods as follows.

(1) AF (a) The digital still camera employs an AF sensor in addition to the image sensing element. The AF sensor is of a phase difference type, contrast type, rangefinder type, active type, like the silver halide camera.

(b) The digital still camera uses an output from the image sensing element itself. In this case, the image sensing element is of a hill climbing type or phase difference type using a signal from only a specific region of the image sensing element (signals from this region are not thinned out) because a long time is spent for a read from all the pixels of the image sensing element, and distance measurement does not require information of all the pixels.

(2) AE (a) The digital still camera employs an AE sensor in addition to the image sensing element.

(b) The digital still camera uses an output from the image sensing element itself.

However, the conventional megapixel digital still camera suffers the following problems.

As for AF, the digital still camera having an AF sensor in addition to the image sensing element requires a lens system for forming an image on the sensor, and a mechanism for realizing a corresponding AF method (for example, the active method requires an infrared generator, projection lens, light-receiving sensor, light-receiving lens, and infrared projection moving mechanism, and the phase difference method requires an imaging lens to a distance measurement sensor and a glass lens for causing a phase difference). This increases the camera size and cost. Further, AF using the image sensing element itself suffers many error factors such as the difference in path between an optical system for the image sensing element and an optical system for the AF sensor, a manufacturing error in molded members for forming these respective optical systems, and an error caused by temperature expansion. These error components are larger in the digital still camera of the interchangeable lens type than in a digital still camera of a permanent lens type.

Considering this situation, demands have arisen for digital still camera of another AF type which uses an output from the image sensing element itself. Of the AF methods, the hill climbing method is disadvantageous in a long in-focus time. The present applicant proposes a method of arranging a mechanism of moving pupil positions to positions symmetrical about the optical axis in a lens system for forming an image on an image sensing element, and calculating the defocus amount from the phase difference between images formed via the pupils, thereby adjusting the focus of the lens (Japanese Patent Laid-Open No. 9-43507). This method realizes high-speed, high-precision AF (for AF, the signal readout time is short because signals are read out from several specific lines in the image sensing element whereas the signals of the remaining lines are cleared at a high speed.) However, this method requires a mechanism for moving the pupils, resulting in large volume and high cost.

This also applies to AE because the digital still camera having an AE sensor in addition to the image sensing element requires a mechanism for the AE sensor. To use signal charges from the image sensing element itself, the image sensing element must be driven for photometry a plurality of number of times by changing the stop diameter or shutter speed because of a small dynamic range of the image sensing element. This increases the time before actual photographing, and serial movement of the stop increases power consumption.

SUMMARY OF THE INVENTION

The present invention has been made to solve the above problems, and has as its object to provide a solid-state image sensing apparatus capable of performing high-precision image sensing adjustment (for example: AF and AE) without adding any camera mechanism or increasing power consumption, a control method therefor, an image sensing apparatus, the basic layout of a photoelectric conversion cell, and a storage medium.

To solve the above problems and achieve the above object, a solid-state image sensing apparatus according to the first aspect of the present invention has the following arrangement.

That is, a solid-state image sensing apparatus in which photoelectric conversion cells for converting an optical image formed by an optical system into an electrical signal are two-dimensionally laid out is characterized in that at least some of the photoelectric conversion cells output signals not for forming an image signal.

A solid-state image sensing apparatus according to the second aspect of the present invention has the following arrangement.

That is, a solid-state image sensing apparatus having an image sensing region where photoelectric conversion cells for converting an optical image formed by an optical system into an electrical signal are two-dimensionally laid out is characterized in that the image sensing region is defined by repetition of basic layouts of photoelectric conversion cells for detecting a plurality of colors, and one photoelectric conversion cell in at least some basic layouts of the image sensing region outputs a signal not for forming an image signal.

The basic layout of a photoelectric conversion cell according to the present invention has the following layout.

That is, a basic layout of a photoelectric conversion cell in a solid-state image sensing apparatus having an image sensing region where photoelectric conversion cells for converting an optical image formed by an optical system into an electrical signal are two-dimensionally laid out is characterized in that photoelectric conversion cells for detecting a plurality of colors, and photoelectric conversion cells for outputting signals not for forming an image signal are combined.

A solid-state image sensing apparatus according to the third aspect of the present invention has the following arrangement.

That is, a solid-state image sensing apparatus in which photoelectric conversion cells for converting an optical image into an electrical signal are two-dimensionally laid out is characterized by comprising a first photoelectric conversion cell for outputting a luminance signal for forming a two-dimensional image, or a signal for generating a luminance signal and chrominance signals, a second photoelectric conversion cell for outputting a signal other than the luminance signal or the signal for generating the luminance signal and chrominance signals, and switching means for switching a first read mode of reading out a signal including both the signal output from the first photoelectric conversion cell and the signal output from the second photoelectric conversion cell, and a second read mode of reading out a signal including not the signal read out from the second photoelectric conversion cell but the signal read out from the first photoelectric conversion cell.

An image sensing apparatus according to the first aspect of the present invention has the following arrangement.

That is, an image sensing apparatus is characterized by comprising a solid-state image sensing element in which photoelectric conversion cells for converting an optical image into an electrical signal are two-dimensionally laid out, the solid-state image sensing element having a first photoelectric conversion cell for outputting a luminance signal for forming a two-dimensional image, or a signal for generating a luminance signal and chrominance signals, and a second photoelectric conversion cell for outputting a signal other than the luminance signal or the signal for generating the luminance signal and chrominance signals, a timing generator for generating a driving signal to the solid-state image sensing element, the timing generator generating a first driving signal for outputting, from the image sensing element, a signal including both the signal output from the first photoelectric conversion cell and the signal output from the second photoelectric conversion cell, and a second driving signal for outputting, from the image sensing element, a signal including not the signal read out from the second photoelectric conversion cell but the signal read out from the first photoelectric conversion cell, and switching means for switching a first photographing mode of generating a video signal using all pixels on the image sensing element by the first driving signal, and a second photographing mode of generating a video signal by thinning out the pixels on the image sensing element by the second driving signal.

An image sensing apparatus according to the second aspect of the present invention has the following arrangement.

That is, an image sensing apparatus is characterized by comprising a solid-state image sensing element in which photoelectric conversion cells for converting an optical image into an electrical signal are two-dimensionally laid out, the solid-state image sensing element having a first photoelectric conversion cell for outputting a luminance signal for forming a two-dimensional image, or a signal for generating a luminance signal and chrominance signals, and a second photoelectric conversion cell for outputting a signal other than the luminance signal or the signal for generating the luminance signal and chrominance signals, a thinning circuit for thinning image signals every predetermined time, and switching means for switching a first photographing mode of generating a video signal using all pixels on the image sensing element, and a second photographing mode of generating a video signal by abandoning signals output from the second photoelectric conversion cell by the thinning circuit, and thinning out the pixels on the image sensing element.

A solid-state image sensing apparatus control method according to the present invention has the following steps.

That is, a solid-state image sensing apparatus control method of controlling a solid-state image sensing element having a first photoelectric conversion cell for outputting a luminance signal for forming a two-dimensional image, or a signal for generating a luminance signal and chrominance signals, and a second photoelectric conversion cell for outputting a signal other than the luminance signal or the signal for generating the luminance signal and chrominance signals in a solid-state image sensing apparatus in which photoelectric conversion cells for converting an optical image into an electrical signal are two-dimensionally laid out is characterized by comprising controlling to switch a first read mode of reading out a signal including both the signal output from the first photoelectric conversion cell and the signal output from the second photoelectric conversion cell, and a second read mode of reading out a signal including not the signal read out from the second photoelectric conversion cell but the signal read out from the first photoelectric conversion cell.

A storage medium according to the present invention has the following control program.

That is, a storage medium storing a control program for controlling a solid-state image sensing element having a first photoelectric conversion cell for outputting a luminance signal for forming a two-dimensional image, or a signal for generating a luminance signal and chrominance-signals, and a second photoelectric conversion cell for outputting a signal other than the luminance signal or the signal for generating the luminance signal and chrominance signals in a solid-state image sensing apparatus in which photoelectric conversion cells for converting an optical image into an electrical signal are two-dimensionally laid out is characterized in that the control program comprises a code of the step of switching a first read mode of reading out a signal including both the signal output from the first photoelectric conversion cell and the signal output from the second photoelectric conversion cell, and a second read mode of reading out a signal including not the signal read out from the second photoelectric conversion cell but the signal read out from the first photoelectric conversion cell.

An image sensing apparatus according to the third aspect of the present invention has the following arrangement.

That is, an image sensing apparatus is characterized by comprising an image sensing region where photoelectric conversion cells for converting an optical image into an electrical signal are two-dimensionally laid out, the image sensing region including a plurality of photoelectric conversion cells for outputting signals for generating image signals, and second photoelectric conversion cells for outputting signals not for forming an image signal.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIGS. 1A and 1B are views each showing the basic pixel layout of a solid-stage image sensing apparatus according to an embodiment of the present invention;

FIG. 2 is a view showing a pixel layout including a distance measurement pixel in the solid-stage image sensing apparatus according to the embodiment of the present invention;

FIG. 6 is a view showing another pixel layout including a distance measurement pixel in the solid-stage image sensing apparatus according to the embodiment of the present invention;

FIG. 7 is a view showing still another pixel layout including a distance measurement pixel in the solid-stage image sensing apparatus according to the embodiment of the present invention;

FIG. 8 is a view showing still another pixel layout including a distance measurement pixel in the solid-stage image sensing apparatus according to the embodiment of the present invention;

FIG. 9 is a view showing photometric pixels in the solid-stage image sensing apparatus according to the embodiment of the present invention;

FIGS. 12A, 12B, and 12C are views each showing the basic pixel layout of a general region in the solid-stage image sensing apparatus;

FIGS. 13A and 13B are views showing the pixel structure of the solid-stage image sensing apparatus;

FIG. 26 is a timing chart showing the vertical transfer pulse in the second and third embodiments;

FIG. 36 is a view showing the operational concept of a vertical transfer CCD in the third embodiment;

DETAILED DESCRIPTION OF THE PREFERRED EMBODIMENTS

Figure 3A:
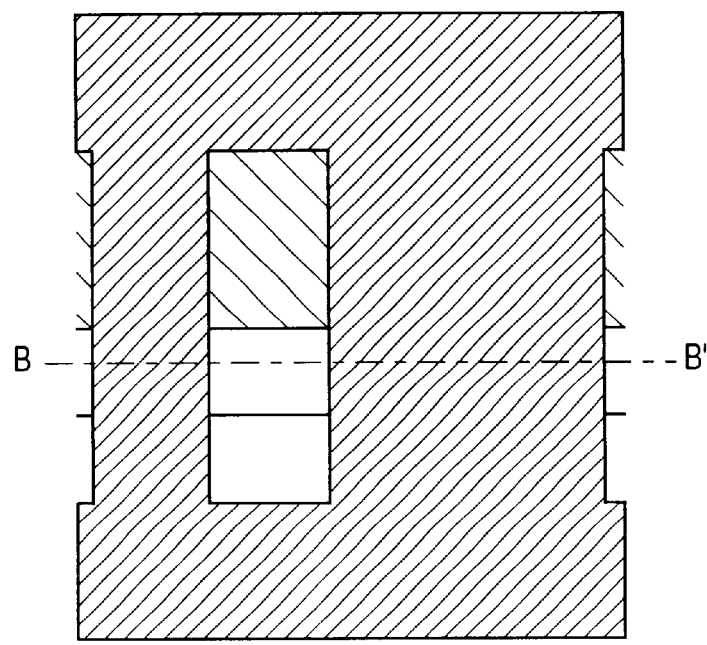
FIGS. 3A and 3B are a plan view and a sectional view, respectively, showing the structure of a pixel for detecting the first phase in the solid-stage image sensing apparatus according to the embodiment of the present invention.

Preferred embodiments of the present invention will be described in detail with reference to the accompanying drawings.

(First Embodiment)

Figures 1A, 1B:
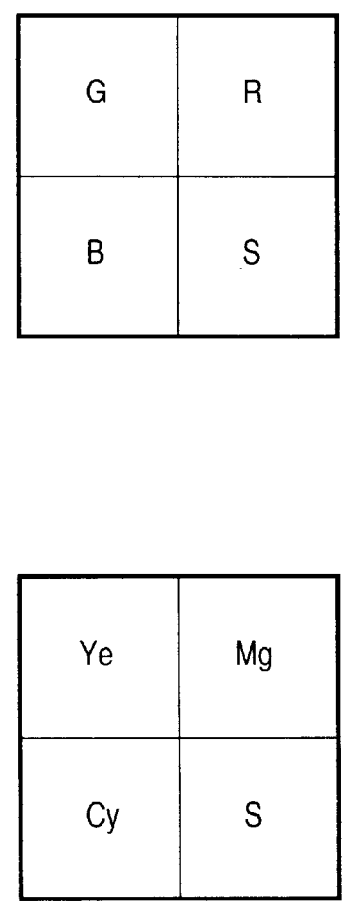
Figures 12A, 12B, 12C:
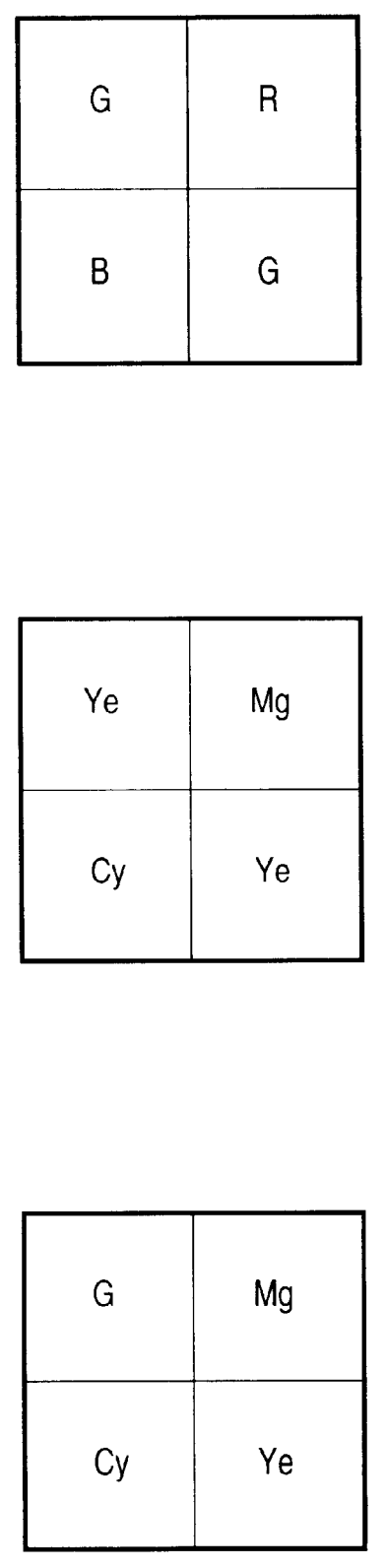

A basic pixel layout in the first embodiment of the present invention will be described with reference to FIGS. 1A, 1B, 12A, 12B, and 12C. FIGS. 1A and 1B show the pixel layouts of an image sensing element. FIGS. 12A, 12B, and 12C show general pixel layouts.

The pixel layouts shown in FIGS. 12A, 12B, and 12C will be explained. Each pixel layout is the color layout of a basic unit portion in an area sensor having 2 pixels×2 pixels as a basic unit. FIG. 12A shows a Bayer layout, and FIG. 12B shows a Bayer layout applied to a complementary color filter. The layouts in FIGS. 12A and 12B will be called a primary color Bayer layout and complementary color Bayer layout, respectively. FIG. 12C shows a layout including G in addition to three complementary colors (G-including complementary color layout).

Another known pixel layout is a complementary color checkered layout in units of 2 pixels×4 pixels, and this checkered layout is most often used in a video movie camera sensor. The present applicant proposes a complementary color checkered layout in units of 2 pixels×8 pixels (Japanese Patent Laid-Open No. 9-46715).

The color layout in units of 2 pixels×4 pixels or 2 pixels×8 pixels is predominant for an area sensor which processes a moving image (interlaced-scanned video image). However, for a camera which processes a still image, the color layout in units of 2 pixels×2 pixels can simplify signal processing and attain a high-quality image. The following description will exemplify an area sensor having the color layout in units of 2 pixels×2 pixels, but the present invention can also be applied to an area sensor having the color layout in units of 2 pixels×4 pixels or 2 pixels×8 pixels.

A basic pixel layout in the first embodiment will be described with reference to FIGS. 1A and 1B. FIG. 1A shows a primary color Bayer layout, and FIG. 1B shows a complementary color Bayer layout or G-including complementary color Bayer layout.

In FIGS. 1A and 1b, reference symbol S denotes a functional sensor cell for reading out distance measurement data for AF or photometric data for AE. By forming pixels functioning as AF and AE sensors in an image sensing element itself, the sensor of the first embodiment can achieve distance measurement for AF of the camera or photometry for AE using a signal read out from the image sensing element itself. This realizes high-precision AF and AE. Also, the photometric time is short, unlike a conventional AE sensor using a signal from an image sensing element itself. This arrangement can eliminate any mechanism necessary for an additional sensor, thus realizing a compact, low-cost camera.

A pixel for detecting distance measurement data for AF and an area sensor having this pixel in the first embodiment will be described.

As the image sensing element of a megapixel digital still camera, an interline CCD or full-frame CCD is mainly used. The interline CCD is often used in a low-end camera having an optical system of ⅔ inches or less, whereas the full-frame CCD is often used for a high-end camera having an optical system of 1 inches or more. The greatest difference between the interline CCD and full-frame CCD is that the former can read out sensed signal charges even if light is incident on the image sensing element, but the latter can read out signal charges only after closing a mechanical shutter attached to the front surface of the image sensing element.

As a solution for the full-frame CCD, the present inventor has already proposed an improved full-frame CCD having a storage section for storing charges of a small number of lines between the image area of the full-frame CCD and a horizontal CCD, and a partial read driving method for AF and AE when the mechanical shutter is open. The present inventor has also proposed a method of reading out AF/AE signal charges at a high speed from only a necessary portion in an image area in an interline CCD (i.e., a method of clearing unnecessary signal charges at a high speed). These propositions allow the interline CCD and the (improved) full-frame CCD to read out signal charges from a region including a distance measurement/photometric pixel arranged in the image area within a short time without repetitively opening and closing the mechanical shutter. An embodiment using the improved full-frame CCD will be explained, and the present invention can also be applied to the interline CCD.

Figure 11:
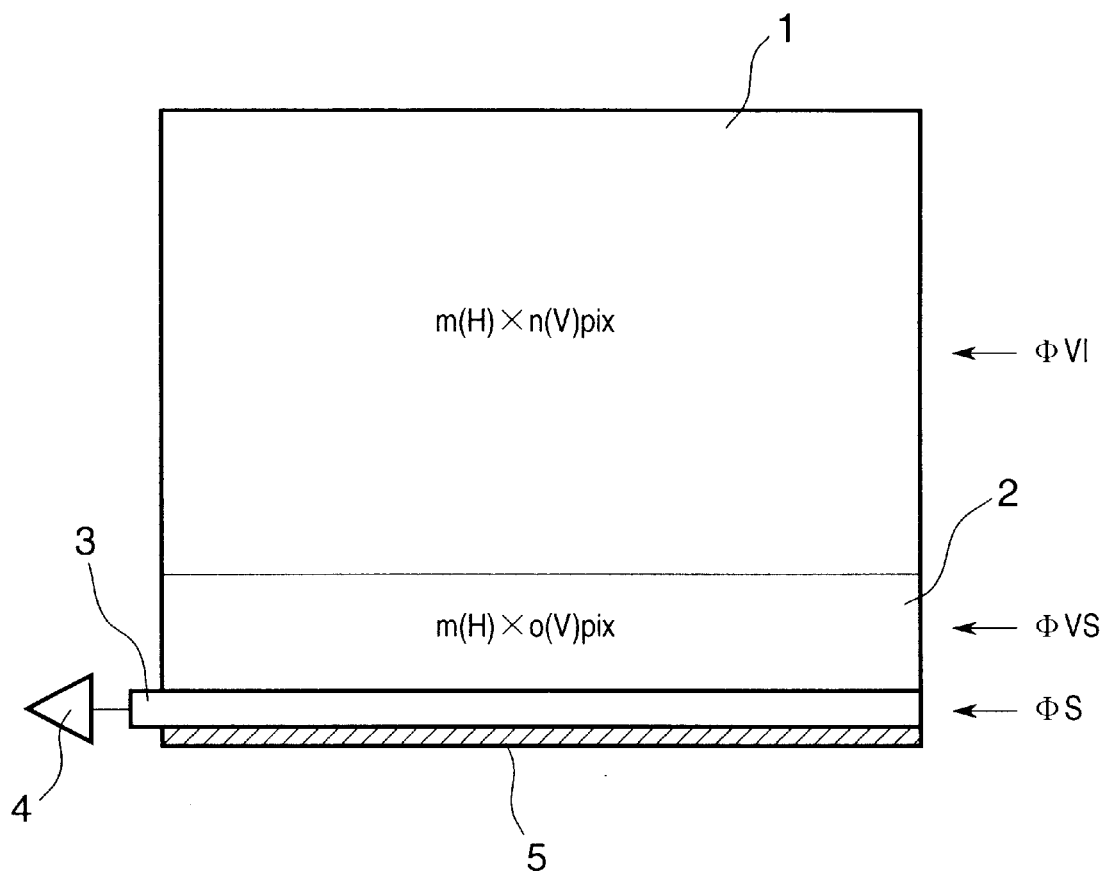
FIG. 11 is a view showing the structure of the solid-stage image sensing apparatus.

FIG. 11 is a view showing the structure of an improved full-frame CCD area sensor.

Reference numeral 1 denotes an image area which has pixels in m rows×n columns (horizontal and vertical lines will be respectively called rows and columns), and is made up of n photosensitive vertical CCDs (V-CCDs).

In general, each V-CCD is made from a 2- to 4-phase driving CCD or a psuedo 1-phase driving CCD such as a virtual phase CCD. ΦVI is a pulse for transfer from the CCD in this region. (The type of applied pulse changes depending on the type of V-CCD such that one type of pulse is applied to the pseudo 1-phase driving CCD, and two types of pulses are applied to 2-phase electrodes in the 2-phase driving CCD. This also applies to the storage section and horizontal CCD, and only one pulse signal is illustrated for descriptive convenience.)

Reference numeral 2 denotes a partial storage area for storing signal charges from arbitrary o columns among the n columns of the image area. The o columns can store signal charges on several percentages of the n columns. Hence, an increase in chip area of the image sensing element by the memory section is very small. ΦVS is a pulse for transfer of the CCD in this region. This region is covered with an aluminum light-shielding layer.

Reference numeral 3 denotes a horizontal CCD (H-CCD) for receiving signal charges photoelectrically converted by the image area 1 in units of rows and outputting them to an output amplifier 4. ΦS is a transfer pulse for the H-CCD 3.

Reference numeral 4 denotes the output amplifier for converting signal charges of each pixel transferred from the H-CCD 3 into a voltage signal. The output amplifier 4 is generally a floating diffusion amplifier.

Reference numeral 5 denotes a horizontal drain formed between the H-CCD and a channel stop (drain barrier; not shown) to remove unnecessary charges. The signal charges of pixels in a region unnecessary for a partial read are removed from the H-CCD to the horizontal drain 5 via the channel stop. Instead, an electrode may be formed on the drain barrier between the H-CCD and horizontal drain, and the application voltage may be changed to efficiently drain unnecessary charges.

In this arrangement, a small storage region is added to a general full-frame CCD to realize a partial read from an arbitrary location.

The pixel structure will be explained by exemplifying a virtual phase for descriptive convenience.

FIGS. 13A and 13B show the pixel structure of the image area, in which FIG. 13A is a plan view, and FIG. 13B is a view showing a structure taken along the line A–A' and the potential profile.

In FIGS. 13A and 13B, reference numeral 201 denotes a clock gate electrode which is formed from light-transmitting polysilicon and has a lower semiconductor surface serving as a clock phase region. The clock phase region is divided into two regions by ion implantation. One region is a clock barrier region 202, and the other is a clock well region 203 formed by ion implantation so as to exhibit a higher potential than the clock barrier.

Reference numeral 204 denotes a virtual gate formed from a p$^+$-type layer on a semiconductor surface to fix the channel potential. This region serves as a virtual phase region. This region is also divided into two regions by implanting n-type ions into a deeper layer than the p$^+$-type layer. One region is a virtual barrier region 205, and the other is a virtual well region 206. Reference numeral 207 denotes an insulating layer formed from an oxide film or the like between the electrode and semiconductor; and 208, a channel stop for isolating the channels of the respective V-CCDs.

Although not shown, the pixel structure additionally has a function of preventing blooming which causes charges to overflow as a pseudo signal to an adjacent pixel when strong light is incident. The typical method is to form a lateral overflow drain.

More specifically, a drain made of an n$^+$-type layer is formed adjacent to each V-CCD, and an overflow drain barrier is formed between the overflow drain and charge transfer channel. Charges exceeding the overflow drain barrier are removed to the drain. The height of the drain barrier is fixed by ion implantation, and changed by forming an electrode (over drain barrier electrode) on the overflow drain barrier and controlling the value of a voltage (VOD) applied to the drain electrode.

In transfer from the V-CCD, an arbitrary pulse is applied to the clock electrode 202 to increase/decrease the potential of the clock phase with respect to the potential of the virtual layer, thereby transferring charges to the H-CCD (in FIG. 13B, "→○" represents movement of charges).

The pixel structure of the image section has been exemplified, and the pixel structure of the storage section is also the same. In the storage region, however, the top of the pixel is covered with the aluminum light-shielding layer, blooming need not be prevented, and thus no overflow drain is formed. The H-CCD also has a virtual phase structure, but adopts the layout of a clock phase region and virtual phase region so as to allow receiving charges from the V-CCD and horizontally transferring them.

Figure 14B:
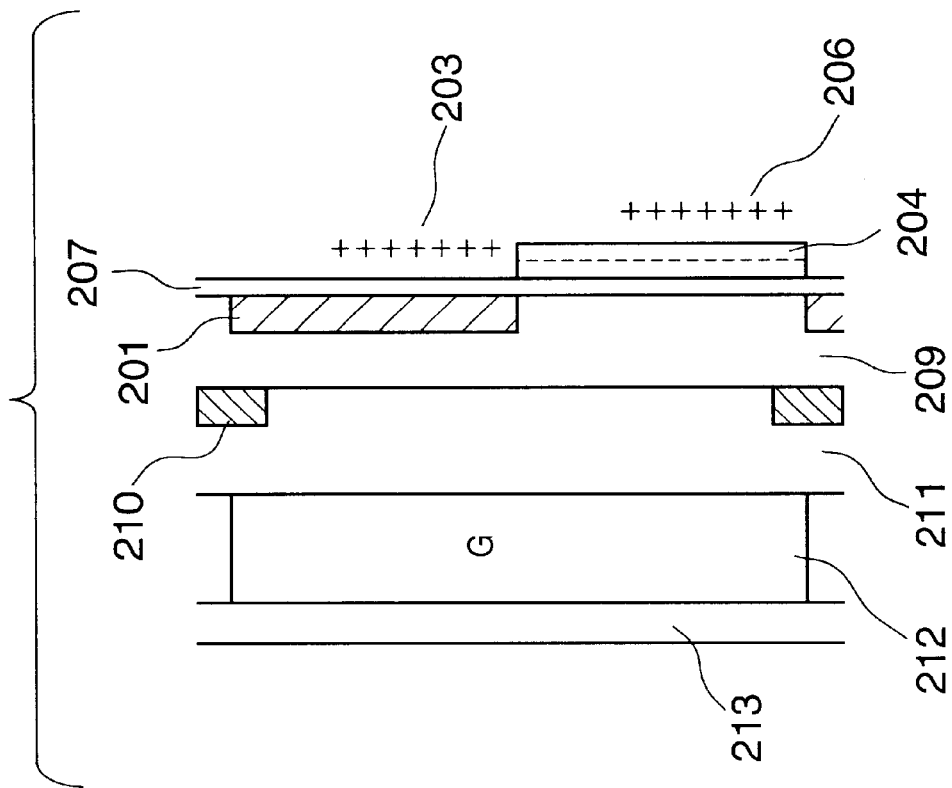
FIGS. 14A and 14B are views showing another pixel structure of the solid-stage image sensing apparatus.
Figure 14A:
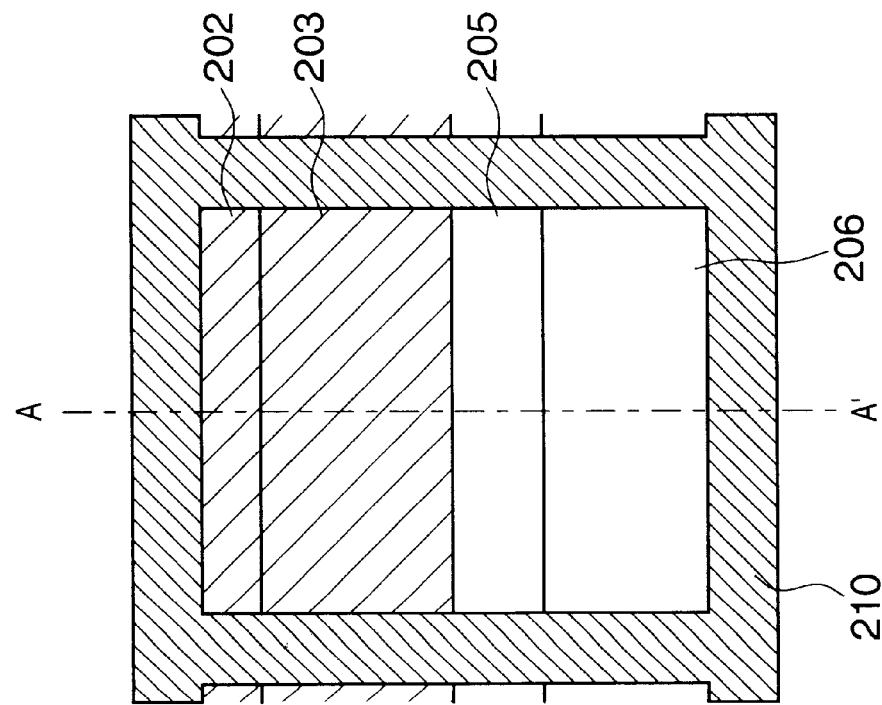

A color filter is formed on the CCD cell of the image section shown in FIG. 11. A metal light-shielding layer for preventing mixture of respective colors is interposed between the color filter and CCD cell. FIGS. 14A and 14B show the structure.

Reference numeral 209 denotes a protective layer on a semiconductor surface; 210, a metal layer for preventing color mixture, which may be formed from a black layer of the same material as the color filter; 211, a smoothing layer for smoothing a surface on which a color filter layer is formed; 212, a color filter layer of primary or complementary colors; and 213, a protective layer for protecting the filter layer.

FIG. 2 shows a layout when a distance measurement pixel for AF is formed on the full-frame CCD. A line having a plurality of functional pixels S1 and a line having a plurality of functional pixels S2 are arranged side by side in a normal Bayer layout.

The pixel structures of S1 and S2 will be described.

Figure 3B:
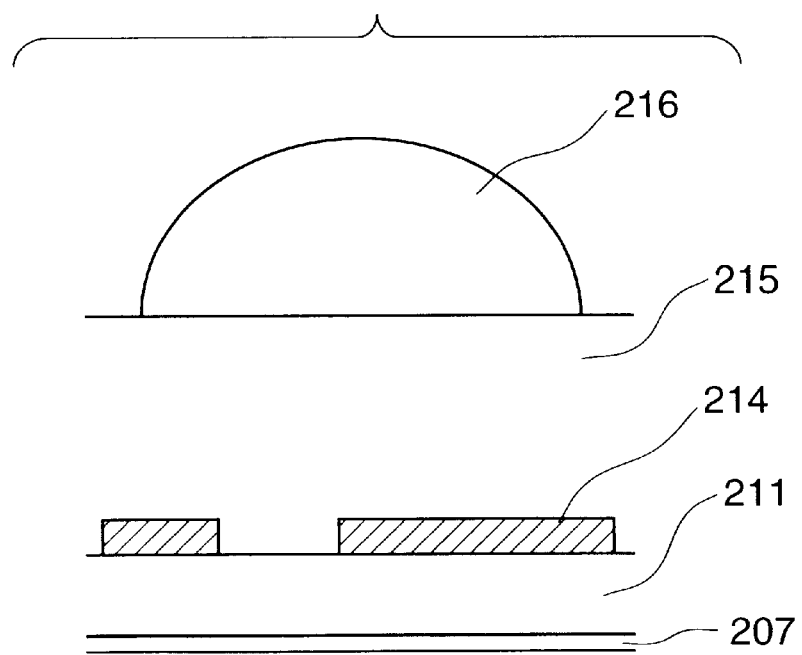

FIGS. 3A and 3B show the pixel structure of S1, in which FIG. 3A is a plan view, and FIG. 3B is a sectional view taken along the line B–B'. This pixel does not have any filter layer, and its top is covered with a microlens 216. Reference numeral 215 denotes a smoothing layer which smoothes a surface for forming the microlens and corresponds to the protective layer 213 of the color pixel (the smoothing layer 215 is formed in the same step as the protective layer 213). The feature of this pixel is that a light-shielding layer having an opening offset (decentered) from the center of the photoelectric conversion area of the pixel is formed on the same surface as the light-shielding metal layer for preventing color mixture in the color pixel.

Figure 4A:
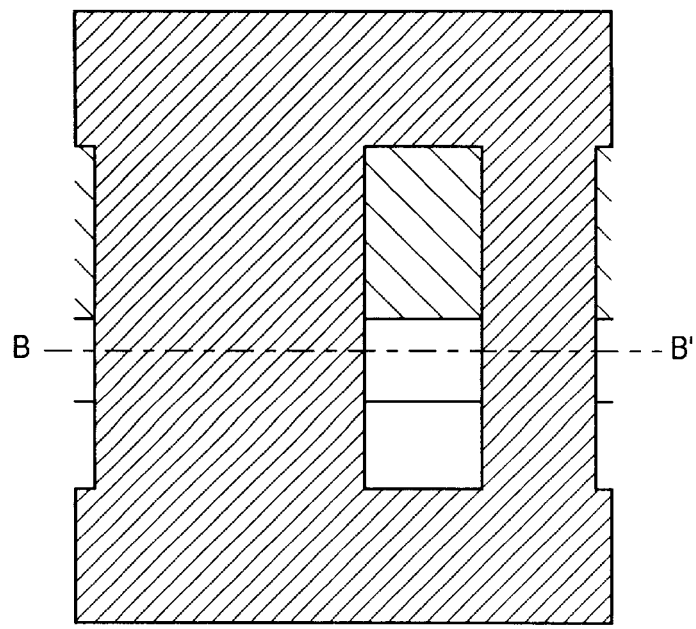
FIGS. 4A and 4B are a plan view and a sectional view, respectively, showing the structure of a pixel for detecting the second phase in the solid-stage image sensing apparatus according to the embodiment of the present invention.
Figure 4B:
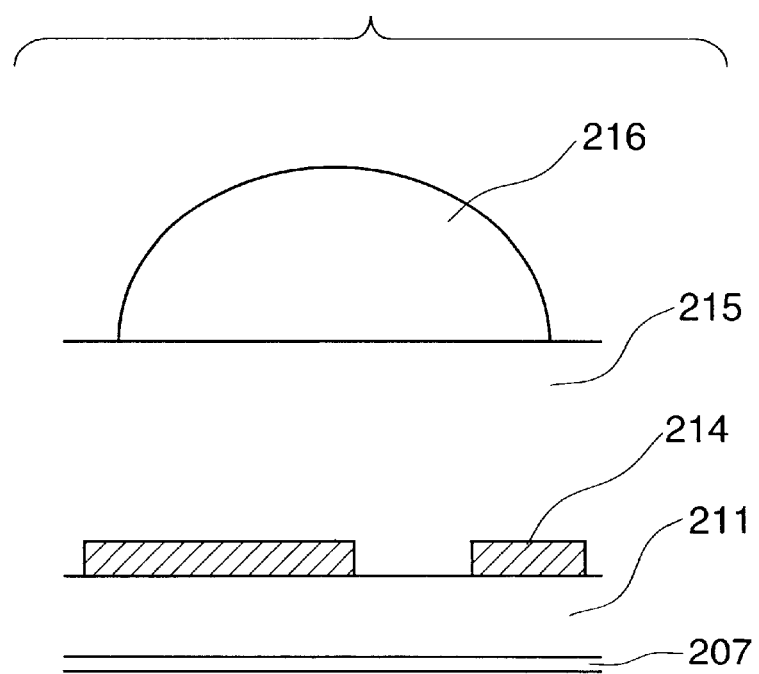

FIG. 4B is a sectional view showing the structure of S2. S2 has an opening offset from the pixel center by the same distance as SI in an opposite direction.

In an area sensor having 1,000,000 pixels or more, the rows of S1 and S2 are regarded as almost the same line in the layout of FIG. 2, and an approximate image is formed on their microlenses. If the camera lens for forming an image on the image sensing element is in an in-focus state on the image sensing element, an image signal from an S1 group on an S1-including row coincides with an image signal from an S2 group on an S2-including row. If the focal point is before or behind the imaging plane of the image sensing element, the image signals from the S1 and S2 groups on the S1- and S2-including rows have a phase difference. The phase differences in the near-focus state and far-focus state have opposite directions.

This is theoretically the same as the above-described pupil division phase difference AF in Japanese Patent Laid-Open No. 9-43507. When the camera lens is viewed from the photoelectric conversion portion of S1 and the photoelectric conversion portion of S2, the pupil seems to be divided into right and left parts with respect to the optical center.

Figure 5A:
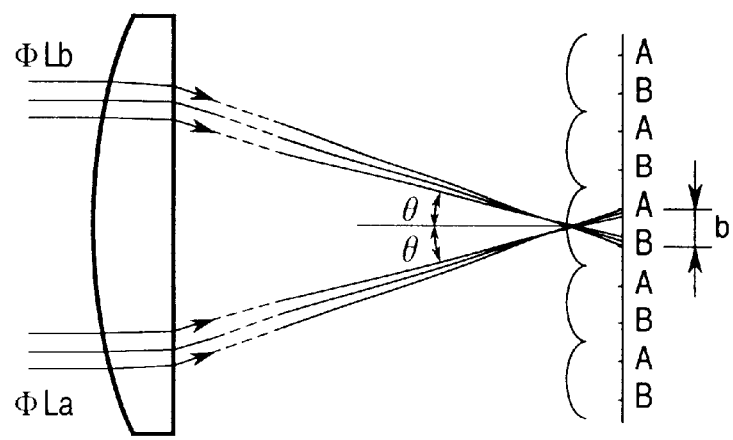
FIGS. 5A and 5B are views for explaining the principle of detecting a focus shift in the solid-stage image sensing apparatus according to the embodiment of the present invention.
Figure 5B:
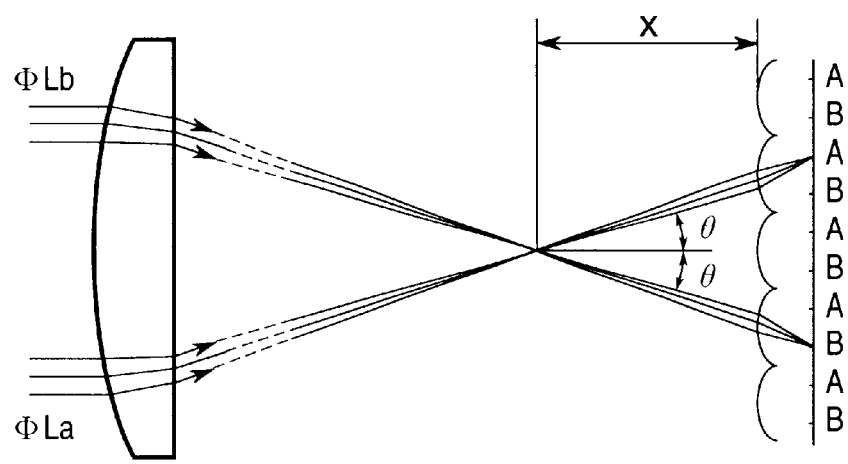

FIGS. 5A and 5B are views showing the concept of an out-of-focus image shift. In FIGS. 5A and 5B, S1 and S2 are united as points A and B. For descriptive convenience, color pixels between functional pixels are omitted as if the functional pixels were aligned.

Light from a specific point on an object is split into a light beam (ΦLa) incident on the point A via its pupil, and a light beam (ΦLb) incident on the point B via its pupil. Since the two light beams are originally emitted from one point, they should reach one point on the same microlens (FIG. 5A) if the focal point of the camera lens is adjusted to the image sensing element. However, if the focal point is before the arrival point by a distance x, the light beams shift from each other by 2θx (FIG. 5B). If the focal point is before the arrival point by a distance −x, the arrival point shifts in an opposite direction.

Based on this principle, if the camera lens is in an in-focus state, an image (signal beam by the light intensity) formed by the A line and an image formed by the B line coincide with each other; otherwise, shift from each other.

The image sensing element according to the first embodiment is based on this principle to assemble pixels having microlenses with different opening positions into a basic layout, and to define a region where the row of a basic layout including pixels (S1) having the first openings is arranged adjacent to the row of a basic layout including pixels (S2) having the second openings. A shift between row image signals from the S1 and S2 groups in this region is calculated to obtain a shift of the focus of the camera lens, and the lens of the camera is moved to eliminate this focus error, thereby realizing autofocus.

Figure 10:
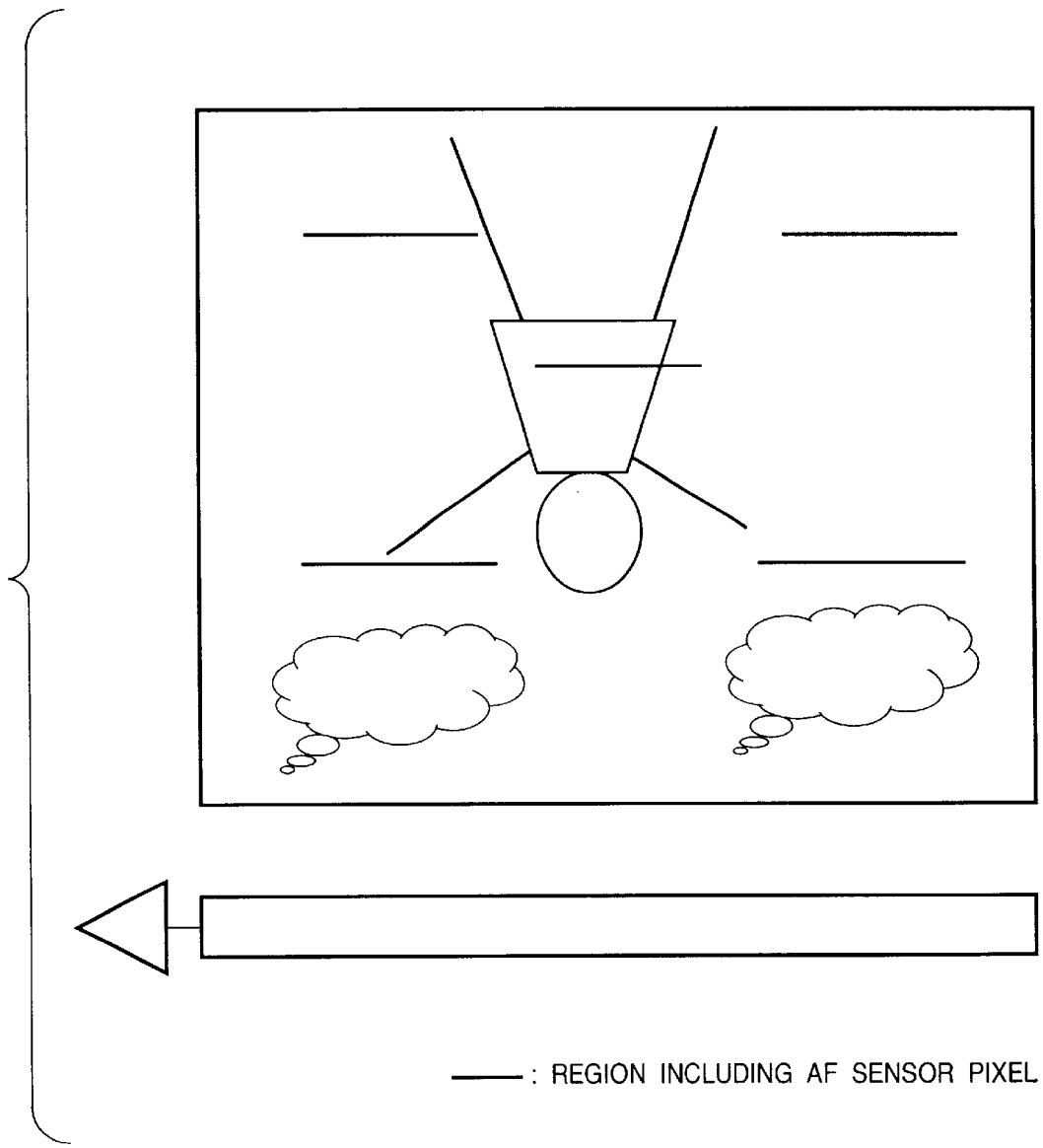
FIG. 10 is a view showing a region having a distance measurement pixel in the solid-stage image sensing apparatus according to the embodiment of the present invention.

The region having the distance measurement pixels of the S1 and S2 groups need not be set on the entire image sensing area or over all rows. For example, distance measurement regions suffice to be buried at several points, as shown in FIG. 10.

When a distance measurement signal is to be read out from the image sensing element, the charges of only a line including the distance measurement signal are read out, and the remaining unnecessary charges are cleared at a high speed.

Figure 15:
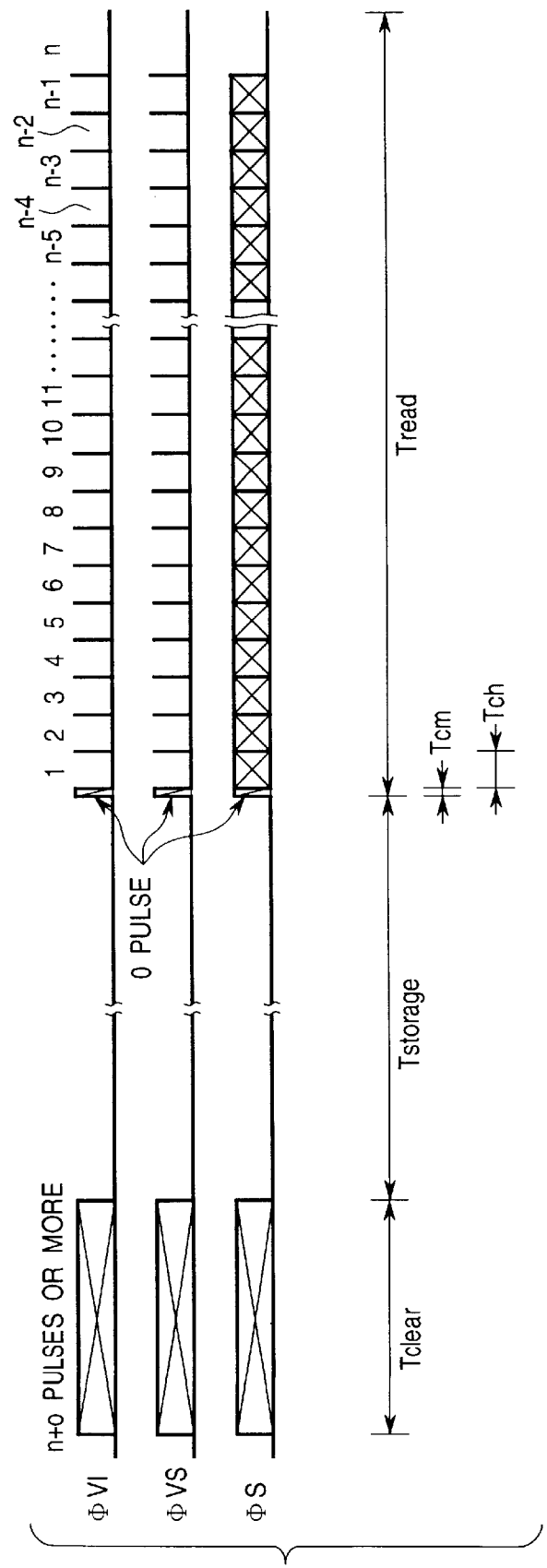
FIG. 15 is a timing chart showing the image read timing of the solid-stage image sensing apparatus.
Figure 16:
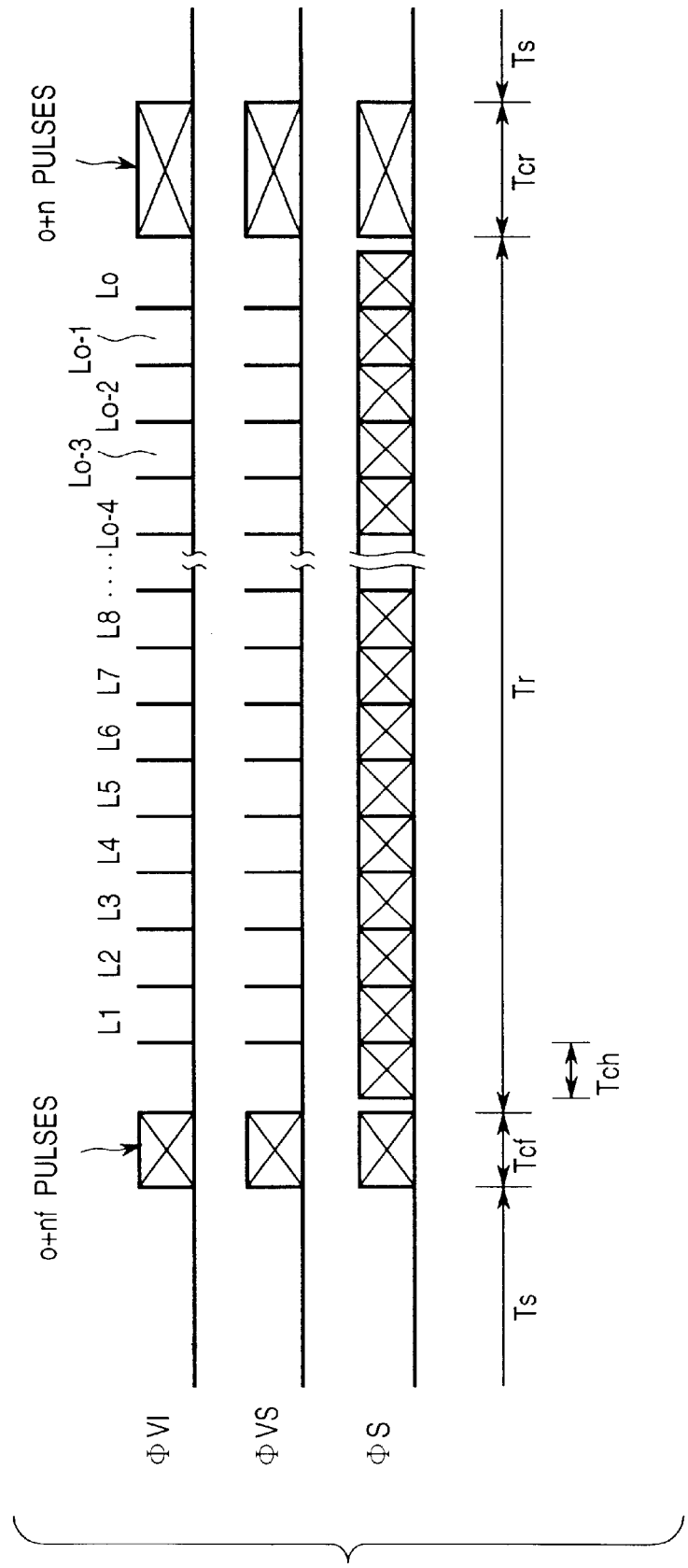
FIG. 16 is a timing chart showing the distance measurement/photometric data read timing of the solid-stage image sensing apparatus.

The image capture mode of the improved full-frame CCD, and the partial read mode for a read from a distance measurement region will be described with reference to the timing charts of FIGS. 15 and 16, respectively.

In normal photographing using the sensor in FIG. 11, a mechanical shutter attached to the front surface of the image sensing element is closed. The pulses ΦVI, ΦVS, and ΦS are applied at a high speed to perform clear operation of removing charges from the image area and storage area to the clear drain 5 (Tclear).

The numbers of pulses ΦVI, ΦVS, and ΦS correspond to n+o or more transfer V-CCDS. The charges in the image area and storage area are removed to the clear drain via the horizontal. drain and floating diffusion amplifier via the H-CCD. In an image sensing element having a gate between the H-CCD and horizontal drain, the gate can open only during the clear period to efficiently remove unnecessary charges.

The mechanical shutter is opened immediately upon completion of clear operation, and closed upon the lapse of a time for obtaining a proper exposure amount. This period will be called an exposure time (or storage time) (Tstorage). During the storage time, the V-CCD stops (ΦVI and ΦVS are at low level).

Signal charges generated in accordance with light incident on the sensor surface (image light formed into an image on the sensor surface via the imaging lens before the sensor) are accumulated in the virtual well in each pixel. When the charge amount increases to exceed the overflow drain barrier, subsequent charges are removed to the overflow drain. Since the storage section is shielded from light, each pixel is vacant without any signal charges.

After the shutter is closed, signals charges on o lines are vertically transferred (Tcm). This operation transfers signal charges on the first line (line adjacent to the storage section) of the image area to the first line (line adjacent to the H-CCD) of the storage section. The first o-line transfer is continuously performed. To clear charges in the H-CCD before transferring the charges from the first line of the image area to the H-CCD, the charges of all the lines of the H-CCD are transferred (Tch). This removes charges left in the H-CCD in the clear period (Tstorage) of the image section and storage section, and the charges of a dark current accumulated in the H-CCD during the clear period (Tcm) of the storage section.

After the storage section is cleared (this is read set operation of transferring signals from the first line of the image section to the final V-CCD adjacent to the H-CCD), and the H-CCD is cleared, signal charges in the image section are sequentially transferred from the first line to the H-CCD to sequentially read out the signals in units of lines (Tread). The readout signal charges are converted into digital signals, which undergo image signal processing by a pre-processing circuit made up of a CDS circuit, amplifier circuit, and A/D conversion circuit.

A partial read for AF of the digital camera using this sensor will be explained with reference to the timing chart of FIG. 16.

In general, the full-frame sensor separately comprises AF and AE sensors because the shutter must be closed during transfer. To the contrary, the sensor of the present invention can read out part of the image section at once or repetitively while the shutter is kept open.

First, signal charges on o lines (no lines) at arbitrary locations in the image area are stored in the storage area, and preceding-area clear transfer for removing charges on the (o+nf) lines is done to drain signal charges in the preceding image area (nf) of the arbitrary o storage lines (Tcf). Then, signal charges on the no lines are stored in the storage area 2 during the storage period (Ts) before the preceding-area clear period Tcf.

Immediately, the H-CCD is cleared to drain charges left in the H-CCD upon the preceding-area operation (Tch). After that, signal charges in the no lines of the storage section are transferred to the H-CCD in units of lines and sequentially read out from the output amplifier (Tr). Upon completion of a read of the signals in the no lines, all the lines of the image sensing element are cleared (Tcr) to complete a high-speed partial read. By similarly repeating this operation, a partial read can be continuously executed. In the above-mentioned method of performing AF by measuring the phase difference between formed images, signal charges are read out from several portions in the image area for the purpose of an AF read. Instead, for example, signal charges are repetitively read while changing locations such that a signal is read out from an H-CCD side in the first sequence (Tcr–Ts–Tcf–Tr), from an intermediate location in the second sequence, and from an opposite side to the H-CCD in one sequence in FIG. 16. This allows measuring the difference in focal point between several locations to perform weighting.

Operation of one partial read cycle and the method of changing the read location have been explained. Alternatively, signals at a plurality of locations can be read out (stored in the storage area) in one cycle. For example, immediately after signals on o/2 lines are transferred to the storage section, the electrode of the storage area is changed to a high voltage (i.e., a wall for stopping transfer of signal charges from the image area is formed), pulses for a necessary number of lines up to the next necessary signal are applied to the electrode of the image area in order to transfer charges up to the next necessary o lines to the final virtual well of the V-CCD in the image section. Then, charges up to the next necessary signal are transferred to the final virtual well, and charges exceeding the overflow drain barrier are removed to the overflow drain. If o/2 transfer pulses are applied to the image area electrode and storage area electrode, the storage area stores signals on {(o/2)−1} lines in the second region next to the first o/2 lines after an invalid line left after clear operation in an intermediate portion. If signals in three regions are to be stored, the second intermediate clear operation is done after the second signal storage, and then signals in the third region are stored. A larger number of storage regions decreases the number of storage lines at respective portions. In this way, if data at a plurality of portions are read out in one cycle, AF can be realized at a higher speed than the above-described case of reading out data at one portion in one cycle.

FIGS. 6, 7, and 8 show modifications of the layout of S1 and S2. In the above embodiment, the first and second phase detection rows slightly shift from each other. This does not pose any problem in an image sensing element of more than 100 pixels. However, these modifications approximate the phase detection rows to the same portion.

In FIG. 6, S1 and S2 are alternately laid out on the same row. In FIG. 7, S1 rows are laid out before and after an S2 row. The first and second S1 rows unedergo interpolation to generate data of the S1 row corresponding to the S2 row. FIG. 8 is a modification of the layout in FIG. 6 in which two rows each alternately including S1 and S2 are zigzagged.

The pixel group for generating a phase difference signal and the driving method of reading out a signal from this portion enable high-speed, high-precision AF.

In image processing of raw data (raw information of each pixel) of an image by actual photographing with this image sensing element, the portions S1 and S2 are interpolated by peripheral color pixels. This realizes an image sensing element which hardly degrades image quality and can read distance measurement data in addition to a captured image. On the assumption of the interpolation, a cell of 2×2 pixels with three colors and one function can be easily interpolated and hardly degrades image quality. A 2×4 layout can also be interpolated though the S1 row is more apart from the S2 row than in the 2×2 layout.

The above embodiment concerns the image sensing element including a distance measurement pixel group, and can be modified into an image sensing element having a pixel group for obtaining AE information. This modification will be described below.

FIG. 9 shows the openings of pixels functioning as AE pixels. These openings are formed from a metal light-shielding film similarly to the AF pixel. The AE pixel is different from the AF pixel in that the center of the opening coincides with the center of the photoelectric conversion portion. Note that the AE pixel does not always require a microlens, unlike the AF pixel, and requires only a definite difference in sensitivity.

When S3 has a sensitivity of 1, S4 has a sensitivity of ½ (i.e., n=1 for ½″), S5 has a sensitivity of ¼ (i.e., n=2 for ½″), and S6 has sensitivity of ⅛ (i.e., n=3 for ½″). Pluralities of pixels S3, S4, S5, and S6 are laid out in a plurality of arbitrary regions in the image sensing area. A shift of current exposure from a proper level can be calculated from the integrated values of the S3, S4, S5, and S6 pixel groups in the respective regions and the integrated values of respective color pixels.

By arranging a plurality of pixels having different openings in a plurality of regions, AE can be achieved at a much higher speed than an AE method of adjusting the output level of the image sensing element while adjusting the exposure level. Also in this case, if signal charges are read out from only a region including detection pixels, similarly to AF, the read time of the image sensing element can be shortened.

The first embodiment has been described by exemplifying the improved full-frame CCD, but can also be applied to an interline CCD image sensing element, frame-transfer CCD image sensing element, and X-Y address image sensing element.

(Second Embodiment)

Before a description of the second embodiment, improvable points of the first embodiment will be explained.

Figure 17:
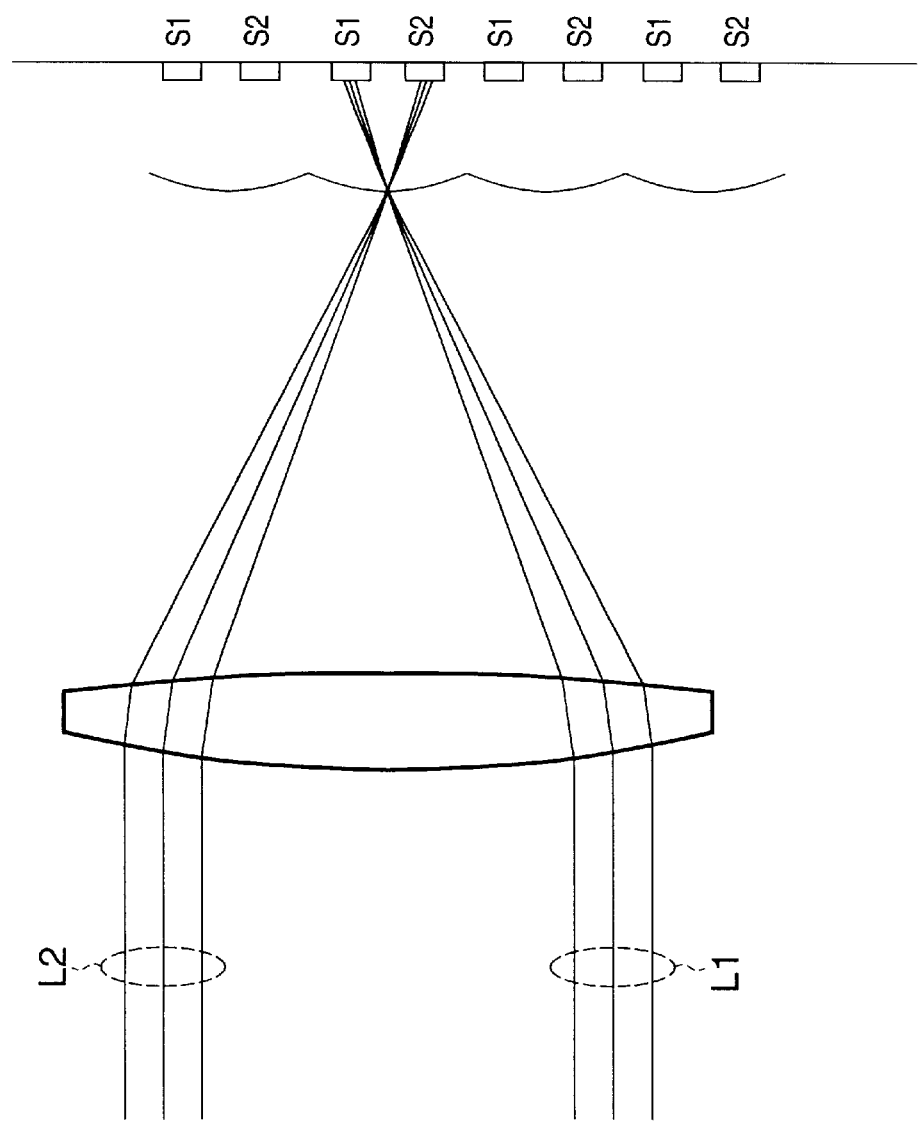
FIG. 17 is a view showing the concept of detecting the focal point in the first embodiment.
Figure 18:
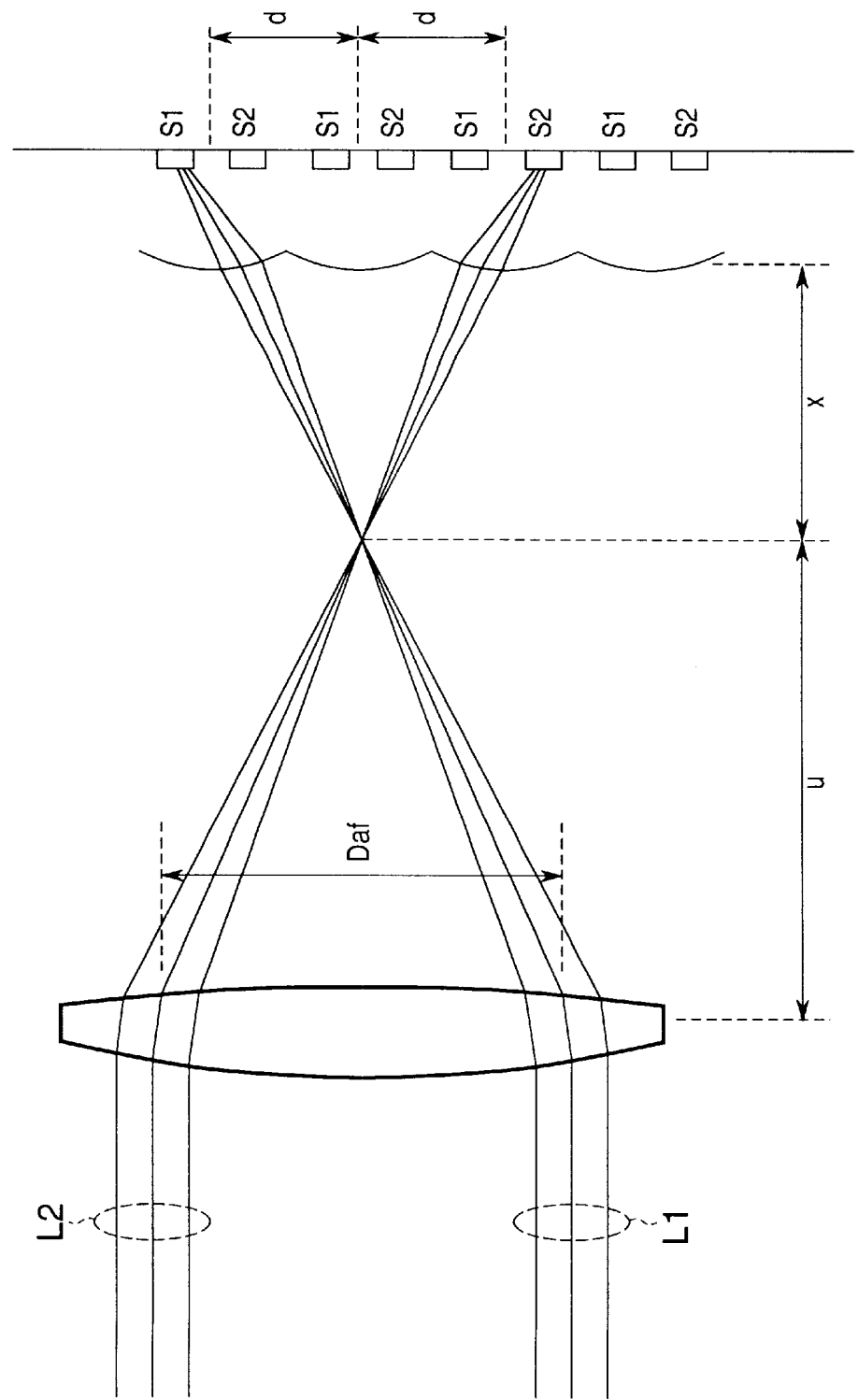
FIG. 18 is a view showing the concept of detecting the focal point in the first embodiment.

FIGS. 17 and 18 are views showing the concept of detecting the focal point in the first embodiment. For descriptive convenience, S1 and S2 are arranged on the same plane.

Light from a specific point on an object is split into a light beam (L1) incident on S1 via the pupil of S1, and a light beam (L2) incident on S2 via the pupil of S2. If the camera is in an in-focus state, the two light beams focus on one point on the microlens surface, as shown in FIG. 17. The same image is exposed on S1 and S2. Thus, a video signal read out from the S1 row and a video signal read out from the S2 row coincide with each other.

To the contrary, if the camera is out of focus, L1 and L2 cross each other at a position different from the microlens surface. Assume that the distance between the microlens surface and the intersection of the two light beams, i.e., the defocus amount is x, the image on S1 and the image on S2 shift by n pixels, the sensor pitch is d, the distance between the centers of gravity at the two pupils is Daf, and the distance from the principal point to focal point of the lens is u. At this time, the defocus amount x is given by $$x = n \cdot d \cdot u / Daf \quad (1)$$

Since u is assumed to be almost equal to a focal length f, $$x = n \cdot d \cdot f / Daf \quad (2)$$

Figure 19:
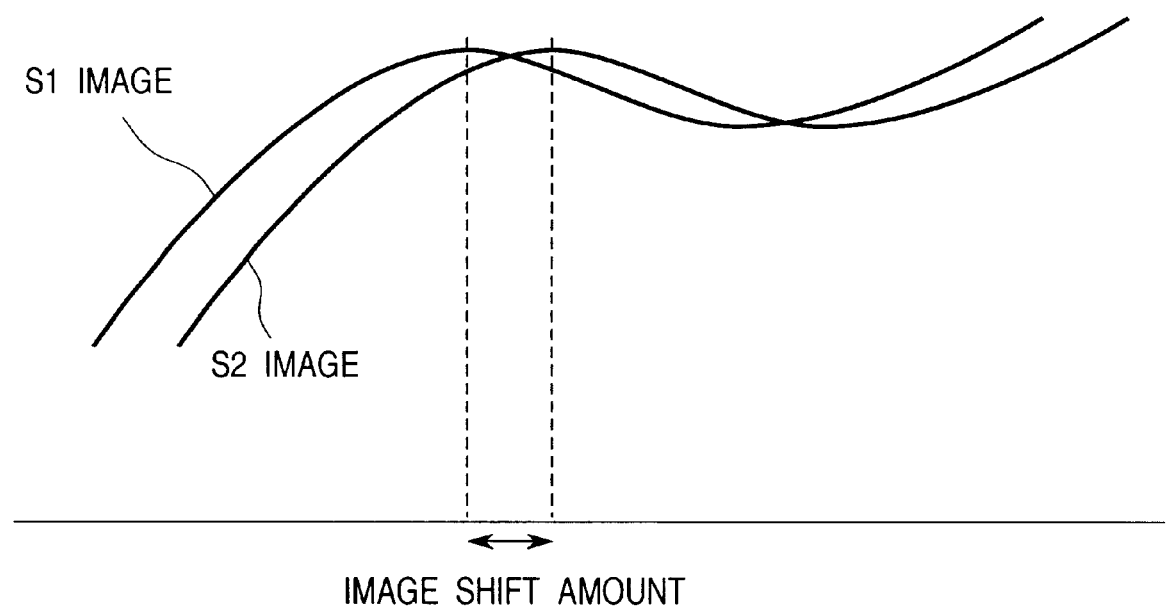
FIG. 19 is a graph showing an image shift in the first embodiment.

FIG. 19 shows a video signal read out from the S1 row and a video signal read out from the S2 row on the image sensing element. The video signal read out from the S1 row and the video signal read out from the S2 row have an image shift of n·d. The shift amount between the two video signals is obtained to calculate the defocus amount x, and the lens is moved by x to achieve autofocus.

To generate this image shift, light incident on the lens must be split into the light beams L1 and L2 via two different pupils. According to this method, a focus detection cell having a pupil division function is formed on the image sensing element to divide the pupil.

Figure 20:
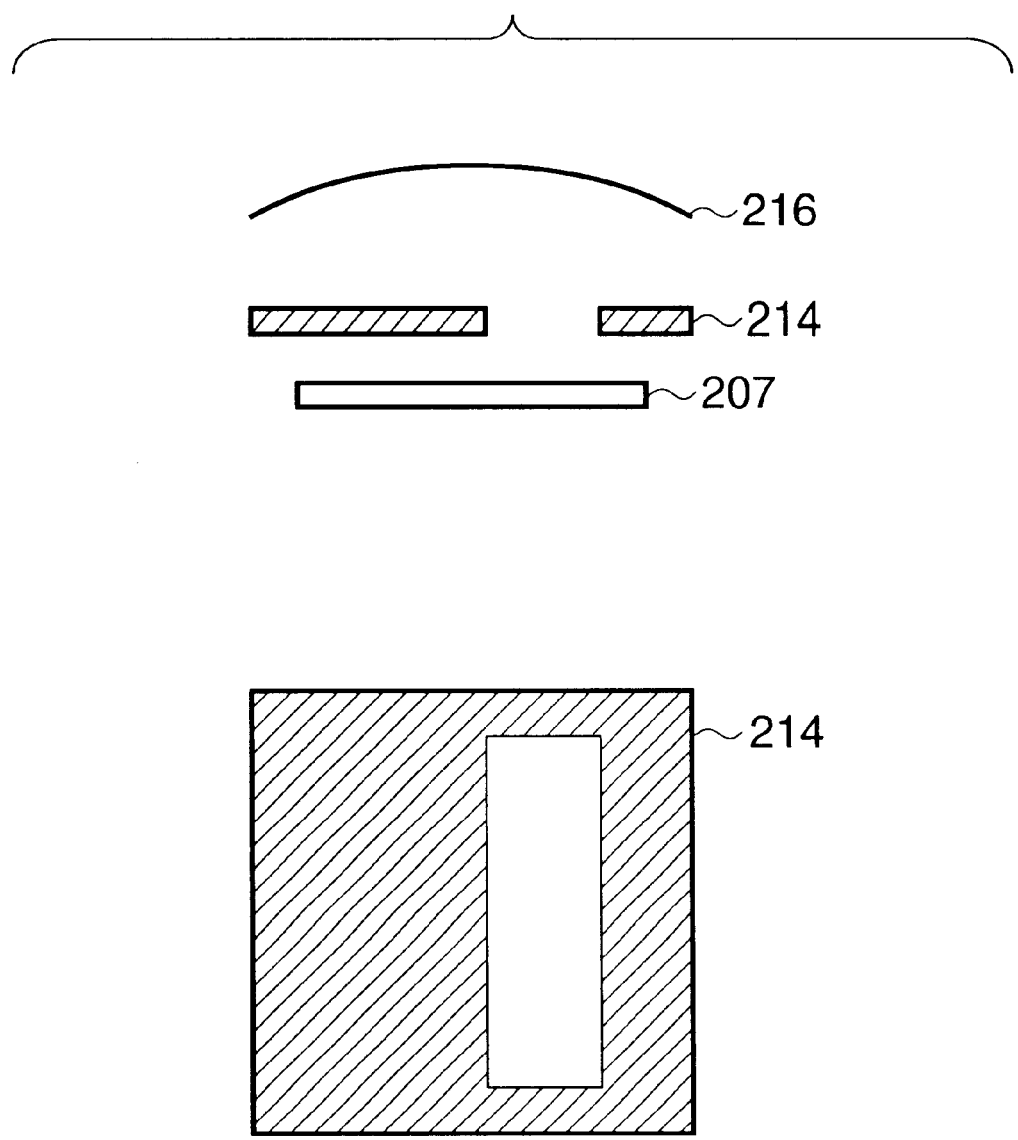
FIG. 20 is a view showing a focus detection cell in the first embodiment.
Figure 21:
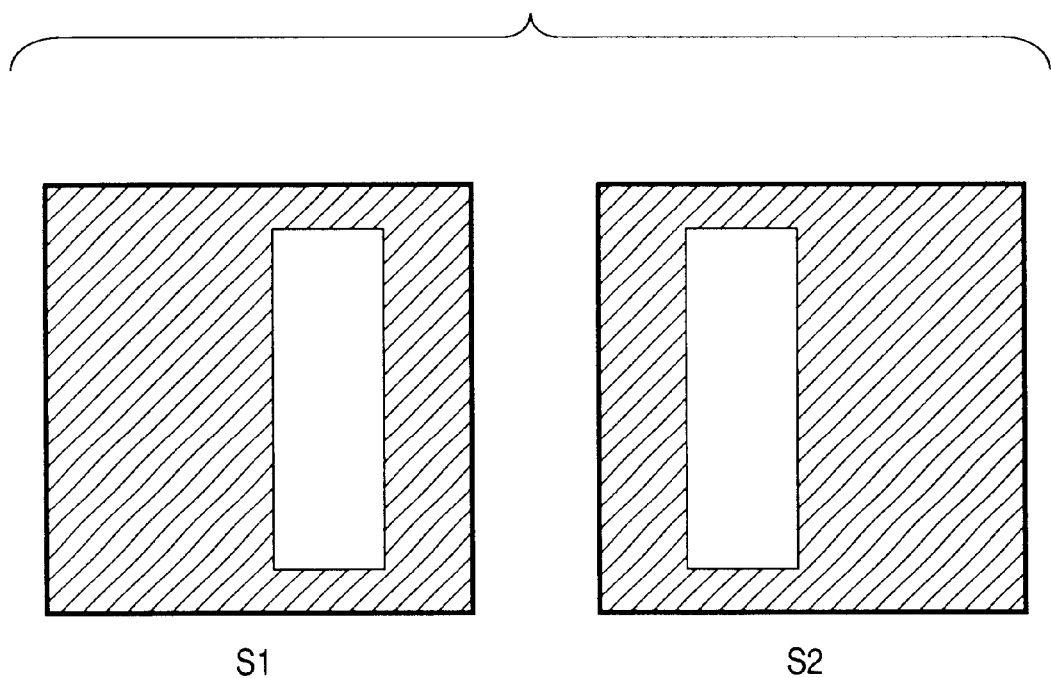
FIG. 21 is a view showing a light-shielding film.

FIG. 20 shows the focus detection cell. Reference numeral 216 denotes a microlens; 214, a light-shielding film; and 207, a photoelectric converter. Light from the photographing lens is incident on the microlens 216, and the light incident on the photoelectric converter 207 is limited to a light beam from a specific direction by the light-shielding film 214. The light-shielding films of the focus detection cells S1 and S2 are symmetrical horizontally (or vertically), as shown in FIG. 21. One of images formed on the sensor by light beams from two pupil positions symmetrical about the optical axis is photoelectrically converted by the S1 row, and the other is photoelectrically converted by the S2 row, thereby obtaining two images having different pupil positions.

Figure 22:
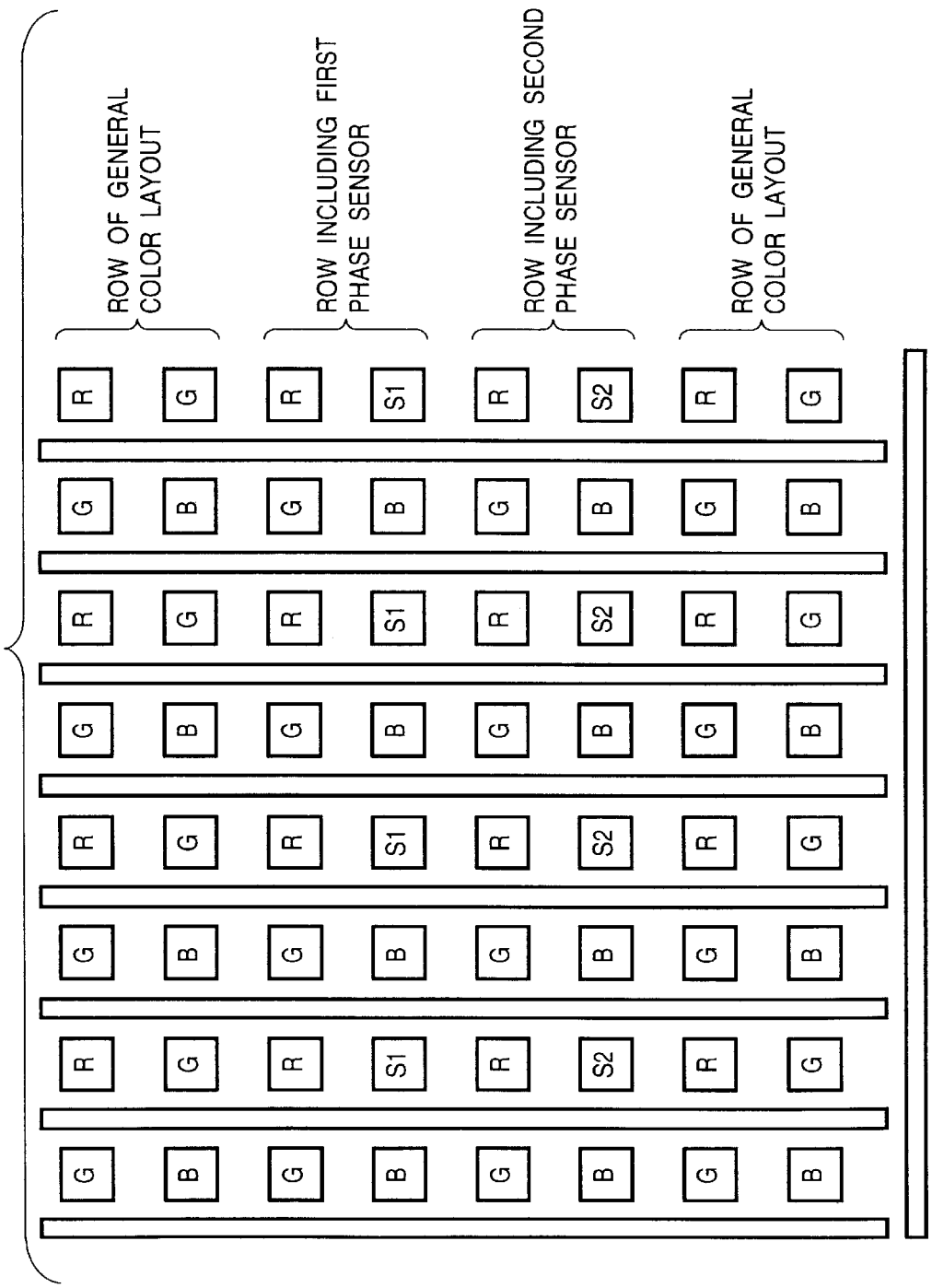
FIG. 22 is a view showing the arrangement of an image sensing element in the first embodiment.

FIG. 22 shows the image sensing element. Color filters or focus detection light-shielding films are formed on the image sensing element. Reference symbol R denotes a cell having a red filter; G, a cell having a green filter; B, a cell having a blue filter; and S1 and S2, focus detection cells.

In autofocus operation, signals are read out from rows including S1 and S2 in the image sensing element, and the signals output from the image sensing element are A/D-converted. Images on S1 and S2 are formed from the obtained pixel values, and the correlation between the two images are calculated to obtain the image shift amount. The lens is moved in accordance with the obtained shift amount to achieve autofocus operation.

In photographing, an object image is exposed onto the image sensing element and read out from all the pixels. The signals read out from the image sensing element are A/D-converted and input to a signal processing circuit. The signal processing circuit abandons pixel values read out from S1 and S2, and instead generates and interpolates pixel values corresponding to S1 and S2 from peripheral pixels. Thereafter, luminance and color difference signals are generated, compressed, and saved as an image file in a recording medium.

The apparatus of the first embodiment, however, cannot use any autofocus functional cell in photographing, and must interpolate this portion using peripheral pixel.

In photographing a still image, interpolation is done after a video signal is stored in the memory. In photographing a moving image or operating an electronic viewfinder, about 30 images are repetitively read out from the image sensing element every second, so processing may not be completed within the time.

The second embodiment is an improvement of this drawback.

Figure 23:
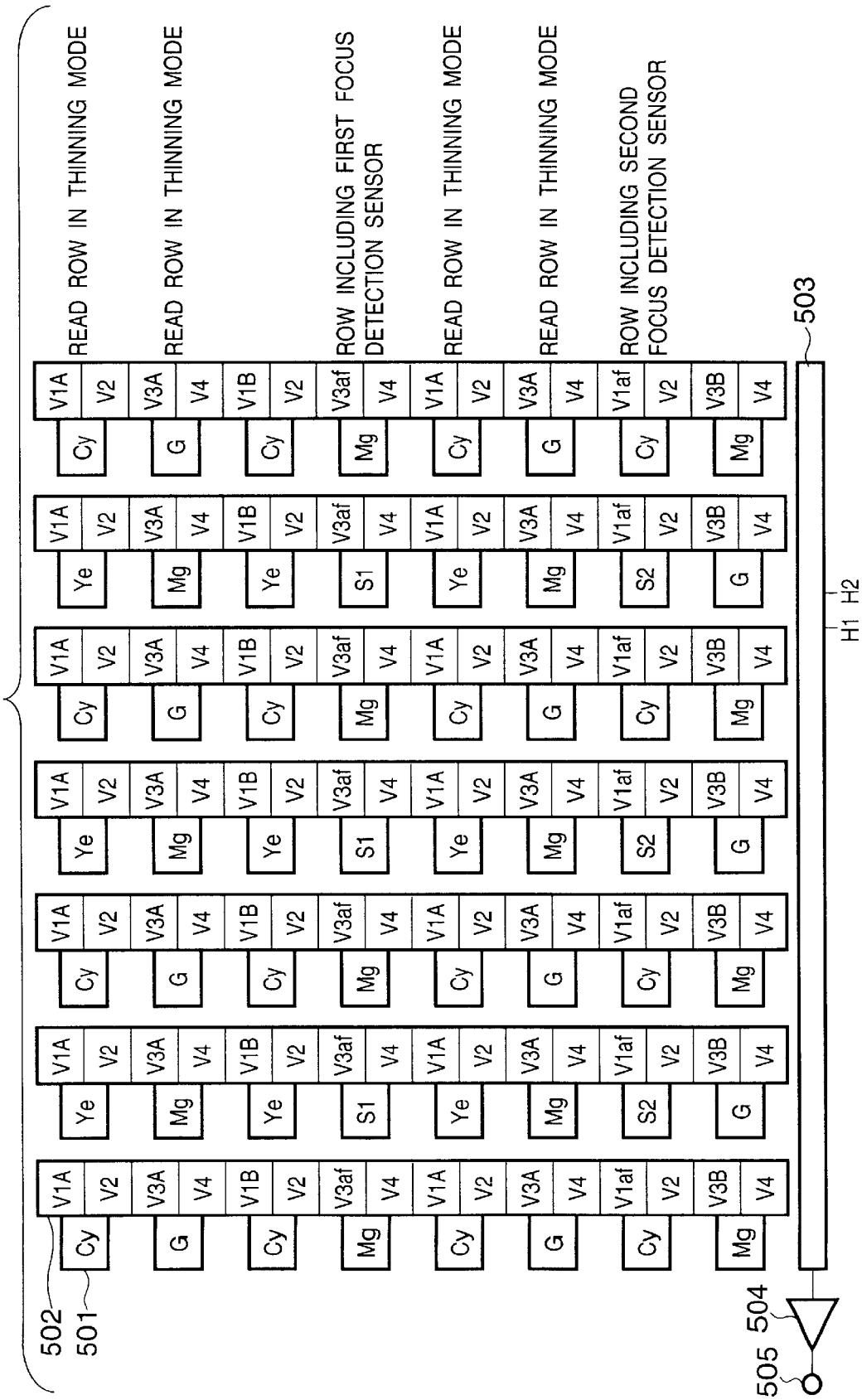
FIG. 23 is a view showing the arrangement of an image sensing element in the second embodiment.

FIG. 23 shows the arrangement of a solid-state image sensing apparatus according to the second embodiment.

The second embodiment will exemplify an interline CCD having a complimentary color filter. Reference numerals 501 denote pixels formed from photoelectric converters. The pixels 501 are laid out in a matrix on an image sensing element, and their surfaces are covered with color filters or focus detection filters. Reference numeral 502 denotes a vertical transfer CCD. The vertical transfer CCD 502 is a 4-phase driving CCD. To independently read out charges from focus detection pixels or pixels selected in a thinning mode, vertical transfer pulses V1 and V3 to be applied are functionally divided into V1A, V1B, V1af, V3A, V3B, and V3af. These pulses are used for 4-phase driving together with V2 and V4 to transfer charges stored in respective pixels to a horizontal transfer CCD 503. The horizontal transfer CCD 503 transfers the charges to an output amplifier 504 in response to horizontal transfer pulses H1 and H2. The output amplifier converts the charge amount into a voltage and outputs the voltage to an output terminal 505.

Operation of the second embodiment will be described. This embodiment relates to read methods, respectively, in a still image photographing mode, thinning mode, and distance measurement mode.

Figure 24:
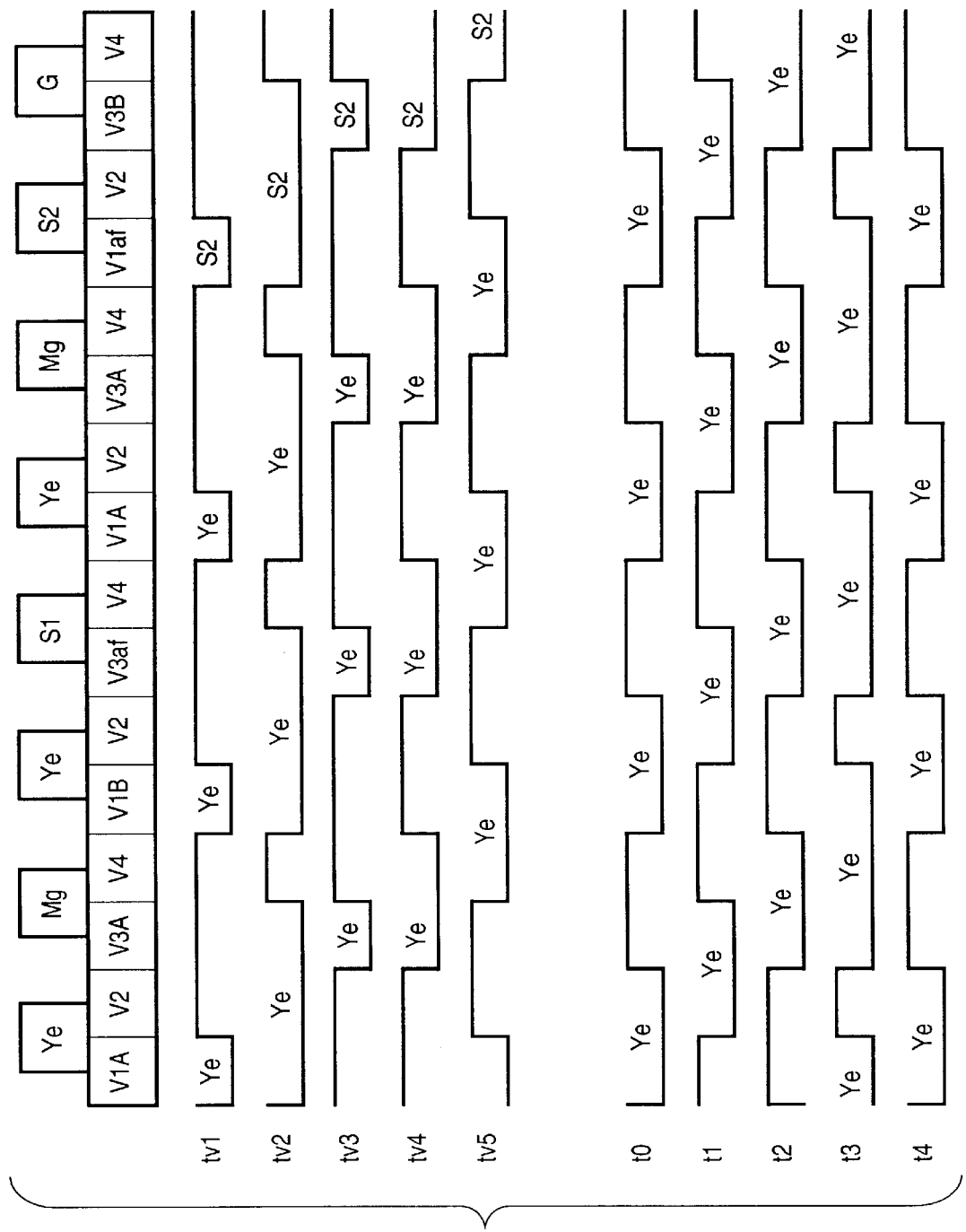
FIG. 24 is a view showing the operational concept of a vertical transfer CCD in the second embodiment.
Figure 27:
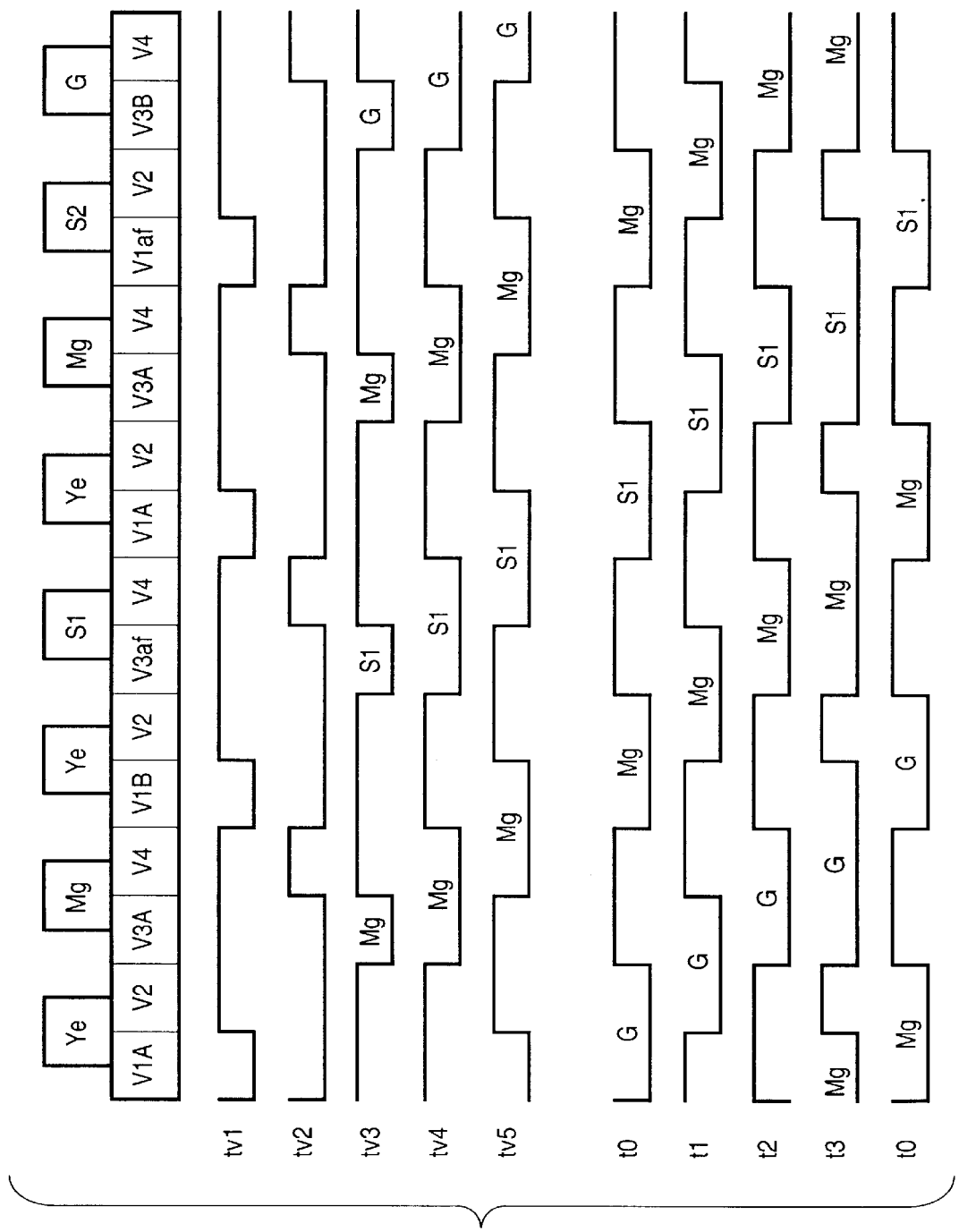
FIG. 27 is a view showing the operational concept of the vertical transfer CCD in the second embodiment.

The still image photographing mode will be explained. FIGS. 24 and 27 show operation in photographing a still image in the second embodiment. In photographing operation, charges are read out from the first field shown in FIG. 24 and the second field shown in FIG. 27, and rearranged in the memory such that the layout of the readout pixels coincide with the layout of the pixels on the image sensing element. With this operation, charges from all the pixels on the image sensing element are transferred to the memory to obtain a high-resolution video image using all the pixels on the image sensing element.

Figure 25:
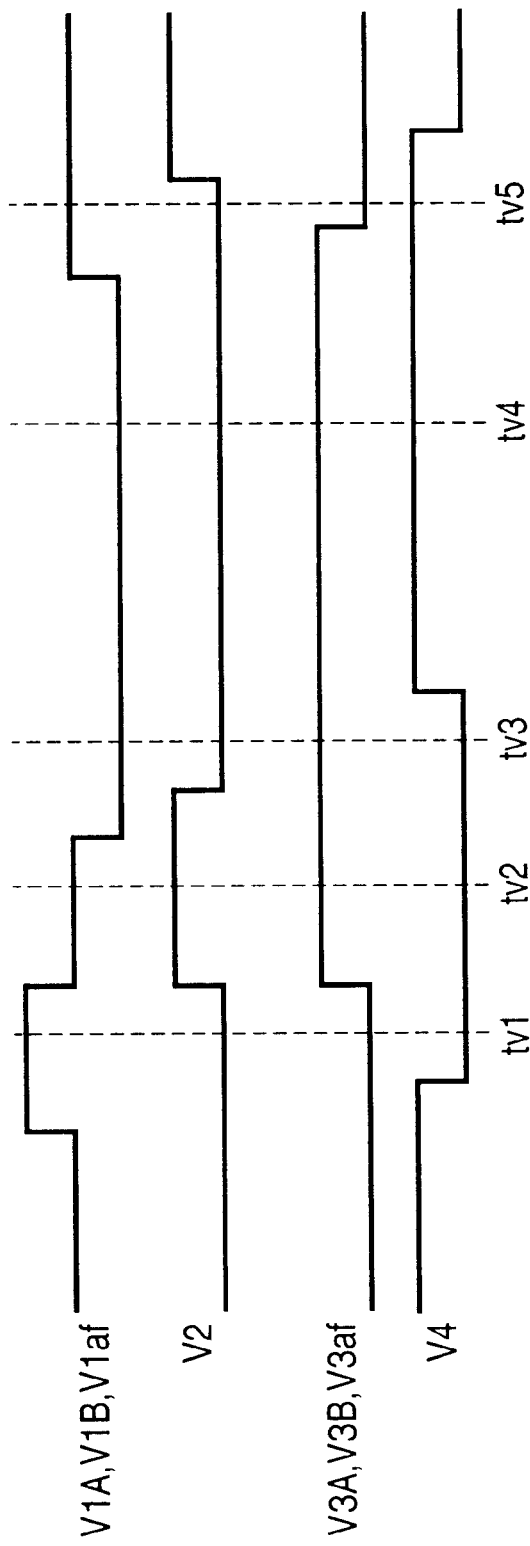
FIG. 25 is a timing chart showing a vertical transfer pulse in the second embodiment.

A read from the first field will be described. FIG. 24 shows the vertical transfer CCD and pixels on one column in the pixel matrix in FIG. 23. FIGS. 25 and 26 show vertical transfer pulses. The vertical transfer pulse takes three, low, intermediate, and high voltages.

At tv1 in FIG. 25, a high voltage is applied to V1A, V1B, and V1af. Then, potential wells are formed in V1A, V1B, and V1af, as shown at tv1 in FIG. 24. At the same time, the read gates of V1A, V1B, and V1af open, and charges in the photoelectric converters on a Ye-Cy line and Ye-S2 line in the pixel matrix move to the vertical transfer CCD, as shown at tv1 of FIG. 24. FIG. 24 shows only Ye and S2 charges. With the lapse of a time to tv2, tv3, tv4, and tv5, pulses shown in FIG. 25 are applied to the vertical transfer CCD, and the charges in the vertical transfer CCD move with movement of the potential wells, as shown at tv2, tv3, tv4, and tv5 in FIG. 24.

The vertical transfer pulses shown in FIG. 26 are applied to the vertical transfer CCD every cycle of one horizontal blanking period, and the charges from the respective lines are transferred to the horizontal transfer CCD in units of lines.

During the horizontal transfer period, the charges in the horizontal transfer CCD are transferred to the output amplifier 504 in response to the horizontal transfer pulses H1 and H2. The output amplifier 504 converts the charges into a voltage value and outputs it to the output terminal 505.

Figure 28:
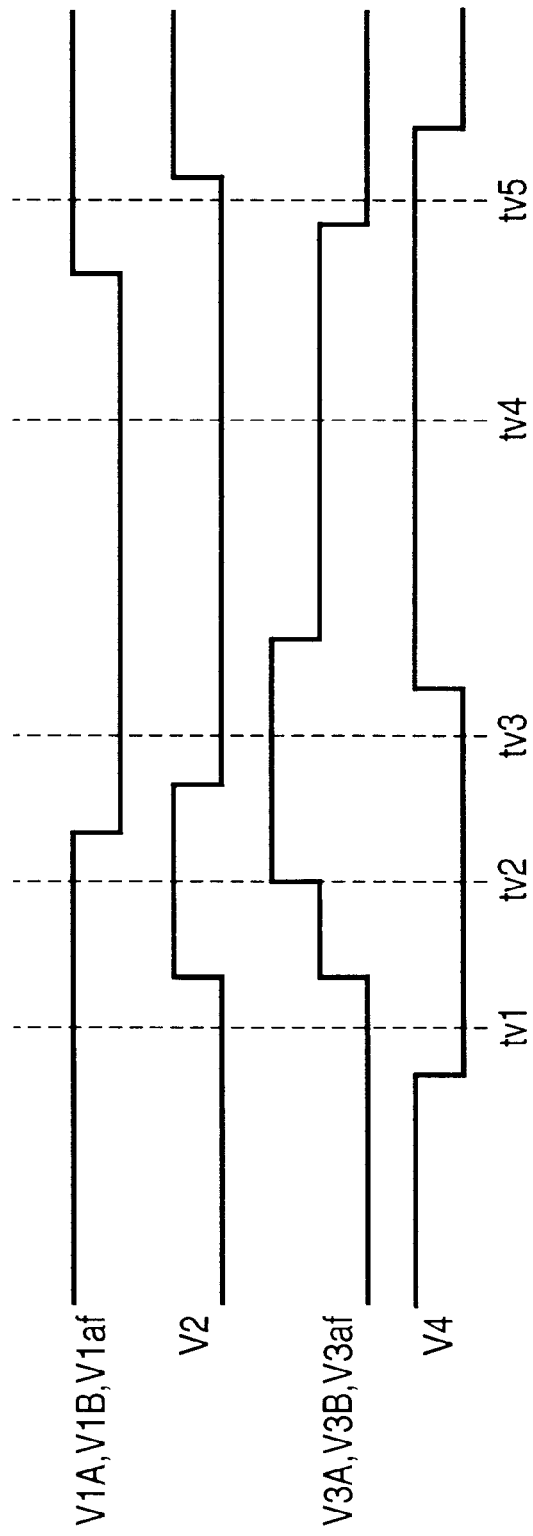
FIG. 28 is a timing chart showing the vertical transfer pulse in the second embodiment.

A read from the second field will be explained. FIG. 27 shows the vertical transfer CCD and pixels on one column in the pixel matrix at the same location as in FIG. 24. FIG. 28 shows vertical transfer pulses.

At tv1 in FIG. 28, an intermediate voltage is applied to V1A, V1B, and V1af. Then, potential wells are formed in the vertical transfer CCD, as shown at tv1 in FIG. 27. Since no read gates open, no charges in the pixels are transferred to the vertical transfer CCD. From tv2 to tv3, a high voltage is applied to V3A, V3B, and V3af, the read gates of V3A, V3B, and V3af open, and charges in the photoelectric converters on an Mg-G line and Mg-S1 line move to the vertical transfer CCD. Voltages shown at tv4 and tv5 are applied to the vertical transfer CCD, and the charges in the vertical transfer CCD move with movement of the potential wells.

The vertical transfer pulses shown in FIG. 26 are applied to the vertical transfer CCD every cycle of one horizontal blanking period, and the charges from the respective lines are transferred to the horizontal transfer CCD in units of lines.

The charges on the vertical transfer CCD are sequentially transferred to the horizontal transfer CCD every horizontal blanking, and output from the output amplifier to the output terminal.

As described above, the second embodiment reads out charges from all the pixels on the image sensing element using the two, first and second fields in the still image photographing mode. The first and second fields are alternately repeated.

In the camera using this image sensing element, all charges in the first and second fields are stored in the memory, and S1 and S2 are interpolated. S1 is interpolated using data of peripheral G pixels, while S2 is interpolated using data of peripheral Ye pixels. Pixel data in the memory is processed, luminance and color difference signals are generated, an image is compressed, and filing is done to complete photographing operation.

The thinning mode will be explained. In recent years, digital still cameras are developed for higher resolutions, and most of image sensing elements mounted thereon have several million pixels, which requires a long time for reading out a moving image. For example, when 1,600,000 pixels are realized by an interline CCD like the one shown in FIG. 23, this CCD spends about 1/15 sec for a read from 1,600,000 pixels, compared to an interline CCD in 400,000-pixel class which spends 1/60 sec for a read from one field.

When a digital still camera is manufactured using this interline CCD, the number of frames of a moving image or viewfinder image per second decreases, resulting in poor moving image quality. Further, the digital still camera spends a long time for photometric operation such as autofocus.

To solve this, the second embodiment sets the thinning mode in the image sensing element to decrease the number of pixels read out per field. Note that the thinning method in an image sensing element is applied by the present inventor as Japanese Patent Laid-Open No. 9-46715.

Figure 29:
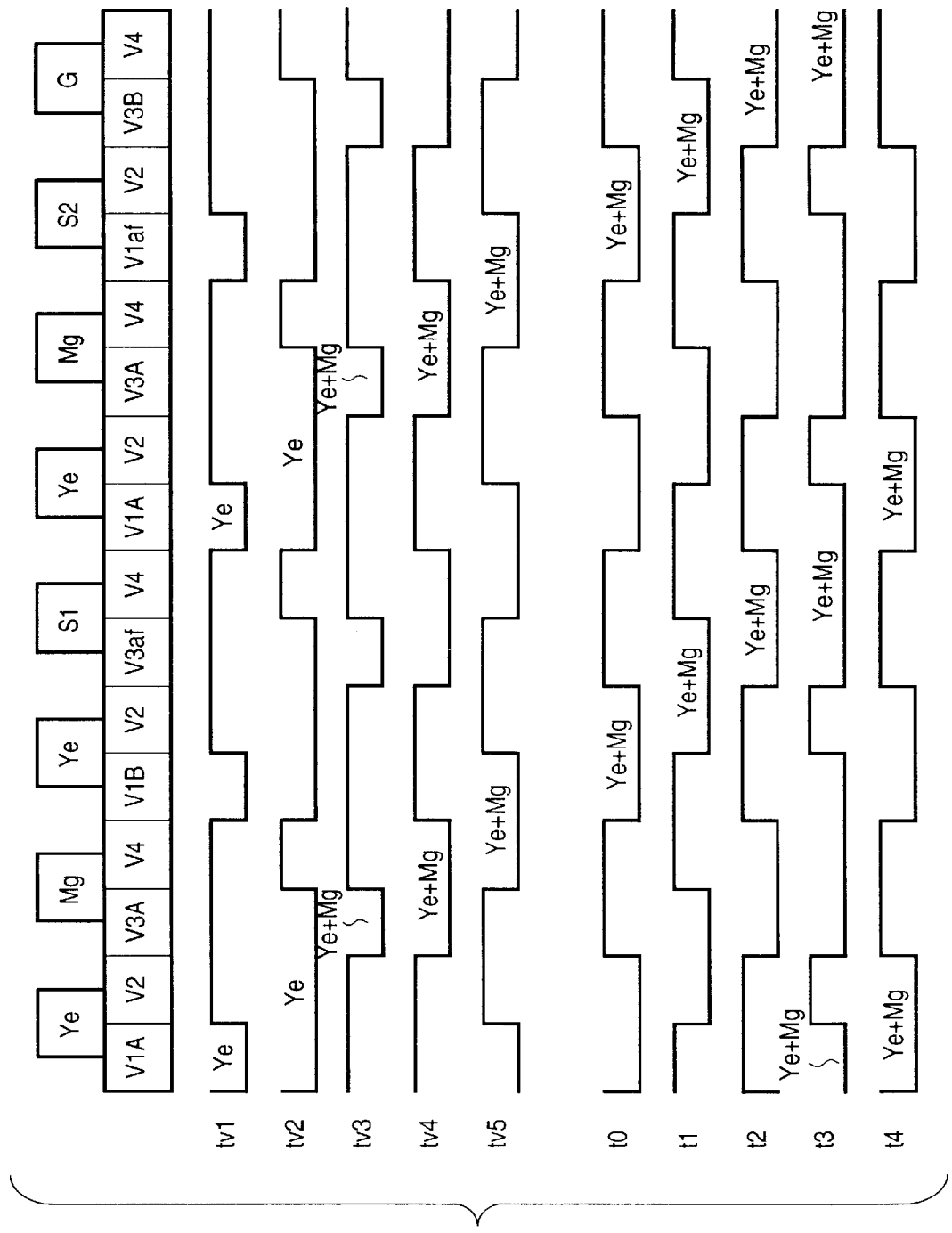
FIG. 29 is a view showing the operational concept of the vertical transfer CCD in the second embodiment.
Figure 30:
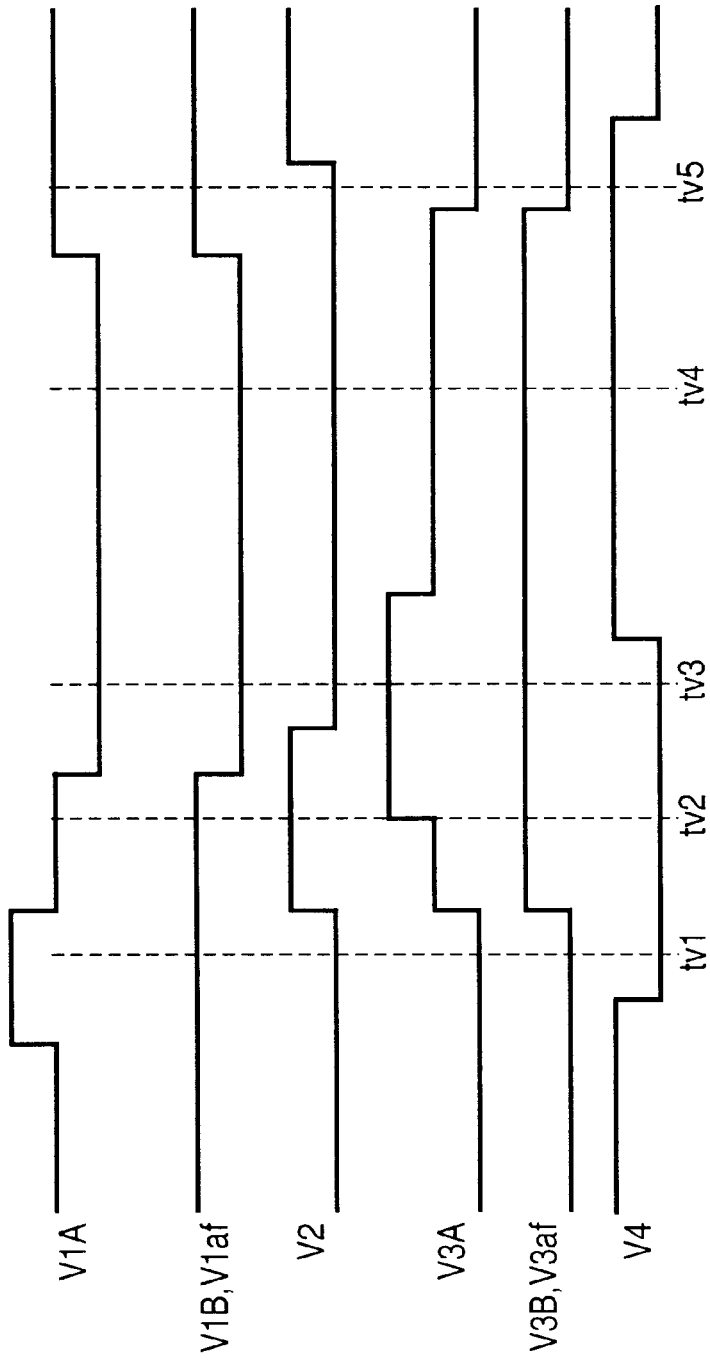
FIG. 30 is a timing chart showing the vertical transfer pulse in the second embodiment.

FIG. 29 shows operation in the thinning mode in the second embodiment, and shows the vertical transfer CCD and pixels on one column in the pixel matrix at the same location as in FIG. 24. FIG. 30 shows vertical transfer pulses.

At tv1 in FIG. 30, a high voltage is applied to V1A, and an intermediate voltage is applied to V1B and V1af. Then, potential wells are formed in V1A, V1B, and V1af in the vertical transfer CCD, as shown at tv1 in FIG. 29. At the same time, the read gate of V1A opens, and charges in the Ye photoelectric converters move to the vertical transfer CCD via the V1A line. From tv2 to tv3, a high voltage is applied to V3A, and an intermediate voltage is applied to V3B and V3af. Then, the potential wells move, the read gate of V3A opens, and Mg charges move from the photoelectric converters on the V3A line to the vertical transfer CCD. Voltages shown at tv4 and tv5 are applied to the vertical transfer CCD to move the charges in the vertical transfer CCD.

After the charges in the photoelectric converters have been transferred to the vertical transfer CCD, these charges are sequentially transferred to the horizontal transfer CCD. In the thinning mode, both the charge-containing well and vacant well exist, as shown in FIG. 29. Therefore, in transferring the charges to the horizontal transfer CCD, two vertical transfer pulses in FIG. 26 are applied to the horizontal transfer CCD every horizontal blanking so as to add the charge-containing line and vacant line in a one-to-one correspondence in the horizontal transfer CCD.

Image data read out in the thinning mode do not include any distance measurement S1 and S2 data, and all data are pixel data which can be used to generate an image. Since pixels are thinned out in a read, a 1-field image can be obtained within a time 1/4 the read time of one still image.

The obtained image data can be used to generate image data for a moving image or viewfinder image without performing any pixel interpolation, unlike the still image photographing mode.

Figure 31:
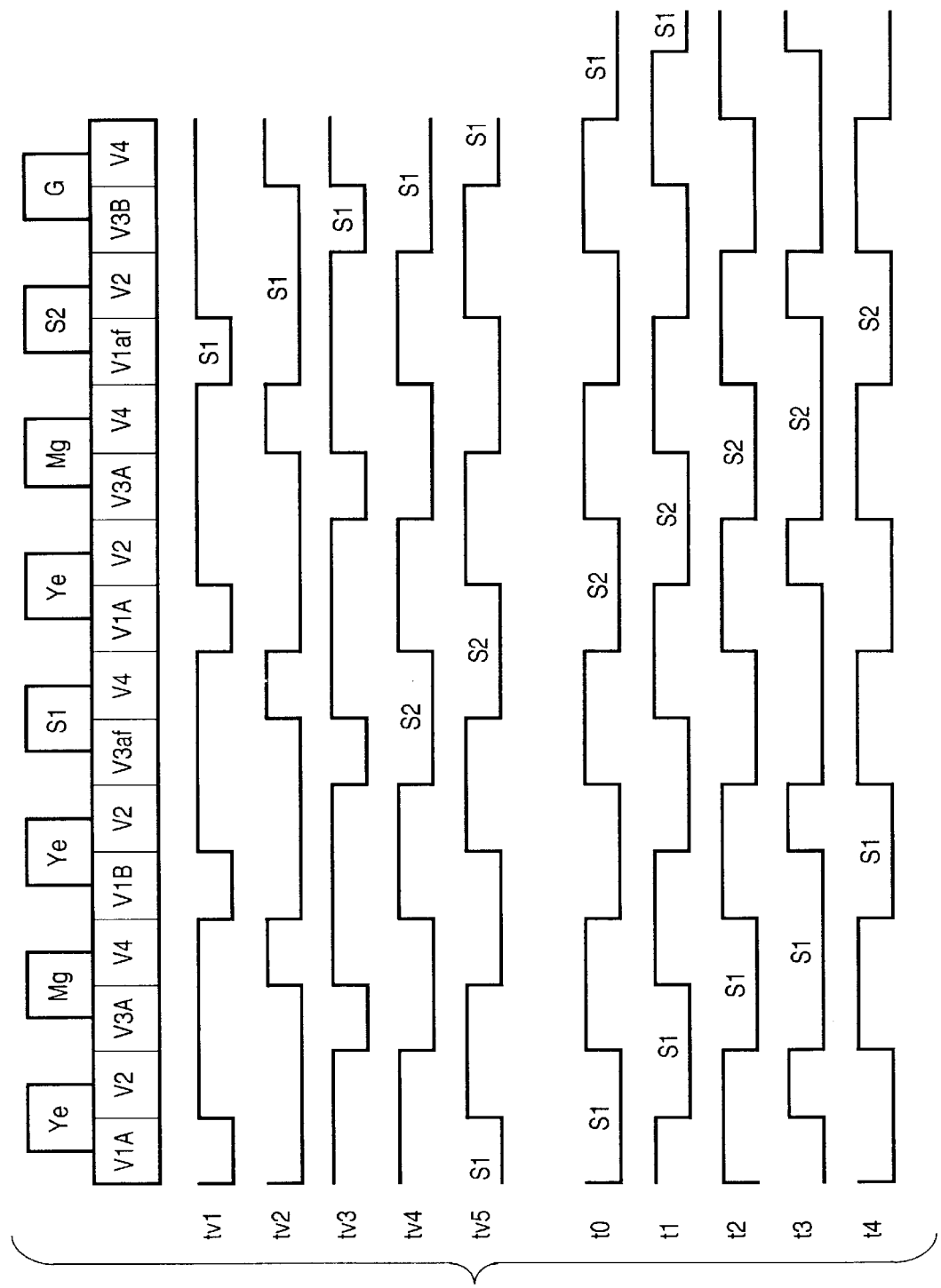
FIG. 31 is a view showing the operational concept of the vertical transfer CCD in the second embodiment.
Figure 32:
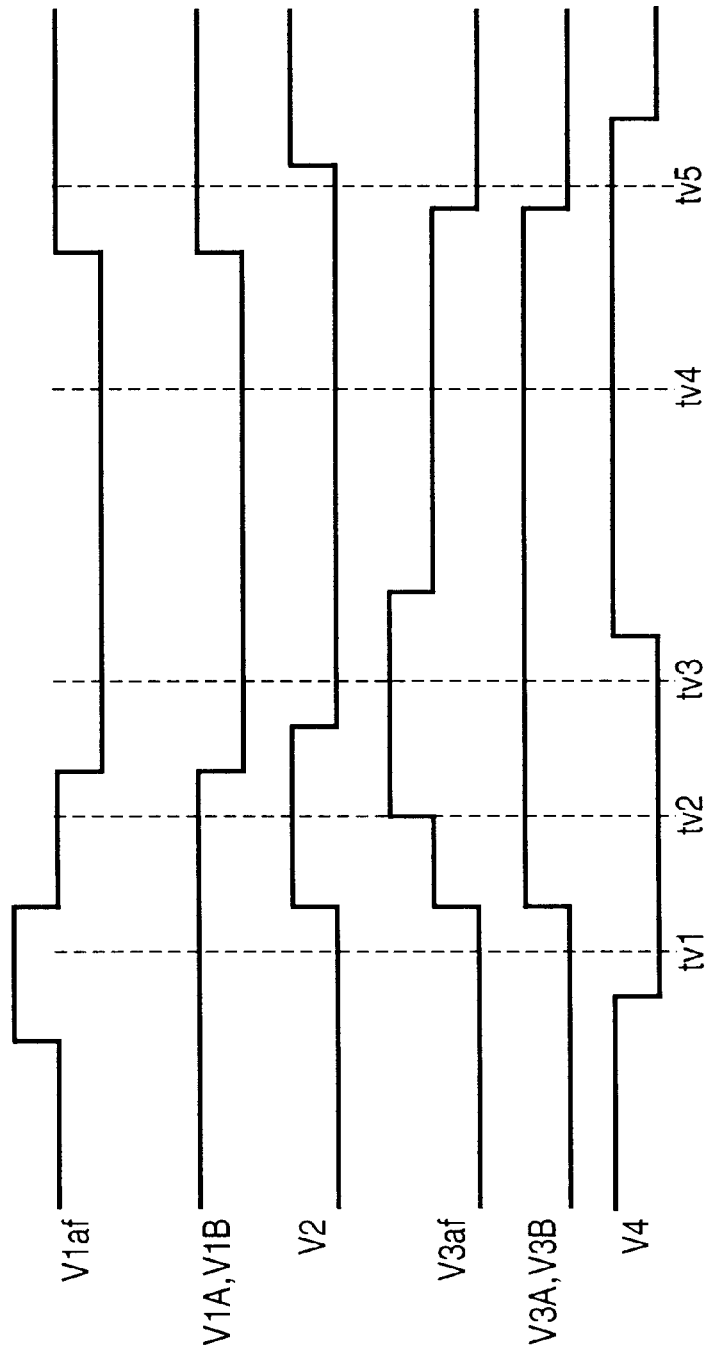
FIG. 32 is a timing chart showing the vertical transfer pulse in the second embodiment.

The distance measurement mode will be explained. FIG. 31 shows operation in the distance measurement mode in the second embodiment, and shows the vertical transfer CCD and pixels on one column in the pixel matrix at the same location as in FIG. 24. FIG. 32 shows vertical transfer pulses.

At tv1 in FIG. 32, a high voltage is applied to V1af, and an intermediate voltage is applied to V1A and V1B. Then, potential wells are formed in V1A, V1B, and V1af in the vertical transfer CCD, as shown at tv1 in FIG. 31. At the same time, the read gate of V1af opens, and charges in the distance measurement cells S1 move to the vertical transfer CCD via the V1af line. From tv2 to tv3, a high voltage is applied to V3af, and an intermediate voltage is applied to V3A and V3B. Then, the potential wells move, the read gate of V3af opens, and charges in the distance measurement cells S2 move from the photoelectric converters on the V3af line to the vertical transfer CCD. Voltages shown at tv4 and tv5 are applied to the vertical transfer CCD to move the charges in the vertical transfer CCD.

After the charges in the photoelectric converters have been transferred to the vertical transfer CCD, these charges are sequentially transferred to the horizontal transfer CCD. In the distance measurement mode, both the charge-containing well and vacant well exist, as shown in FIG. 31. Hence, in transferring the charges to the horizontal transfer CCD, two vertical transfer pulses in FIG. 26 are applied to the horizontal transfer CCD every horizontal blanking so as to add the charge-containing line and vacant line in a one-to-one correspondence in the horizontal transfer CCD.

In this manner, a read from lines including the distance measurement cells S1 and S2 is completed. In the camera, two specific lines are selected, a defocus amount is calculated from the phase difference between S1 and S2, and the lens is driven to complete autofocus operation.

As described above, according to the second embodiment, read pixels in the thinning mode do not include any distance measurement pixel, and charges can be read out from a necessary number of pixels for generating a moving image.

Thus, the distance measurement pixels need not be interpolated. Further, pixels are thinned out to an mount necessary for generating a moving image, and a moving image can be generated at a high speed. This realizes photographing of a high-quality viewfinder and moving image file using many frames, and also realizes high-speed photometric operation.

As a result, the performance of an image sensing apparatus such as a digital still camera can improve, and the product cost can be reduced.

(Third Embodiment)

Figure 35:
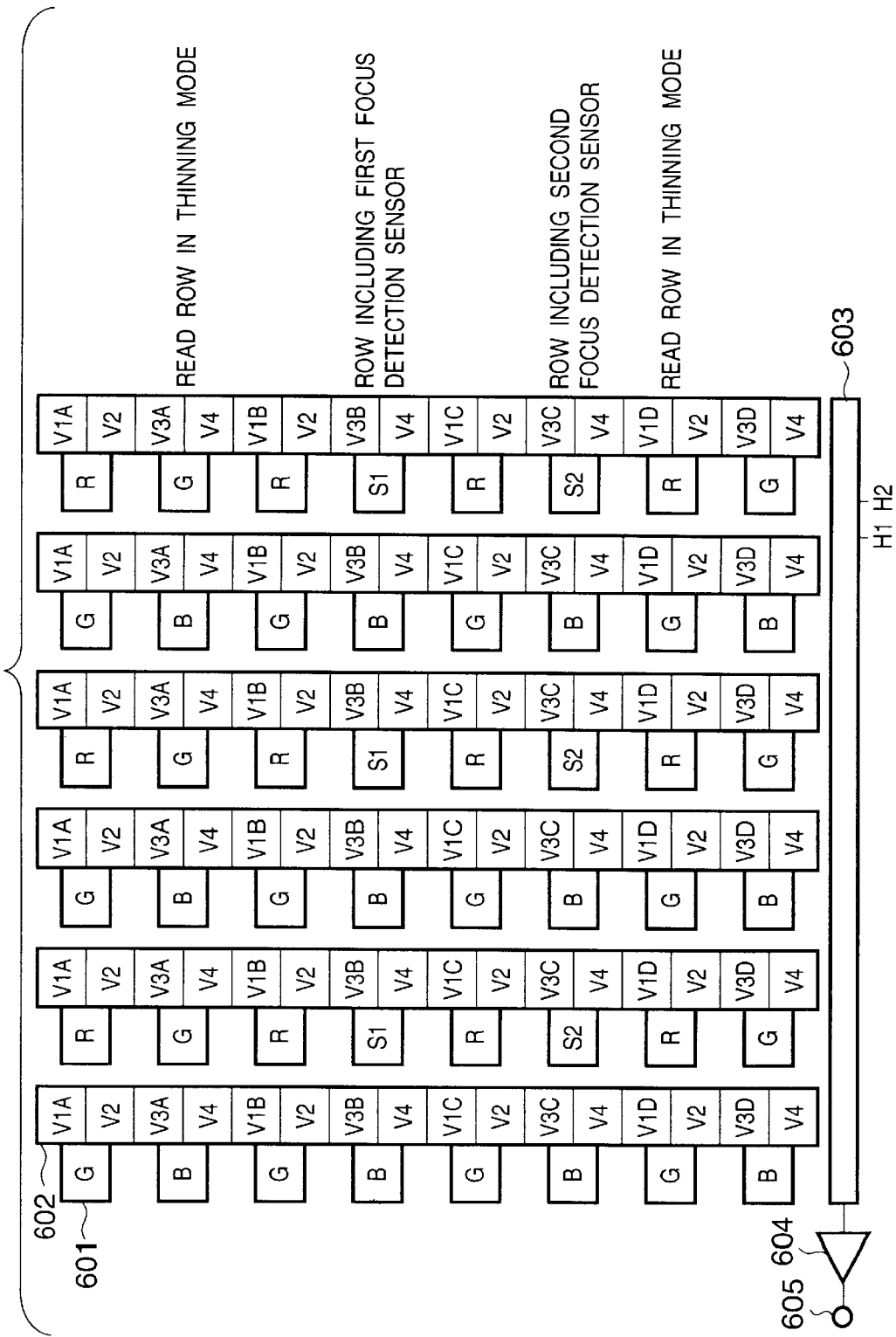
FIG. 35 is a view showing the arrangement of an image sensing element in the third embodiment.

FIG. 35 shows a solid-state image sensing apparatus according to the third embodiment. The third embodiment will exemplify an interline CCD having a primary color filter.

In FIG. 35, reference numerals 601 denote pixels formed from photoelectric converters laid out in a matrix. The surfaces of the pixels 601 are covered with primary color filters or focus detection filters. Reference numeral 602 denotes a vertical transfer CCD. The vertical transfer CCD 602 is a 4-phase driving CCD. To independently read out charges from focus detection pixels or pixels selected in a thinning mode, vertical transfer pulses V1 and V3 are functionally divided into V1A, V1B, V1C, V1D, V3A, V3B, V3C and V3D. These pulses are used for 4-phase driving together with V2 and V4 to transfer charges stored in respective pixels to a horizontal transfer CCD 603. The horizontal transfer CCD transfers the charges to an output amplifier 604 in response to horizontal transfer pulses H1 and H2. The output amplifier converts the charge amount into a voltage and outputs the voltage to an output terminal 605.

Operation of the third embodiment will be described. Similar to the second embodiment, the third embodiment relates to read methods, respectively, in a still image photographing mode, thinning mode, and distance measurement mode.

The still image photographing mode will be explained. FIGS. 36, 37, 38, and 39 show operation in photographing a still image in the third embodiment. In photographing a still image, charges are read out from the first field shown in FIG. 36 and the second field shown in FIG. 38, and rearranged in the memory such that the layout of the readout pixels coincide with the layout of the pixels on the image sensing element. With this operation, charges from all the pixels on the image sensing element are transferred to the memory to obtain a high-resolution video image using all the pixels on the image sensing element.

Figure 37:
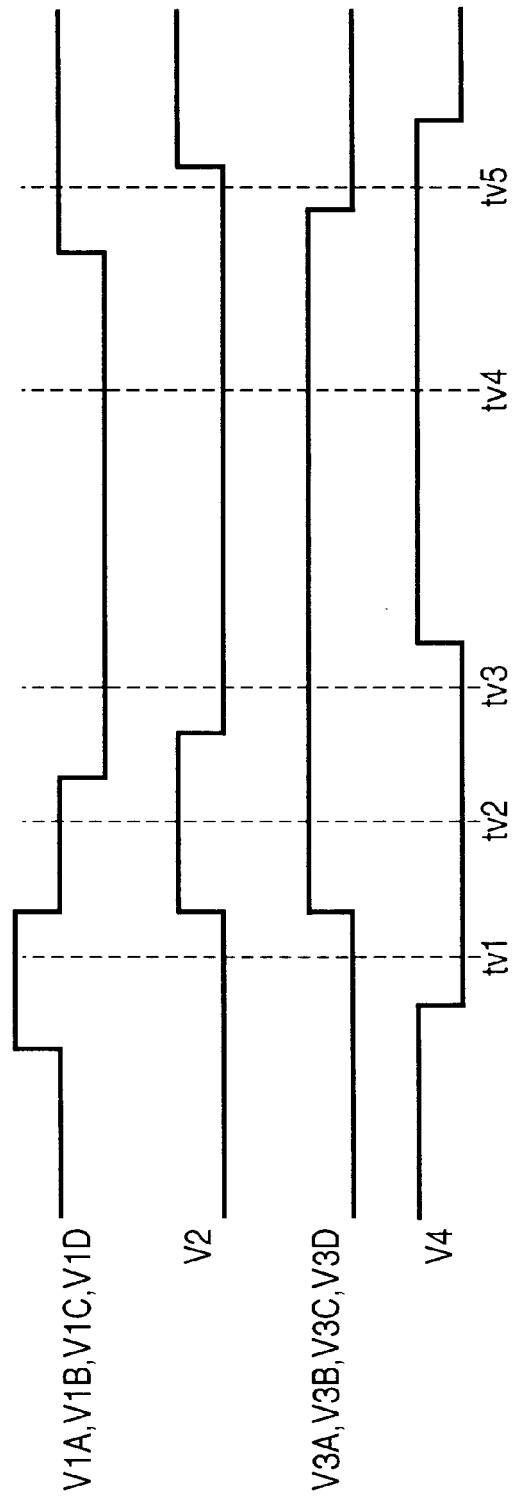
FIG. 37 is a timing chart showing a vertical transfer pulse in the third embodiment.

A read from the first field will be described. FIG. 36 shows the vertical transfer CCD and pixels on one column in the pixel matrix in FIG. 35. FIGS. 37 and 26 show vertical transfer pulses. The vertical transfer pulse takes three, low, intermediate, and high voltages.

At tv1 in FIG. 37, a high voltage is applied to V1A, V1B, V1C, and V1D. Then, potential wells are formed in V1A, V1B, V1C, and V1D, as shown at tv1 in FIG. 36. At the same time, the read gates of V1A, V1B, V1C, and V1D open, and charges in the photoelectric converters on an R-G line in the pixel matrix move to the vertical transfer CCD, as shown at tv1 of FIG. 36. FIG. 36 shows only R charges. With the lapse of a time to tv2, tv3, tv4, and tv5, pulses shown in FIG. 37 are applied to the vertical transfer CCD, and the charges in the vertical transfer CCD move with movement of the potential wells, as shown at tv2, tv3, tv4, and tv5 in FIG. 36.

The vertical transfer pulses shown in FIG. 26 are applied to the vertical transfer CCD every cycle of one horizontal blanking period, and the charges from the respective lines are transferred to the horizontal transfer CCD in units of lines.

During the horizontal transfer period, the charges in the horizontal transfer CCD are transferred to the output amplifier 604 in response to the horizontal transfer pulses H1 and H2. The output amplifier 604 converts the charges into a voltage value and outputs it to the output terminal 605.

Figure 38:
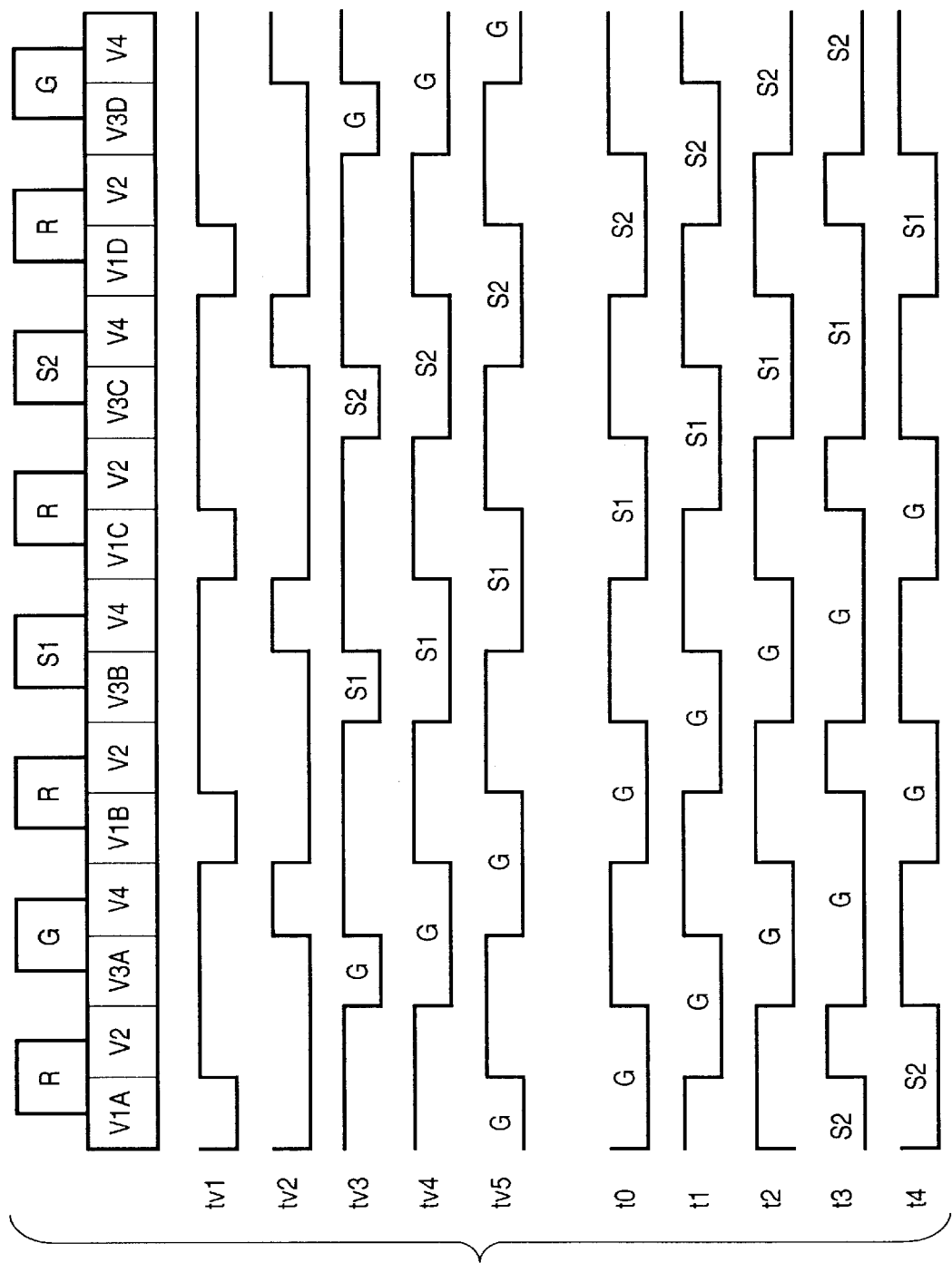
FIG. 38 is a view showing the operational concept of the vertical transfer CCD in the third embodiment.
Figure 39:
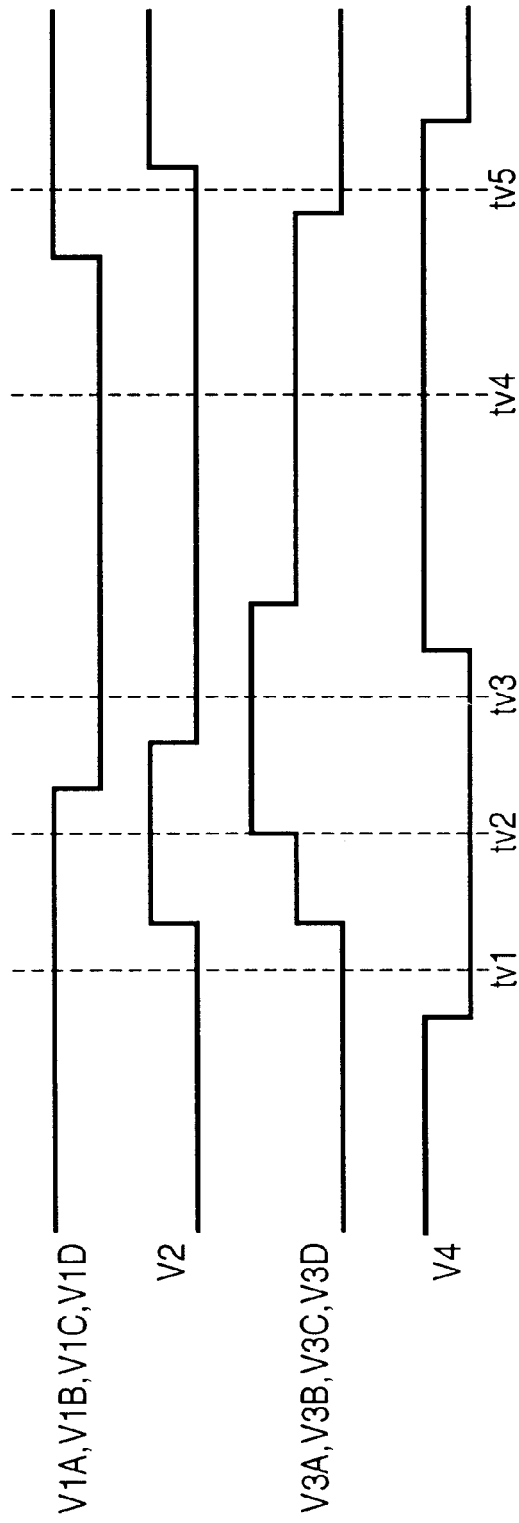
FIG. 39 is a timing chart showing the vertical transfer pulse in the third embodiment.

A read from the second field will be explained. FIG. 38 shows the vertical transfer CCD and pixels on one column in the pixel matrix at the same location as in FIG. 36. FIG. 39 shows vertical transfer pulses.

At tv1 in FIG. 39, an intermediate voltage is applied to V1A, V1B, V1C, and V1D. Then, potential wells are formed in the vertical transfer CCD, as shown at tv1 in FIG. 38. Since no read gates open, no charges in the pixels are transferred to the vertical transfer CCD. From tv2 to tv3, a high voltage is applied to V3A, V3B, V3C, and V3D, the read gates of V3A, V3B, V3C, and V3D open, and charges in the photoelectric converters on a G-B line or S1/S2-B line move to the vertical transfer CCD. Voltages shown at tv4 and tv5 are applied to the vertical transfer CCD, and the charges in the vertical transfer CCD move with movement of the potential wells.

The vertical transfer pulses shown in FIG. 26 are applied to the vertical transfer CCD every cycle of one horizontal blanking period, and the charges from the respective lines are transferred to the horizontal transfer CCD in units of lines.

The charges on the vertical transfer CCD are sequentially transferred to the horizontal transfer CCD every horizontal blanking, and output from the output amplifier to the output terminal.

As described above, the third embodiment reads out charges from all the pixels on the image sensing element using the two fields.

In the camera using this image sensing element, after all charges in the first and second fields are transferred to the memory, S1 and S2 are interpolated. S1 and S2 are interpolated using data of peripheral G pixels. Pixel data in the memory is processed, luminance and color difference signals are generated, an image is compressed, and filing is performed to complete photographing operation.

Figure 40:
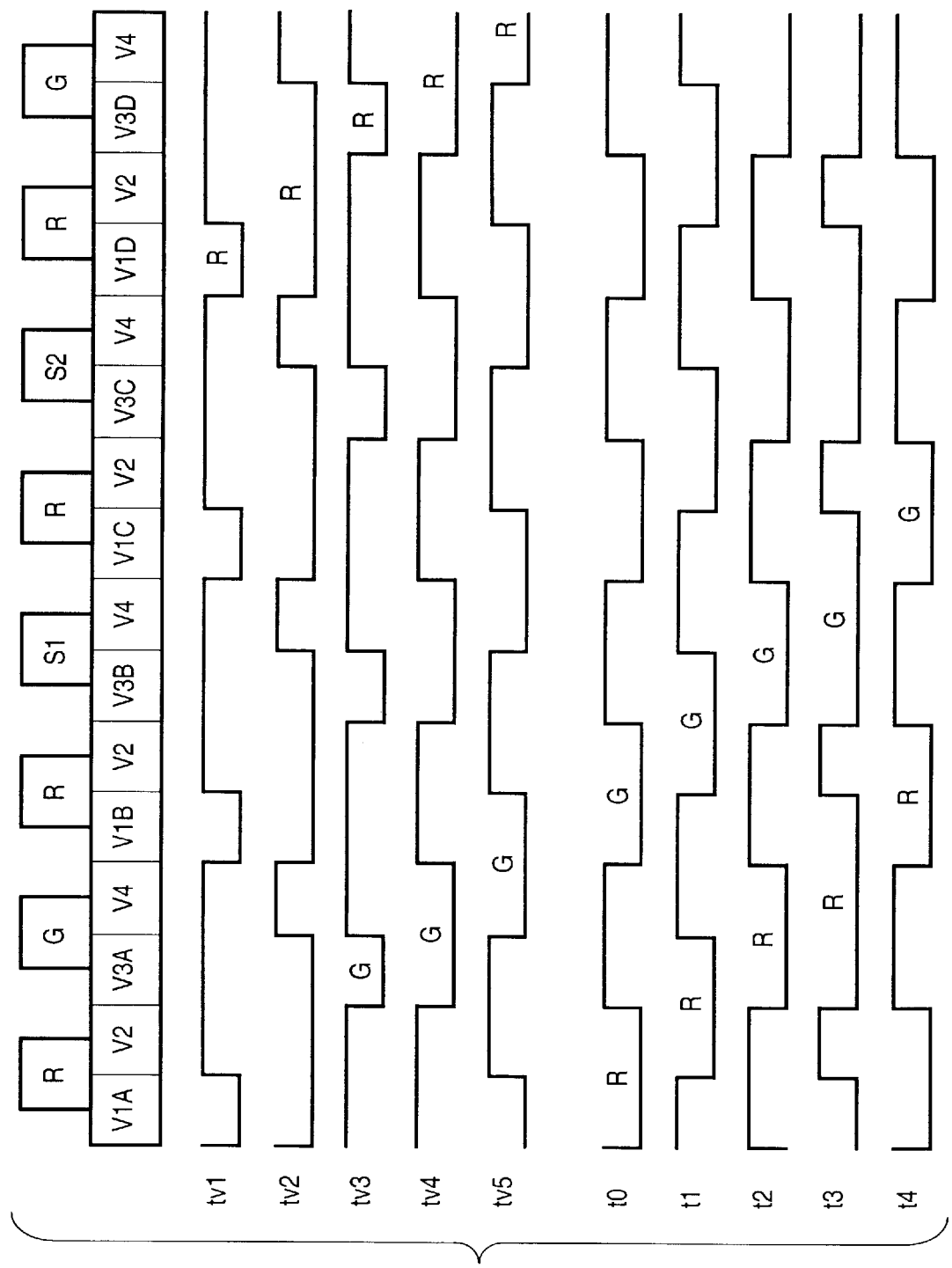
FIG. 40 is a view showing the operational concept of the vertical transfer CCD in the third embodiment.
Figure 41:
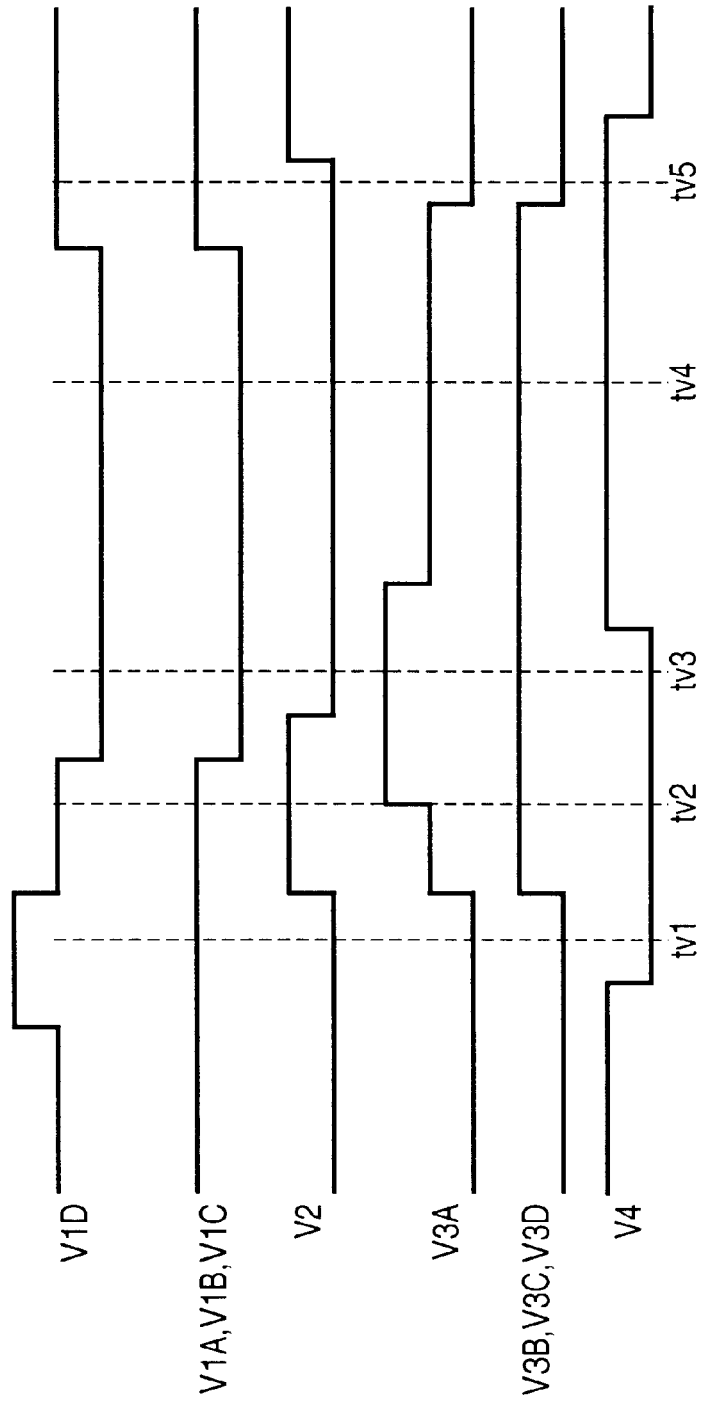
FIG. 41 is a timing chart showing the vertical transfer pulse in the third embodiment.

The thinning mode will be explained. FIG. 40 shows operation in the thinning mode in the third embodiment, and shows the vertical transfer CCD and pixels on one column in the pixel matrix at the same location as in FIG. 36. FIG. 41 shows vertical transfer pulses.

At tv1 in FIG. 41, a high voltage is applied to V1D, and an intermediate voltage is applied to V1A, V1B, and V1C. Then, potential wells are formed in V1A, V1B, V1C, and V1D in the vertical transfer CCD, as shown at tv1 in FIG. 40. At the same time, the read gate of V1D opens, and charges in the R photoelectric converters move to the vertical transfer CCD via the V1D line. From tv2 to tv3, a high voltage is applied to V3A, and an intermediate voltage is applied to V3B, V3C, and V3D. Then, the potential wells move, the read gate of V3A opens, and G charges move from the photoelectric converters on the V3A line to the vertical transfer CCD. Voltages shown at tv4 and tv5 are applied to the vertical transfer CCD to move the charges in the vertical transfer CCD.

After the charges in the photoelectric converters have been transferred to the vertical transfer CCD, these charges are sequentially transferred to the horizontal transfer CCD. In the thinning mode, both the charge-containing well and vacant well exist, as shown in FIG. 40. Therefore, in transferring the charges to the horizontal transfer CCD, two vertical transfer pulses in FIG. 26 are applied to the horizontal transfer CCD every horizontal blanking so as to add the charge-containing line and vacant line in a one-to-one correspondence in the horizontal transfer CCD.

Image data read out in the thinning mode do not include any distance measurement S1 and S2 data, and all data are pixel data which can be used to generate an image. Since pixels are thinned out in a read, one moving image can be obtained within a ¼ time, compared to the still image photographing mode.

The obtained image data can be used to generate image data for a moving image or viewfinder image without performing any pixel interpolation, unlike the still image photographing mode.

Figure 42:
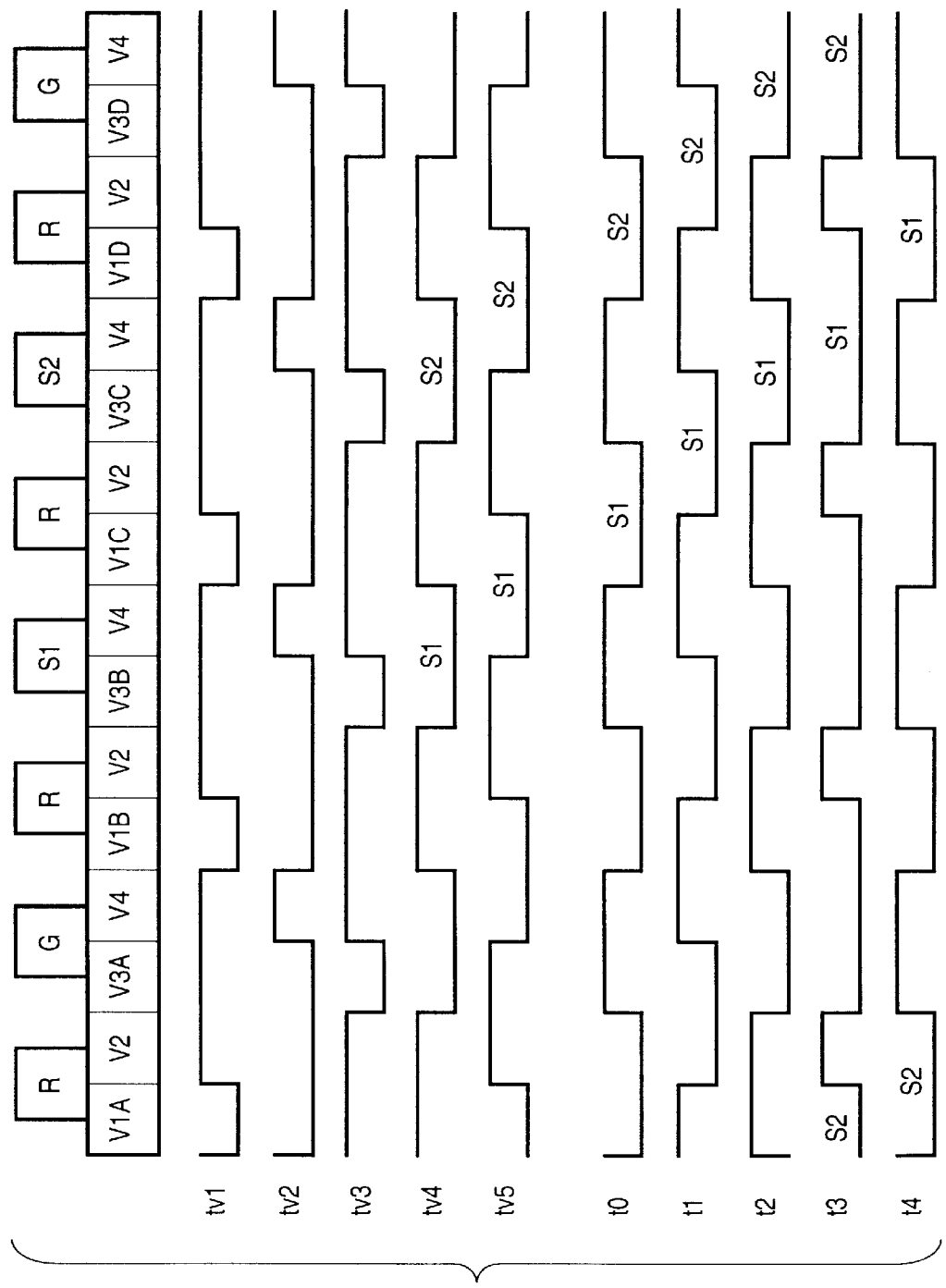
FIG. 42 is a view showing the operational concept of the vertical transfer CCD in the third embodiment.
Figure 43:
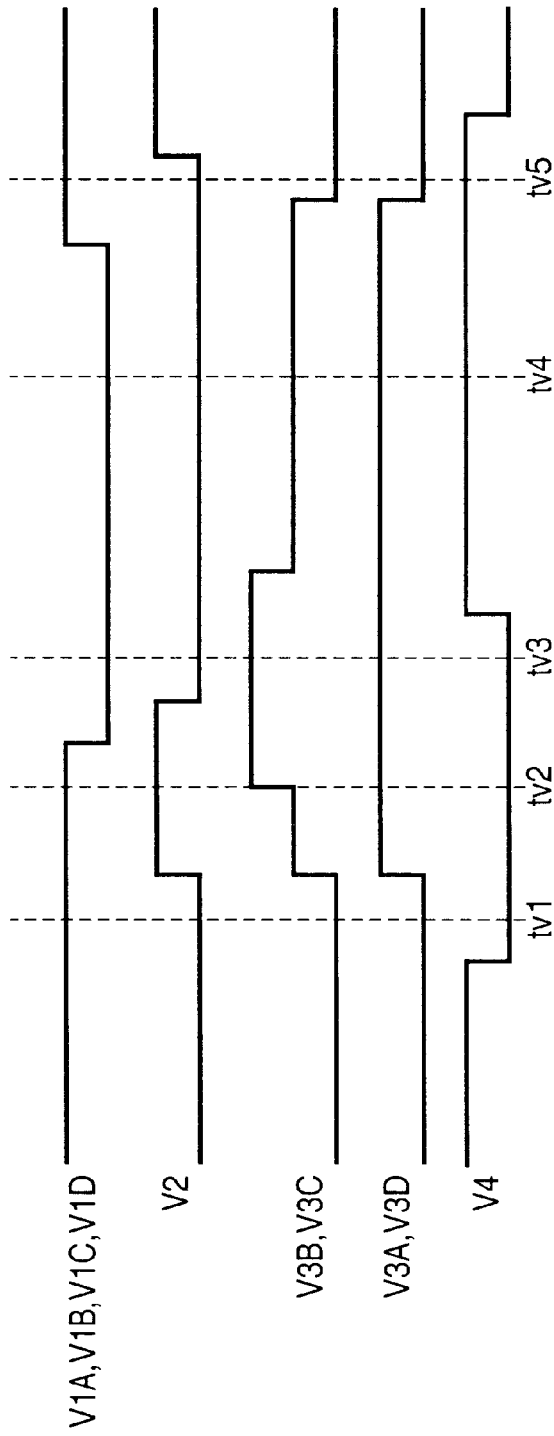
FIG. 43 is a timing chart showing the vertical transfer pulse in the third embodiment.

The distance measurement mode will be explained. FIG. 42 shows operation in the distance measurement mode in the third embodiment, and shows the vertical transfer CCD and pixels on one column in the pixel matrix at the same location as in FIG. 36. FIG. 43 shows vertical transfer pulses.

At tv1 in FIG. 43, an intermediate voltage is applied to V1A, V1B, V1C, and V1D. Then, potential wells are formed in V1A, V1B, V1C, and V1D in the vertical transfer CCD, as shown at tv1 in FIG. 42. However, no read gate opens, and no charge moves to the vertical transfer CCD. From tv2 to tv3, a high voltage is applied to V3B and V3C, and an intermediate voltage is applied to V3A and V3D. Then, the potential wells move, the read gates of V3B and V3C open, and charges in the distance measurement cells S1 and S2 move from the photoelectric converters on the V3B and V3C lines to the vertical transfer CCD. Voltages shown at tv4 and tv5 are applied to the vertical transfer CCD to move the charges in the vertical transfer CCD.

After the charges in the photoelectric converters have been transferred to the vertical transfer CCD, these charges are sequentially transferred to the horizontal transfer CCD.

In the distance measurement mode, the charge-containing well and vacant well repetitively exist every third line, as shown in FIG. 42. Hence, in transferring the charges to the horizontal transfer CCD, two vertical transfer pulses in FIG. 26 are applied to the horizontal transfer CCD every horizontal blanking so as to add the charge-containing line and vacant line in a one-to-one correspondence in the horizontal transfer CCD.

In this manner, a read from lines including the distance measurement cells S1 and S2 is completed. In the camera, two specific lines are selected, a defocus amount is calculated from the phase difference between S1 and S2, and the lens is driven to complete autofocus operation.

The second and third embodiments have exemplified the interline CCD. Even when the camera uses an image sensing element capable of freely reading out charges from a pixel designated by an X-Y address method, like a C-MOS sensor, the same effects can also be attained by separating a row (or column) used by a thinning read from a row (or column) including a distance measurement cell.

As described above, the third embodiment realizes the still image photographing mode, thinning mode, and distance measurement mode in the image sensing element having a primary color filter. Also in the third embodiment, read pixels in the thinning mode do not include any distance measurement pixel, and charges can be read out from a necessary number of pixels for generating a moving image.

Accordingly, the distance measurement pixels need not be interpolated. Further, pixels are thinned out to an amount necessary for generating a moving image, and a moving image can be generated at a high speed. This realizes photographing of a high-quality viewfinder and moving image file using many frames, and also realizes high-speed photometric operation.

As a result, the performance of an image sensing apparatus such as a digital still camera can improve, and the product cost can be reduced.

(Fourth Embodiment)

Figure 33:
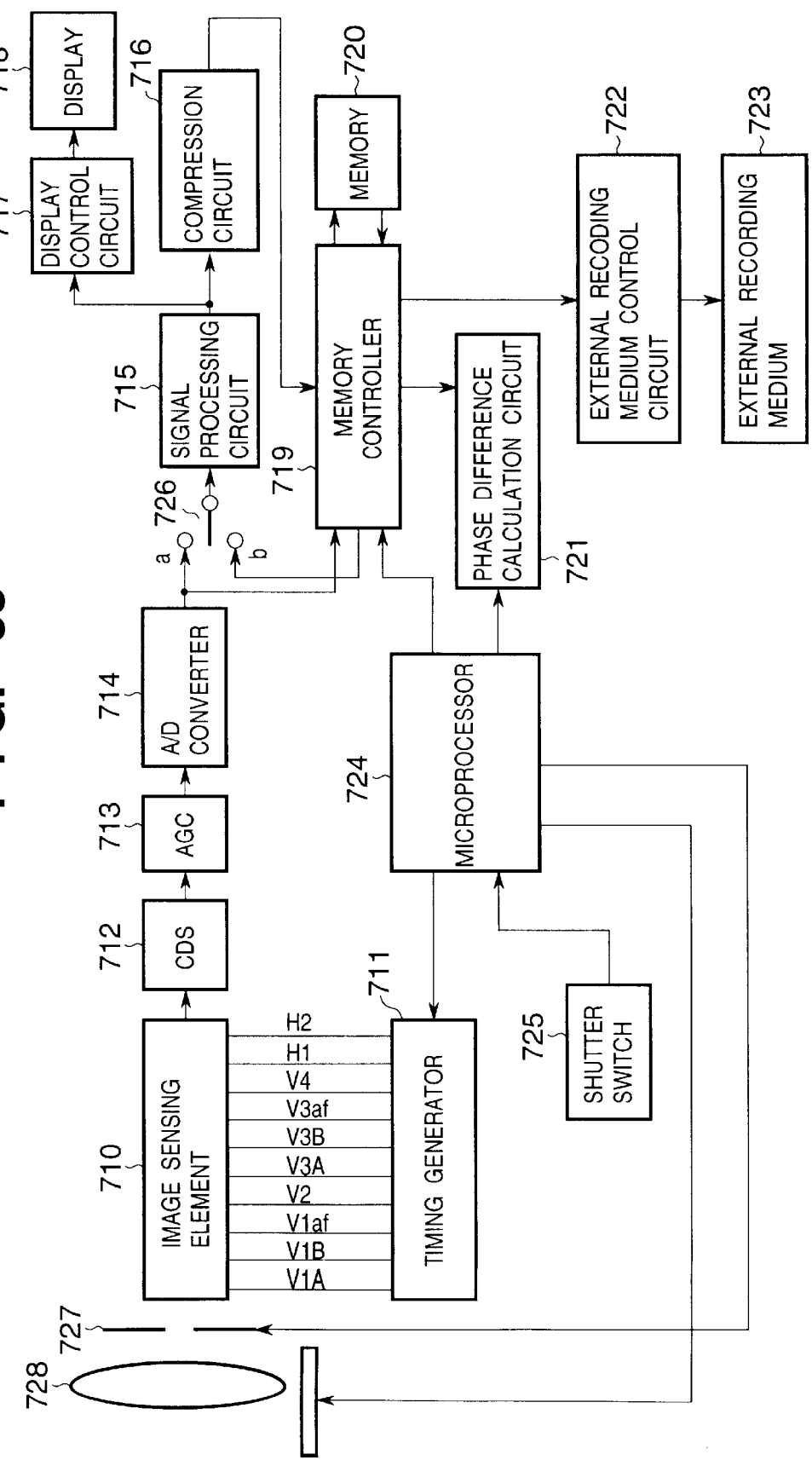
FIG. 33 is a block diagram showing an example of the arrangement of an image sensing apparatus in the fourth embodiment.

FIG. 33 shows the arrangement of an image sensing apparatus according to the fourth embodiment. The fourth embodiment concerns a digital still camera using the image sensing element according to the second embodiment and a driving circuit for driving the image sensing element.

In FIG. 33, an image sensing element 710 is the one described in the second embodiment. A timing generator 711 generates vertical transfer pulses V1A, V1B, V1af, V2, V3A, V3B, V3af, an V4 and horizontal transfer pulses H1 and H2 in accordance with the still image photographing mode, thinning mode, and distance measurement mode by the method described in the second embodiment. The timing generator is connected to a microprocessor 724 via a control line, and switches the driving pulse between the still image photographing mode, thinning mode, and distance measurement mode in accordance with an instruction from the microprocessor.

An output from the image sensing element 710 undergoes correlation double sampling by a CDS 712, is adjusted in signal level by an AGC 713, and converted into a digital value by an A/D converter 714. The output of the A/D converter is connected to a switch 726 and memory controller 719.

A signal processing circuit 715 generates luminance/color difference image data on the basis of the A/D-converted output signal from the image sensing element. A compression circuit 716 compresses the luminance/color difference image data generated by the signal processing circuit 715 in accordance with, e.g., a JPEG standard.

A memory 720 is formed from a memory element such as a DRAM. The memory controller 719 controls to store input data in the memory 720, or read out data from the memory 720 in accordance with a request from another block.

An external recording medium 723 is formed from a nonvolatile memory element, and saves an image data file and the like. An external recording medium control circuit 722 controls a write/read of data in/from the external recording medium.

A display 718 is formed from an LCD or the like, displays a photographed still image or moving image, and displays as an electronic viewfinder an object image incident on the image sensing element before photographing.

A photographing lens 728 can adjust its focal point with respect to the image sensing element in accordance with an instruction from the microprocessor 724. A shutter switch 725 outputs a control signal SW1 by depression to the half stroke, a control signal SW2 by depression to the full stroke, and a control signal SW0 by non-depression. The shutter switch 725 is depressed to the half stroke in distance measurement, and depressed to the full stroke in photographing. A shutter 727 controls light incident on the image sensing element by opening/closing blades.

Figure 34:
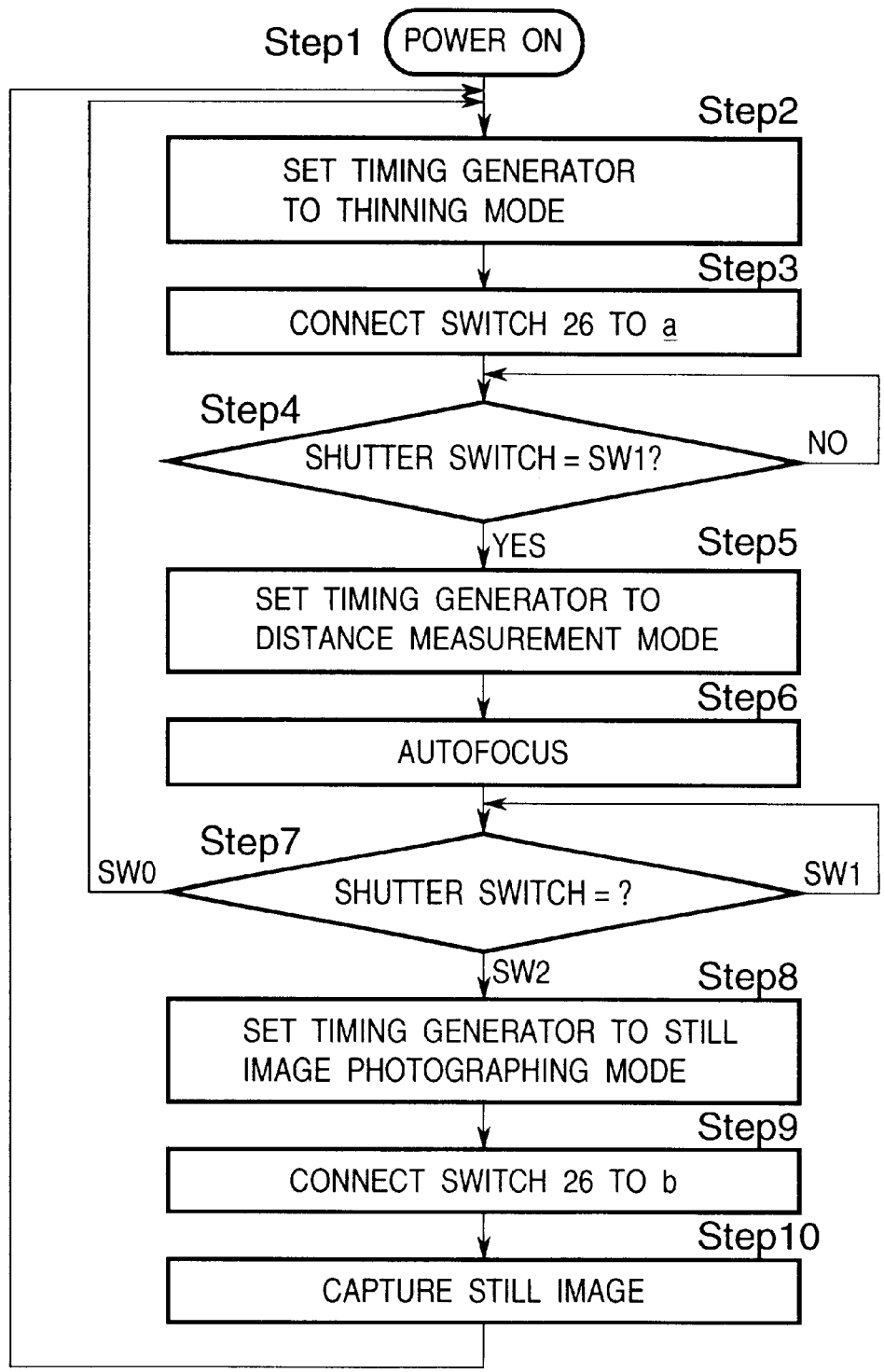
FIG. 34 is a flow chart showing processing of the image sensing apparatus in the fourth embodiment.

FIG. 34 shows the flow of operation of the digital still camera according to the fourth embodiment.

In step 1 of FIG. 34, the camera is powered.

The camera activates the electronic viewfinder. In step 2, the microprocessor 724 instructs the timing generator by a control signal to operate in the thinning mode. Then, the timing generator outputs thinning mode driving signals, i.e., the vertical transfer pulses V1A, V1B, V1af, V2, V3A, V3B, V3af, and V4 and the horizontal transfer pulses H1 and H2 to the image sensing element in accordance with the thinning mode of the second embodiment.

In step 3, the microprocessor sends a control signal so as to connect the switch 726 to a. An image exposed on the image sensing element is thinned and read out, as described in the second embodiment. When the image sensing element has 1,600,000 pixels, a read of the image is completed at 30 frames/sec. Since no data is read out from the distance measurement cell, interpolation like in the still image photographing mode (to be described later) need not be executed.

An output from the image sensing element 710 undergoes correlation double sampling by the CDS 712, is adjusted in amplitude by the AGC 713, and converted into a digital value by the A/D converter 714. The signal processing circuit 715 generates luminance/color difference image data from the signal input from the A/D converter, and outputs the image data. A display control circuit 717 adjusts the signal output timing so as to allow the display 718 to display the luminance/color difference image data output from the signal processing circuit 715, and continuously outputs the image data to the display 718. The display 718 repetitively displays the input image data. As a result, an object image incident on the image sensing element 710 is displayed on the display 718 as a moving image having about 30 frames/sec.

The microprocessor adjusts the timing of an electronic shutter pulse for clearing charges in all the photoelectric converters on the image sensing element so as to optimize the exposure amount of the image sensing element during operation of the viewfinder. This achieves autoexposure.

A photographer determines an object via the electronic viewfinder, and depresses the shutter switch 725 to the half stroke. If the microprocessor 724 determines in step 4 that the shutter switch 725 is in the SW1 state, it advances processing to step 5 to start autofocus operation.

In step 5, the microprocessor changes the timing generator to the distance measurement mode.

The timing generator switches the driving signal to the distance measurement mode, and outputs the vertical transfer pulses V1A, V1B, V1af, V2, V3A, V3B, V3af, and V4 and the horizontal transfer pulses H1 and H2 to the image sensing element in accordance with the distance measurement mode of the second embodiment.

An output from the image sensing element 710 undergoes correlation double sampling by the CDS 712, is adjusted in amplitude by the AGC 713, and converted into a digital value by the A/D converter 714. The memory controller 719 stores outputs corresponding to one field from the A/D converter in the memory 720.

The memory controller transfers the images of the distance measurement cells S1 and S2 from data in the memory to a phase difference calculation circuit 721. The phase difference calculation circuit 721 obtains a shift amount n between the two lines by correlation calculation, and outputs the shift amount n. The microprocessor reads out the shift amount n output from the phase difference calculation circuit 721, calculates the defocus amount x from the shift amount n by equation (2), and outputs a corresponding lens driving signal to the photographing lens 728.

The photographing lens 728 moves in accordance with the driving signal, thereby completing autofocus operation.

When the photographer depresses the shutter switch 725 to the full stroke, the shutter switch 725 outputs the control signal SW2. If the microprocessor detects the depression of the shutter switch to the full stroke in step 7, it switches the mode of the timing generator to the still image photographing mode in step 8. In step 9, the microprocessor switches the shutter 727 to b.

In the still image photographing mode, the timing generator generates the driving pulse in the still image photographing mode of the second embodiment. The timing generator generates driving pulses so as to alternately repeat the first and second fields, and outputs the vertical transfer pulses V1A, V1B, V1af, V2, V3A, V3B, V3af, and V4 and the horizontal transfer pulses H1 and H2 to the image sensing element. Thus, the image sensing element alternately outputs video signals in the first and second fields. The microprocessor sets the timing of the electronic shutter pulse to the timing generator to adjust the exposure time.

In step 10, the microprocessor starts capturing a still image. Capture of a still image is as follows. First, the microprocessor closes the mechanical shutter 727. Next, the microprocessor instructs the memory controller to receive an output from the A/D converter. The image sensing element starts outputting signals from the first field, as described in the second embodiment. The memory controller receives the video signal of the first field from the A/D converter to store it in the memory 720. At this time, two lines on the memory are paired, and the memory controller stores the video signal received from the A/D converter on the first line of the pair.

After storing the video signal of the first field in the memory, the memory controller stores the video signal of the second field. The memory controller stores the video signal of the second field in the second line of the pair on the memory. Consequently, the video signals of all the pixels on the image sensing element are stored in the memory with the same layout as on the image sensing element.

The video signals of the distance measurement cells S1 and S2 are interpolated using peripheral pixels. The microprocessor determines the position of each distance measurement cell on the basis of the positional pattern information of the distance measurement cell stored in a ROM incorporated in the microprocessor, and interpolates this portion using peripheral pixels. For example, the microprocessor interpolates S1 in FIG. 23 by a known bicubic method using the values of peripheral G pixels.

After that, the memory controller outputs image data in the memory to the signal processing circuit 715. The signal processing circuit 715 converts the input image data into luminance/color difference image data, and performs processing such as gamma correction for the luminance/color difference image data.

The signal processing circuit 715 sequentially outputs the processed data. The compression circuit 716 compresses the data output from the signal processing circuit 715 in accordance with, e.g., a JPEG standard, and outputs the compressed image data.

The memory controller 719 outputs the compressed image data to the external recording medium control circuit 722 to record the image data as a file on the external recording medium 723.

In this fashion, photographing of a still image is completed. The microprocessor returns processing to step 2, changes the timing generator to the thinning mode, connects the output switch 726 to a, and starts activating the viewfinder.

Figure 44:
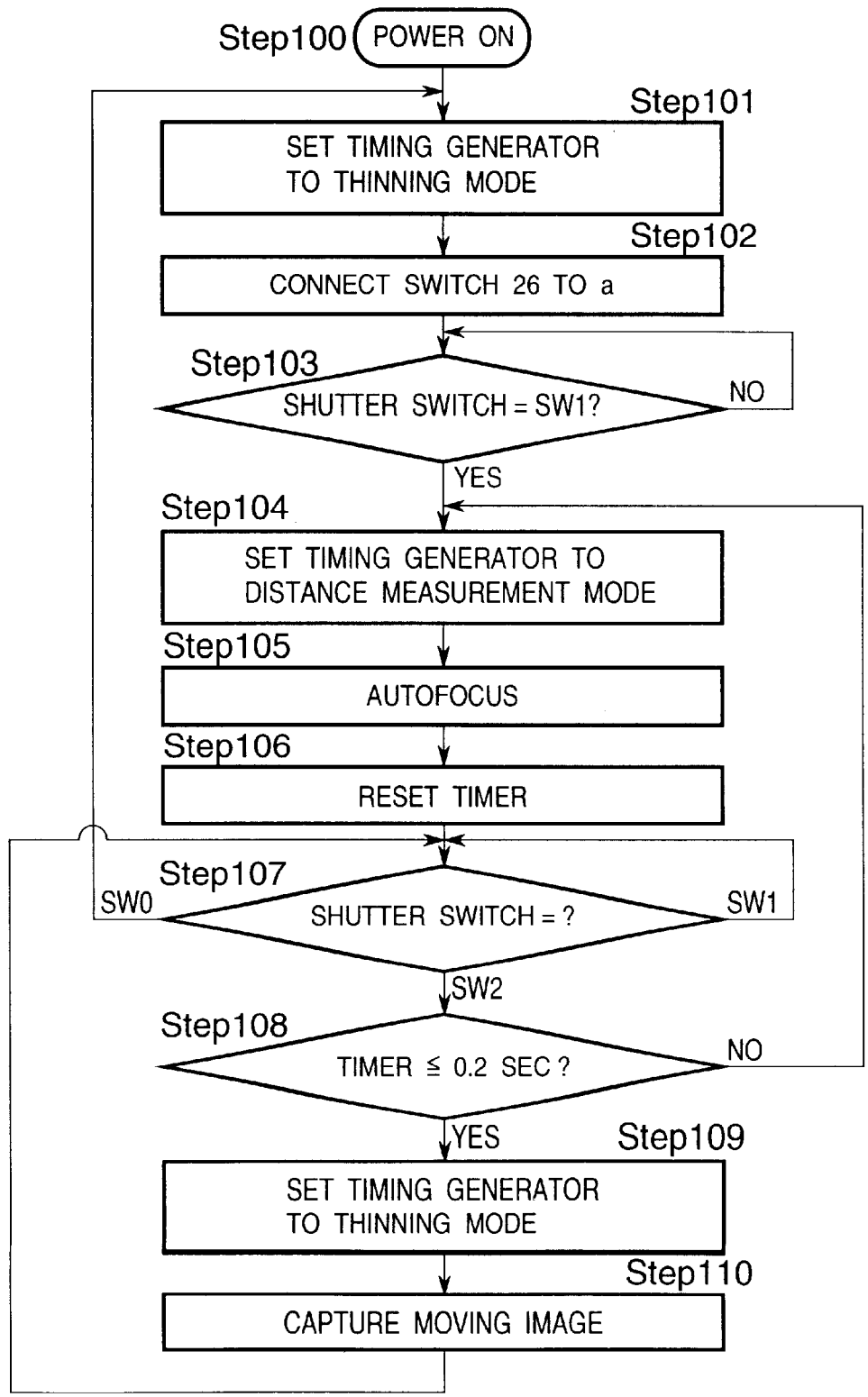
FIG. 44 is a flow chart showing processing of the image sensing apparatus in the fourth embodiment.

Photographing of a moving image will be explained. FIG. 44 is a flow chart showing photographing of a moving image in the apparatus of the fourth embodiment.

In step 100 of FIG. 44, photographing of a moving image is selected with a mode dial (not shown), and the camera is powered. In step 101, the microprocessor sets the timing generator in the thinning mode in order to activate the viewfinder. In step 102, the microprocessor connects the switch 726 to a. The display 718 displays an image incident on the image sensing element, and the camera performs operation of the viewfinder.

In step 103, if the photographer depresses the shutter switch to the half stroke, the shutter switch 725 outputs the signal SW1. The microprocessor detects the signal SW1 and advances processing to step 104.

In response to this, the camera starts autofocus. In step 104, the microprocessor changes the timing generator to the distance measurement mode. Then, the timing generator switches the driving signal to the distance measurement mode.

In step 105, the microprocessor starts a read from the distance measurement cell. An output from the image sensing element 710 undergoes correlation double sampling by the CDS 712, is adjusted in amplitude by the AGC 713, and converted into a digital value by the A/D converter 714. The memory controller 719 stores outputs corresponding to one field from the A/D converter in the memory 720.

The memory controller transfers the image of S2 to the phase difference calculation circuit 721, similarly to the image of the distance measurement cell S1 stored in the memory. The microprocessor reads out the shift amount between the two lines from the phase difference calculation circuit, calculates the defocus amount from the shift amount, and outputs a corresponding lens driving signal to the photographing lens 728.

The photographing lens 728 moves in accordance with the driving signal, thereby completing autofocus operation.

In step 106, the microprocessor resets an internal timer to 0.

In step 107, if the photographer depresses the shutter switch to the full stroke, the shutter switch outputs the signal SW2. If the microprocessor detects the signal SW2, it advances processing to step 108 to start capturing a moving image.

In step 108, the microprocessor checks whether the count value of the timer exceeds an evaluation reference value. In this case, the timer evaluation reference value is 0.2 sec. The timer count has not reached 0.2 sec yet, and the microprocessor advances processing to step 109.

In step 109, the microprocessor sets the timing generator to the thinning mode. Then, the timing generator generates a driving pulse in the thinning mode, and the image sensing element 710 outputs thinned image data. The output from the image sensing element undergoes correlation double sampling by the CDS 712, is adjusted in amplitude by the AGC 713, and converted into a digital value by the A/D converter 714.

The signal processing circuit 715 generates luminance/color difference image data from the signal input from the A/D converter, and outputs the image data. The output from the signal processing circuit 715 is input to the display control circuit 717 and compression circuit 716. The display control circuit 717 displays the input luminance/color difference image data on the display 718, similarly to the viewfinder. At the same time, the compression circuit 716 compresses the input luminance/color difference signal, and outputs the compressed signal to the memory controller.

The memory controller 719 outputs the compressed image data to the external recording medium control circuit 722 to record the image data as a file on the external recording medium 723.

The microprocessor returns processing to step 107. In step 107, the microprocessor checks whether the shutter switch is kept in the full-stroke state or released. While the shutter switch is depressed to the full stroke, the camera continues photographing a moving image. In this case, the shutter switch is kept in the full-stroke state. For this reason, the microprocessor advances processing to step 108.

In step 108, if the timer count exceeds 0.2 sec, the microprocessor detects this, returns processing to step 104, and switches the timing generator to the distance measurement mode again to perform autofocus in step 105. In step 106, the microprocessor resets the timer. With this processing, the camera intermittently repeats autofocus during photographing of a moving image, and can maintain an in-focus state even if the object image moves.

If the shutter is kept in the full-stroke state in step 107, and the timer has not reached 0.2 sec yet in step 108, the microprocessor returns the timing generator to the thinning mode again in step 109, and restarts capturing a moving image in step 110. If the timing generator has already been set in the thinning mode in step 109, the timing generator keeps operating without changing the current setting.

By this loop, the camera keeps photographing a moving image while the shutter switch is in the full-stroke state, and interrupts photographing of a moving image every 0.2 sec to performs autofocus operation.

Since no image data is read out from the distance measurement cells S1 and S2 in capturing a moving image, the pixels need not be interpolated, and a high-quality moving image using many frames can be photographed.

Most digital still cameras allow a user to select the resolution of an image to be photographed. The fourth embodiment has already described the still image photographing mode in which an image can be photographed at the highest resolution.

When an image is to be photographed at a lower resolution in the image sensing apparatus of the fourth embodiment, the timing generator is set in step 8 not to the still image photographing mode but to the thinning mode. The same processing as in the still image photographing mode can be done to generate an image data file having a lower resolution.

Also when an image is to be photographed at a low resolution, no signal of the distance measurement cell is read out from the image sensing element, but only an image generation signal read out. Therefore, the distance measurement cell need not be interpolated, and a still image can be generated within a short time. This increases the series photographing speed and improves the performance of the digital still camera.

The fourth embodiment has exemplified the image sensing element described in the second embodiment. Even when the image sensing element described in the third embodiment or a similar image sensing element is employed, the same effects can be obtained by switching the driving pulse generated by the timing generator in accordance with camera operation.

As described above, the image sensing apparatus according to the fourth embodiment realizes high-speed, high-precision autofocus by using an image sensing element having an autofocus cell thereon. Although this image sensing apparatus employs the image sensing element having the autofocus cell thereon, it can display a high-quality viewfinder image using many frames and photograph a high-quality moving image without increasing the camera cost. Further, the image sensing apparatus can series-photograph still images at a low resolution and high speed.

An image sensing apparatus such as a digital still camera having these excellent effects can be realized at low cost.

(Fifth Embodiment)

Figure 46:
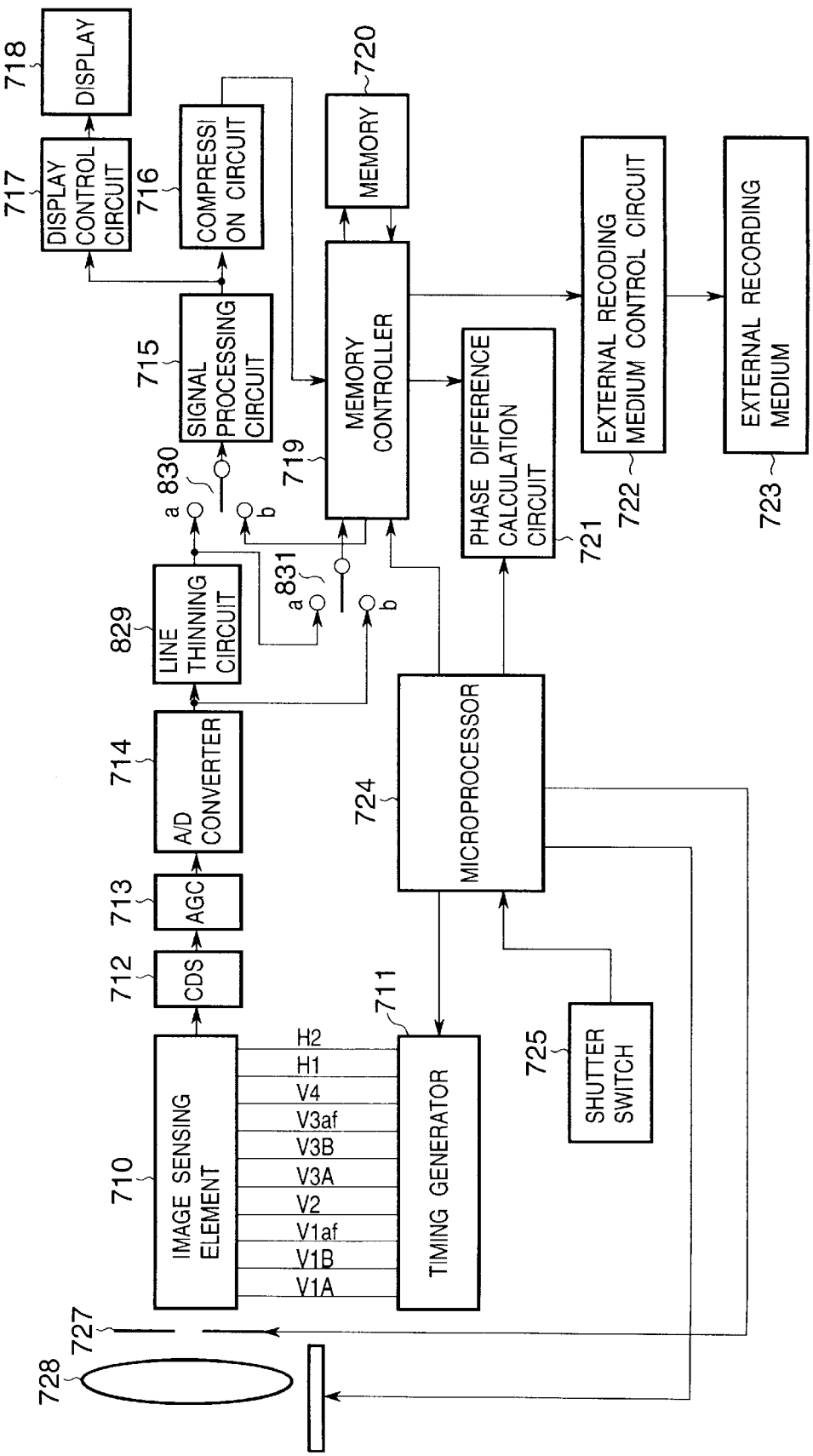
FIG. 46 is a block diagram showing an example of the arrangement of the image sensing apparatus in the fifth embodiment.

FIG. 46 shows the arrangement of an image sensing apparatus according to the fifth embodiment. Since the most of the arrangement of the image sensing apparatus according to the fifth embodiment is common to that in the fourth embodiment, the same reference numerals denote the same parts, and a description thereof will be omitted.

In the fourth embodiment, the timing generator 711 outputs only an image sensing element driving signal in the driving mode of reading out data from all pixels. To the contrary, the apparatus of the fifth embodiment improves the quality of a moving image or viewfinder image when no thinning read mode is set in the image sensing element.

Figure 45:
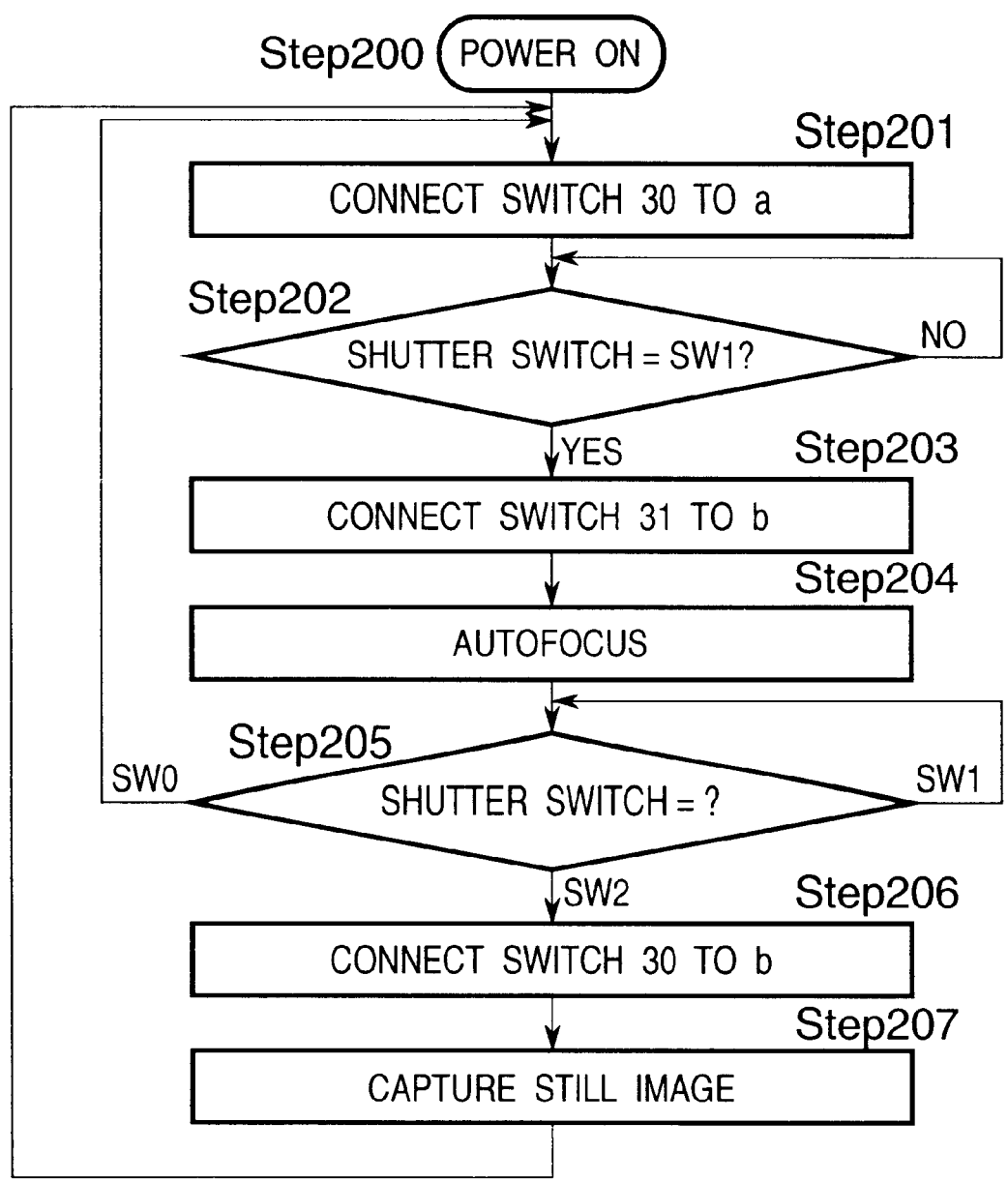
FIG. 45 is a flow chart showing processing of an image sensing apparatus in the fifth embodiment.

FIG. 45 shows the flow of operation of a digital still camera according to the fifth embodiment. In step 200 of FIG. 45, the camera is powered.

The camera activates the electronic viewfinder. In step 201, a microprocessor 724 sends a control signal so as to connect a switch 830 to a.

An output from an image sensing element 710 undergoes correlation double sampling by a CDS 712, is adjusted in amplitude by an AGC 713, and converted into a digital value by an A/D converter 714.

An output from the A/D converter undergoes line thinning by a line thinning circuit 829. As described in the second and third embodiments, the image sensing element 710 is constituted by laying out a row used to generate an image signal in thinning and a row including a distance measurement cell on different lines. The line thinning circuit outputs only data of a row read out in the thinning mode shown in, e.g., FIG. 23. Thus, an output from the line thinning circuit 829 does not include any output from the distance measurement cell.

The line thinning circuit 829 incorporates a pixel rate conversion circuit using a memory, and outputs successive image signals.

A signal processing circuit 715 generates luminance/color difference image data from a signal input from the line thinning circuit, and outputs the image data. A display control circuit 717 adjusts the signal output timing so as to allow a display 718 to display the luminance/color difference image data output from the signal processing circuit 715, and continuously outputs the image data to the display 718. The display 718 repetitively displays the input image data. As a result, an object image incident on the image sensing element 710 is displayed on the display 718 as a moving image having about 30 frames/sec.

The microprocessor adjusts the timing of an electronic shutter pulse for clearing charges in all the photoelectric converters on the image sensing element so as to optimize the exposure amount of the image sensing element during operation of the viewfinder. This achieves autoexposure.

A photographer determines an object via the electronic viewfinder, and depresses a shutter switch 725 to the half stroke. If the microprocessor 724 determines in step 202 that the shutter switch 725 is in the SW1 state, it advances processing to step 203 to start autofocus operation.

In step 203, the microprocessor connects a switch 831 to b. In step 204, the microprocessor instructs a memory controller to store outputs corresponding to one field from the A/D converter in a memory 720.

The memory controller transfers the image of S2 to a phase difference calculation circuit 721, similarly to the image of an distance measurement cell S1 stored in the memory. The microprocessor reads out the shift amount between the two lines from the phase difference calculation circuit, calculates the defocus amount from the shift amount, and outputs a corresponding lens driving signal to a photographing lens 728.

The photographing lens 728 moves in accordance with the driving signal, thereby completing autofocus operation.

If the photographer depresses the shutter switch 725 to the full stroke, the switch 725 outputs the control signal SW2. If the microprocessor detects the full stroke of the shutter switch in step 205, it switches the switch 830 to b in step 206.

In step 207, the microprocessor starts capturing a still image. The microprocessor closes a shutter 727, and instructs the memory controller to receive an output from the A/D converter. The image sensing element starts outputting signals from the first field, as described in the second embodiment. The memory controller receives the video signal of the first field from the A/D converter to store it in the memory 720. At this time, two lines on the memory are paired, and the memory controller stores the video signal received from the A/D converter on the first line of the pair.

After storing the video signal of the first field in the memory, the memory controller stores the video signal of the second field. The memory controller stores the video signal of the second field in the second line of the pair on the memory. Consequently, the video signals of all the pixels on the image sensing element are stored in the memory with the same layout as on the image sensing element.

The video signals of the distance measurement cells S1 and S2 are interpolated using peripheral pixels. The microprocessor determines the position of each distance measurement cell on the basis of the positional pattern information of the distance measurement cell stored in a ROM incorporated in the microprocessor, and interpolates this portion using peripheral pixels. For example, the microprocessor interpolates S1 in FIG. 23 by a known bicubic method using the values of peripheral G pixels.

After that, the memory controller outputs image data in the memory to the signal processing circuit 715. The signal processing circuit 715 converts the input image data into luminance/color difference image data, and performs processing such as gamma correction for the luminance/color difference image data.

The signal processing circuit 715 sequentially outputs the processed data. The compression circuit 716 compresses the data output from the signal processing circuit 715 in accordance with, e.g., a JPEG standard, and outputs the compressed image data.

The memory controller 719 outputs the compressed image data to an external recording medium control circuit 722 to record the image data as a file on an external recording medium 723.

In this fashion, capture of a still image is completed. The microprocessor returns processing to step 201, and starts activating the viewfinder.

Since lines including distance measurement cells are thinned using the line thinning circuit, the viewfinder can operate without interpolating the distance measurement cell. By thinning lines including distance measurement cells using the line thinning circuit also in photographing a moving image or photographing a still image at a low resolution, a moving image or a still image having a low resolution can be generated at a high speed, similar to the fourth embodiment.

As described above, the image sensing apparatus according to the fifth embodiment can eliminate interpolation of the distance measurement cell in photographing a moving image or viewfinder image without using any special image sensing element driving signal in an image sensing apparatus using an image sensing element having an autofocus cell thereon.

In the fifth embodiment, the number of frames is smaller than in the fourth embodiment. However, since no interpolation of the distance measurement cell need be performed, the fifth embodiment can display on the viewfinder and photograph a moving image while realizing low cost and low power consumption. In addition, the fifth embodiment can series-photograph still images at a low resolution.

When a functional cell such as autoexposure cell other than the autofocus cell is arranged on the image sensing element, the same effects can be attained by arranging this functional cell on the same line as the autofocus cell.

(Other Embodiments)

The present invention may be applied to a system constituted by a plurality of devices (e.g., a host computer, interface device, reader, and printer) or an apparatus comprising a single device (e.g., a copying machine or facsimile apparatus).

The object of the present invention is realized even by supplying a storage medium storing software program codes for realizing the functions of the above-described embodiments to a system or apparatus, and causing the computer (or a CPU or MPU) of the system or apparatus to read out and execute the program codes stored in the storage medium.

In this case, the program codes read out from the storage medium realize the functions of the above-described embodiments by themselves, and the storage medium storing the program codes constitutes the present invention.

As a storage medium for supplying the program codes, a floppy disk, hard disk, optical disk, magnetooptical disk, CD-ROM, CD-R, magnetic tape, nonvolatile memory card, ROM, or the like can be used.

The functions of the above-described embodiments are realized not only when the readout program codes are executed by the computer but also when the OS (Operating System) running on the computer performs part or all of actual processing on the basis of the instructions of the program codes.

The functions of the above-described embodiments are also realized when the program codes read out from the storage medium are written in the memory of a function expansion board inserted into the computer or a function expansion unit connected to the computer, and the CPU of the function expansion board or function expansion unit performs part or all of actual processing on the basis of the instructions of the program codes.

As has been described above, according to the present invention, some functional pixels for distance measurement, photometry, and the like, other than pixels for capturing original image information, are arranged in the pixels of an image sensing element. This arrangement allows the image sensing element to obtain AF and AE information on the original image sensing surface. The present invention can provide a compact, lower-end camera than a conventional camera having a sensor separately from an image sensing element. The AF and AE operation times can be shortened to provide a photographer more shutter chances. Moreover, high-precision AF and AE can be realized, and loss of necessary images by photographing errors can be greatly reduced.

Still further, the present invention can realize an image sensing element in which read pixels in moving image photographing or viewfinder display do not include any distance measurement pixel, and data can be read out from a necessary number of pixels for generating a moving image.

An image sensing apparatus using this image sensing element need not interpolate the distance measurement pixel, and can generate a moving image at a high speed because pixels are thinned to an amount necessary for generating a moving image. Consequently, the present invention can realize an excellent low-end image sensing apparatus which enables photographing of a high-quality viewfinder or moving image file using many frames and high-speed photometric operation.

Since processing by the image sensing apparatus is simplified, the power consumption of the apparatus reduces.

The present invention is not limited to the above embodiments and various changes and modifications can be made within the spirit and scope of the present invention. Therefore, to apprise the public of the scope of the present invention the following claims are made.

What is claimed is:

1. An image sensing apparatus in which photoelectric conversion cells for converting an optical image formed by an optical system into an electrical signal are two-dimensionally laid out,
wherein the two-dimensionally laid out photoelectric conversion cells include first photoelectric conversion cells for obtaining signals for forming an image signal, and second photoelectric conversion cells for obtaining signals for focus adjustment or performing photometry so that the first photoelectric conversion cells can accumulate appropriate amounts of photoelectric charges,
wherein each predetermined number of the second photoelectric conversion cells are surrounded by the first photoelectric conversion cells, and
wherein the first photoelectric conversion cells and second photoelectric conversion cells have different structures.

2. An image sensing apparatus in which photoelectric conversion cells for converting an optical image formed by an optical system into an electrical signal are two-dimensionally laid out,
wherein the two-dimensionally laid out photoelectric conversion cells are formed by repetition of basic layouts of photoelectric conversion cells for detecting a plurality of colors, and include first photoelectric conversion cells for obtaining signals for forming an image signal, and second photoelectric conversion cells for obtaining signals for focus adjustment or performing photometry so that the first photoelectric conversion cells can accumulate appropriate amounts of photoelectric charges,
wherein one photoelectric conversion cell in at least some basic layouts of the photoelectric conversion cells is the second photoelectric conversion cell, and the second photoelectric conversion cell is surrounded by the first photoelectric conversion cells, and
wherein the first photoelectric conversion cells and second photoelectric conversion cells have different structures.

3. An image sensing apparatus in which photoelectric conversion cells for converting an optical image formed by an optical system into an electrical signal are two-dimensionally laid out,
wherein the two-dimensionally laid out photoelectric conversion cells are formed by repetition of basic layouts of photoelectric conversion cells for detecting a plurality of colors, and include first photoelectric conversion cells for obtaining signals for forming an image signal, and second photoelectric conversion cells for obtaining signals for focus adjustment or performing photometry so that the first photoelectric conversion cells can accumulate appropriate amounts of photoelectric charges,
wherein one photoelectric conversion cell in at least some basic layouts of the photoelectric conversion cells is the second photoelectric conversion cell, and the second photoelectric conversion cell is surrounded by the first photoelectric conversion cells, and
wherein each photoelectric conversion cell for outputting a signal not for forming an image signal has a microlens arranged on a photoelectric conversion portion, and a light-shielding film which is formed between the microlens and the photoelectric conversion portion and has a specific opening, the photoelectric conversion cells are classified into first photoelectric conversion cells in each of which the opening of the light-shielding film offsets from an optical center of the microlens, and second photoelectric conversion cells in each of which the opening of the light-shielding film offsets from the optical center of the microlens in an opposite direction to the first photoelectric conversion cell, and at least one region of the image sensing region has a layout made up of a first row on which basic layouts including the first photoelectric conversion cells are aligned and a second row adjacent to the first row on which basic layouts including the second photoelectric conversion cells are aligned.

4. An image sensing apparatus in which photoelectric conversion cells for converting an optical image formed by an optical system into an electrical signal are two-dimensionally laid out,
wherein the two-dimensionally laid out photoelectric conversion cells are formed by repetition of basic layouts of photoelectric conversion cells for detecting a plurality of colors, and include first photoelectric conversion cells for obtaining signals for forming an image signal, and second photoelectric conversion cells for obtaining signals for focus adjustment or performing photometry so that the first photoelectric conversion cells can accumulate appropriate amounts of photoelectric charges, wherein one photoelectric conversion cell in at least some basic layouts of the photoelectric conversion cells is the second photoelectric conversion cell, and the second photoelectric conversion cell is surrounded by the first photoelectric conversion cells, and wherein photoelectric conversion cell for outputting a signal not for forming an image signal has a microlens arranged on a photoelectric conversion portion, and a light-shielding film which is formed between the microlens and the photoelectric conversion portion and has a specific opening, the photoelectric conversion cells are classified into first photoelectric conversion cells in each of which the opening of the light-shielding film offsets from an optical center of the microlens, and second photoelectric conversion cells in each of which the opening of the light-shielding film offsets from the optical center of the microlens in an opposite direction to the first photoelectric conversion cell, and at least one region of the image sensing region has a layout made up of a first row on which basic layouts including the first photoelectric conversion cells are aligned and second rows adjacent to upper and lower sides of the first row on which basic layouts including the second photoelectric conversion cells are aligned.

5. An image sensing apparatus in which photoelectric conversion cells for converting an optical image formed by an optical system into an electrical signal are two-dimensionally laid out, wherein the two-dimensionally laid out photoelectric conversion cells are formed by repetition of basic layouts of photoelectric conversion cells for detecting a plurality of colors, and include first photoelectric conversion cells for obtaining signals for forming an image signal, and second photoelectric conversion cells for obtaining signals for focus adjustment or performing photometry so that the first photoelectric conversion cells can accumulate appropriate amounts of photoelectric charges, wherein one photoelectric conversion cell in at least some basic layouts of the photoelectric conversion cells is the second photoelectric conversion cell, and the second photoelectric conversion cell is surrounded by the first photoelectric conversion cells, and wherein each photoelectric conversion cell for outputting a signal not for forming an image signal has a microlens arranged on a photoelectric conversion portion, and a light-shielding film which is formed between the microlens and the photoelectric conversion portion and has a specific opening, the photoelectric conversion cells are classified into first photoelectric conversion cells in each of which the opening of the light-shielding film offsets from an optical center of the microlens, and second photoelectric conversion cells in each of which the opening of the light-shielding film offsets from the optical center of the microlens in an opposite direction to the first photoelectric conversion cell, and at least part of the image sensing region has a layout in which basic layouts including the first photoelectric conversion cells and basic layouts including the second photoelectric conversion cells are alternately laid out.

6. An image sensing apparatus in which photoelectric conversion cells for converting an optical image formed by an optical system into an electrical signal are two-dimensionally laid out, wherein the two-dimensionally laid out photoelectric conversion cells are formed by repetition of basic layouts of photoelectric conversion cells for detecting a plurality of colors, and include first photoelectric conversion cells for obtaining signals for forming an image signal, and second photoelectric conversion cells for obtaining signals for focus adjustment or performing photometry so that the first photoelectric conversion cells can accumulate appropriate amounts of photoelectric charges, wherein one photoelectric conversion cell in at least some basic layouts of the photoelectric conversion cells is the second photoelectric conversion cell, and the second photoelectric conversion cell is surrounded by the first photoelectric conversion cells, and wherein each photoelectric conversion cell for outputting a signal not for generating an image signal has a microlens arranged on a photoelectric conversion portion, and a light-shielding film which is formed between the microlens and the photoelectric conversion portion and has a specific opening, the photoelectric conversion cells are classified into first photoelectric conversion cells in each of which the opening of the light-shielding film offsets from an optical center of the microlens, and second photoelectric conversion cells in each of which the opening of the light-shielding film offsets from the optical center of the microlens in an opposite direction to the first photoelectric conversion cell, and at least one region of the image sensing region has a layout made up of a given first row on which basic layouts including the first and second photoelectric conversion cells are alternately laid out, and a second row on which first and second basic layouts are laid out as opposed to a first row adjacent to the given first row.

7. The apparatus according to claim 6, wherein a focus of the optical system for forming an object image on an image sensing element is adjusted by a phase difference between a signal output from an array of the first photoelectric conversion cells and a signal output from an array of the second photoelectric conversion cells.

8. An image sensing apparatus in which photoelectric conversion cells for converting an optical image formed by an optical system into an electrical signal are two-dimensionally laid out, wherein the two-dimensionally laid out photoelectric conversion cells are formed by repetition of basic layouts of photoelectric conversion cells for detecting a plurality of colors, and include first photoelectric conversion cells for obtaining signals for forming an image signal, and second photoelectric conversion cells for obtaining signals for focus adjustment or performing photometry so that the first photoelectric conversion cells can accumulate appropriate amounts of photoelectric charges, wherein one photoelectric conversion cell in at least some basic layouts of the photoelectric conversion cells is the second photoelectric conversion cell, and the second photoelectric conversion cell is surrounded by the first photoelectric conversion cells, and wherein the photoelectric conversion cell for outputting a signal not for forming an image signal has a light-shielding film with a specific opening on a photoelectric conversion portion, and photoelectric conversion cells having openings with different opening degrees are arranged at an arbitrary location in the image sensing region.

9. The apparatus according to claim 8, wherein exposure control is performed based on outputs from the photoelectric conversion cells having different opening degrees.

10. The apparatus according to claim 1, further comprising a timing generator which generates a first driving signal for reading out the signals from the first and second photoelectric conversion cells, and a second driving signal for reading out the signals from the first photoelectric conversion cells, which do not include the signals from the second photoelectric conversion cells.

11. The apparatus according to claim 10, further comprising a switching circuit which switches photographing modes between a first photographing mode in which an image signal is generated from the signals read out from the first and second photoelectric conversion cells by the first driving signal and a second photographing mode in which an image signal is generated from the signals read out from the first photoelectric conversion cells by the second driving signal.

12. The apparatus according to claim 11, wherein the timing generator generates a third driving signal for reading out the signals from the second photoelectric conversion cells, which do not include the signals from the first photoelectric conversion cells, and the switching circuit switches states of the timing generator between a state in which the timing generator generates the second driving signal and a state in which the timing generator generates the third driving signal.

13. The apparatus according to claim 1, wherein the first photoelectric conversion cells are used for generating a luminance signal and a color difference signal as the image signal.

14. An image sensing apparatus in which photoelectric conversion cells for converting an optical image formed by an optical system into an electrical signal are two-dimensionally laid out, wherein the two-dimensionally laid out photoelectric conversion cells include first photoelectric conversion cells for obtaining signals for forming an image signal, and second photoelectric conversion cells for obtaining signals for focus adjustment, wherein each predetermined number of the second photoelectric conversion cells are surrounded by the first photoelectric conversion cells, and wherein the first photoelectric conversion cells and second photoelectric conversion cells have different structures, the image sensing apparatus comprising a controller which performs focus adjustment by calculating a relationship between images obtained from the second photoelectric conversion cells.

* * * * *

UNITED STATES PATENT AND TRADEMARK OFFICE
CERTIFICATE OF CORRECTION

PATENT NO. : 6,829,008 B1
DATED : December 7, 2004
INVENTOR(S) : Kenichi Kondo et al.

It is certified that error appears in the above-identified patent and that said Letters Patent is hereby corrected as shown below:

Title page,
Item [73], Assignee, "Tokyom" should read -- Tokyo --.

Column 8,
Line 4, "1b," should read -- 1B, --;
Line 23, "inches" should read -- inch --; and
Line 25, "inches" should read -- inch --.

Column 11,
Line 53, "horizontal." should read -- horizontal --.

Column 13,
Line 31, "unedergo" should read -- undergo --.

Column 15,
Line 42, "complimentary" should read -- complementary --.

Column 25,
Line 53, "performs" should read -- perform an --.

Column 31,
Line 6, "wherein" should read -- wherein each --.

Signed and Sealed this

Twenty-first Day of June, 2005

JON W. DUDAS
*Director of the United States Patent and Trademark Office*